(12) United States Patent
Yamaguchi

(10) Patent No.: US 9,899,403 B2
(45) Date of Patent: Feb. 20, 2018

(54) SEMICONDUCTOR DEVICE AND METHOD OF MANUFACTURING THE SAME

(71) Applicant: Renesas Electronics Corporation, Tokyo (JP)

(72) Inventor: Tadashi Yamaguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/482,239

(22) Filed: Apr. 7, 2017

(65) Prior Publication Data

US 2017/0358592 A1  Dec. 14, 2017

(30) Foreign Application Priority Data

Jun. 14, 2016  (JP) ................. 2016-117617

(51) Int. Cl.
| | |
|---|---|
| H01L 29/78 | (2006.01) |
| H01L 27/11568 | (2017.01) |
| H01L 29/10 | (2006.01) |
| H01L 29/08 | (2006.01) |
| H01L 29/45 | (2006.01) |
| H01L 29/49 | (2006.01) |
| H01L 29/66 | (2006.01) |
| H01L 29/06 | (2006.01) |

(Continued)

(52) U.S. Cl.
CPC .... *H01L 27/11568* (2013.01); *H01L 21/2855* (2013.01); *H01L 21/324* (2013.01); *H01L 21/67167* (2013.01); *H01L 21/76224* (2013.01); *H01L 29/0649* (2013.01); *H01L 29/0847* (2013.01); *H01L 29/1037* (2013.01); *H01L 29/42344* (2013.01); *H01L 29/45* (2013.01); *H01L 29/495* (2013.01); *H01L 29/4966* (2013.01); *H01L 29/665* (2013.01); *H01L 29/66795* (2013.01); *H01L 29/66833* (2013.01); *H01L 29/7851* (2013.01); *H01L 29/792* (2013.01)

(58) Field of Classification Search
CPC .............. H01L 29/0847; H01L 29/785; H01L 27/1104; H01L 29/792
See application file for complete search history.

(56) References Cited

U.S. PATENT DOCUMENTS

| 7,504,689 B2 | 3/2009 | Hisamoto et al. |
| 8,068,370 B2 * | 11/2011 | Lue ................. G11C 16/0408 |
| | | 257/315 |

(Continued)

FOREIGN PATENT DOCUMENTS

| JP | 2006-041354 A | 2/2006 |
| JP | 2011-210790 A | 10/2011 |

*Primary Examiner* — Thao P Le
(74) *Attorney, Agent, or Firm* — McGinn IP Law Group, PLLC

(57) ABSTRACT

Resistance of a FINFET is reduced while performance of an element is prevented from being deteriorated due to an increase in stress, thereby performance of a semiconductor device is improved. When a memory cell formed on an upper side of a first fin and an n transistor formed on an upper side of a second fin are mounted on the same semiconductor substrate, the surface of the first fin having a source/drain region of the memory cell is covered with a silicide layer, and part of a source/drain region of the n transistor is formed of an epitaxial layer covering the surface of the second fin.

15 Claims, 31 Drawing Sheets

(51) Int. Cl.
    *H01L 21/762*    (2006.01)
    *H01L 21/324*    (2006.01)
    *H01L 21/285*    (2006.01)
    *H01L 21/67*     (2006.01)
    *H01L 29/423*    (2006.01)
    *H01L 29/792*    (2006.01)

(56) References Cited

U.S. PATENT DOCUMENTS

| | | |
|---|---|---|
| 8,541,297 B2 | 9/2013 | Yamaguchi et al. |
| 2006/0292781 A1* | 12/2006 | Lee ............... H01L 21/28282 438/197 |
| 2011/0001169 A1 | 1/2011 | Ozcan et al. |
| 2014/0097483 A1* | 4/2014 | Wang ............... H01L 27/1156 257/318 |
| 2015/0194433 A1* | 7/2015 | Ponoth ............. H01L 27/0924 326/38 |
| 2016/0126249 A1* | 5/2016 | Divakaruni ...... H01L 27/11568 257/324 |
| 2016/0133632 A1* | 5/2016 | Park ............... H01L 21/823828 257/369 |
| 2017/0125527 A1* | 5/2017 | Pillarisetty ........... H01L 29/161 |
| 2017/0229543 A1* | 8/2017 | Glass ............... H01L 29/1054 |

\* cited by examiner

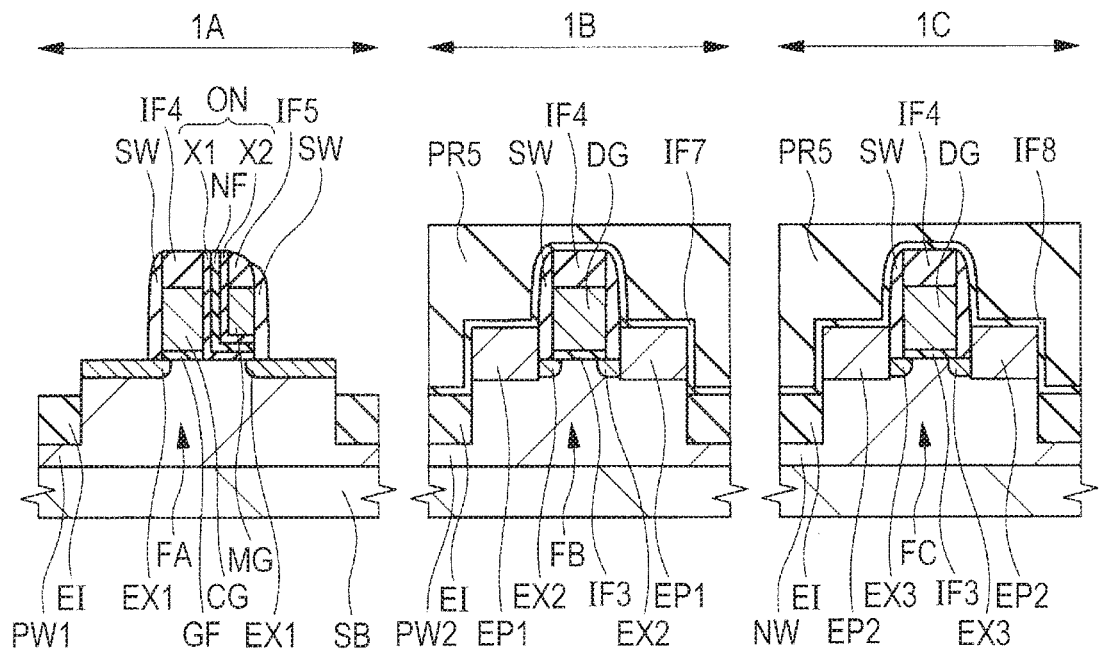
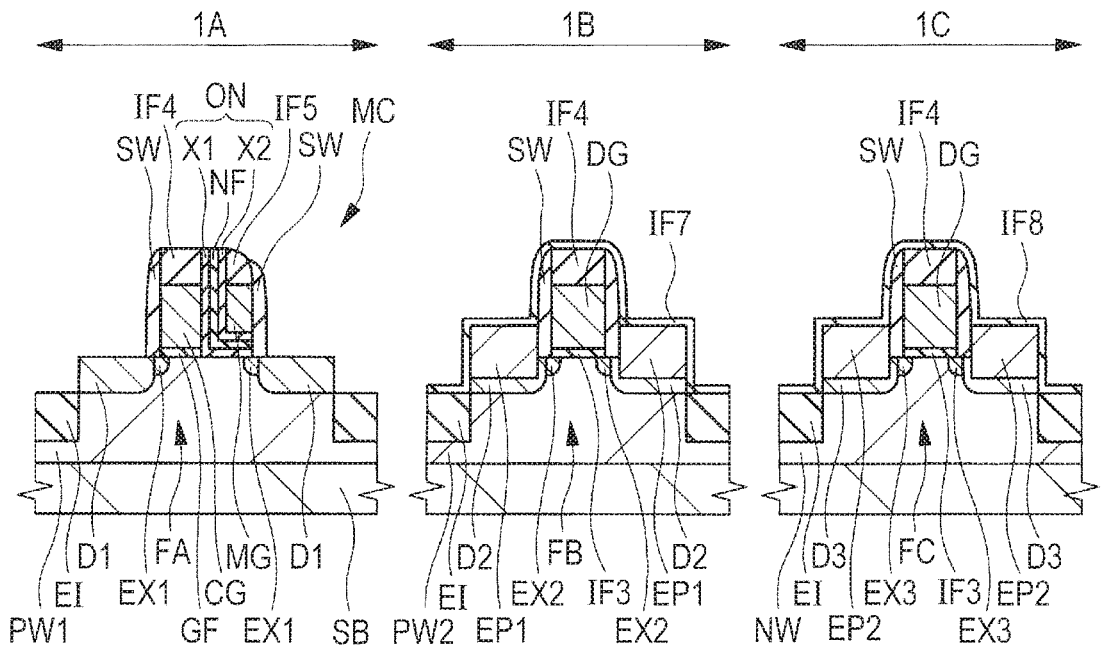

| OPERATION \ APPLIED VOLTAGE | Vd | Vcg | Vmg | Vs | Vb |
|---|---|---|---|---|---|
| WRITE | Vdd | 1 V | 12 V | 6 V | 0 |
| ERASE | 0 | 0 | -6 V | 6 V | 0 |
| READ | Vdd | Vdd | 0 | 0 | 0 |

Vdd = 1.5 V

SEMICONDUCTOR DEVICE AND METHOD OF MANUFACTURING THE SAME

CROSS-REFERENCE TO RELATED APPLICATIONS

The disclosure of Japanese Patent Application No. 2016-117617 filed on Jun. 14, 2016 including the specification, drawings and abstract is incorporated herein by reference in its entirety.

BACKGROUND

The present invention relates to a semiconductor device and a method of manufacturing the semiconductor device, and more particularly relates to a technique effectively applied to a semiconductor device including a fin transistor.

A fin field effect transistor is known as a field effect transistor that has a high operation speed, and allows a reduction in leakage current, power consumption, and size. The fin field effect transistor (FINFET) is, for example, a semiconductor element that has a channel layer including a pattern of a plate-like (wall-like) semiconductor layer protruding on a substrate, and has a gate electrode formed so as to straddle the pattern.

The electrically erasable and programmable read only memory (EEPROM) is widely used as an electrically writable and erasable, nonvolatile semiconductor memory device. Such memory devices typified by a currently widely used flash memory each have a conductive floating gate electrode surrounded by an oxide film or a trapping insulating film below a gate electrode of a MISFET, and a charge accumulation state in the floating gate or the trapping insulating film is used as storage information, and is read as a threshold of the transistor. The trapping insulating film refers to a charge-accumulable insulating film, and includes, for example, a silicon nitride film. Injection and emission of charge into/from such a charge accumulation region allows the threshold of the MISFET to be shifted so that the MISFET operates as a memory element. Such a flash memory includes a split gate cell using a metal-oxide-nitride-oxide-semiconductor (MONOS) film.

Publication of US Patent Application No. 2011/0001169 describes formation of a silicide layer on a surface of a fin in a FINFET.

Japanese Unexamined Patent Application Publication No. 2011-210790 describes that a silicide layer, which covers a surface of a source/drain region of a transistor having a channel region including a main surface of a semiconductor substrate, is formed through two heating steps, thereby abnormal growth of the silicide layer is prevented.

Japanese Unexamined Patent Application Publication No. 2006-041354 describes a split gate MONOS memory including a FINFET, in which a silicide layer covering the surface of a fin is provided.

SUMMARY

In the FET, the surface of a source/drain region is covered with a silicide layer, making it possible to reduce resistance of an element. In a salicide process for formation of the silicide layer, although the surface of a silicon layer to be formed into a silicide must be covered with a metal film, a sidewall of the fin is poorly covered with the metal film. Hence, when a metal film having a sufficient thickness to cover the sidewall is formed on a substrate, the metal film inevitably has a large thickness, which deteriorates performance and reliability of the FINFET due to stress caused by formation of the metal film. In a memory cell configured of the FINFET, such a problem leads to a reduction in reliability of a memory element.

Other objects and novel features will be clarified from the description of this specification and the accompanying drawings.

A typical one of embodiments disclosed in this application is briefly summarized as follows.

In a semiconductor device of one embodiment, the surface of a source/drain region of a memory cell formed on an upper side of a first fin is covered with a silicide layer, and the surface of a source/drain region of a transistor formed on an upper side of a second fin is covered with a semiconductor layer.

In a method of manufacturing a semiconductor device of one embodiment, a surface of a source/drain region of a memory cell formed on an upper side of a first fin is covered with a silicide layer, and a surface of a source/drain region of a transistor formed on an upper side of a second fin is covered with an epitaxial layer.

According to one embodiment disclosed in the present application, performance of a semiconductor device can be improved.

BRIEF DESCRIPTION OF THE DRAWINGS

FIG. 39 is a sectional view explaining the manufacturing process of the semiconductor device following FIG. 38.

FIG. 40 is a sectional view explaining the manufacturing process of the semiconductor device following FIG. 39.

DETAILED DESCRIPTION

Figure 1:
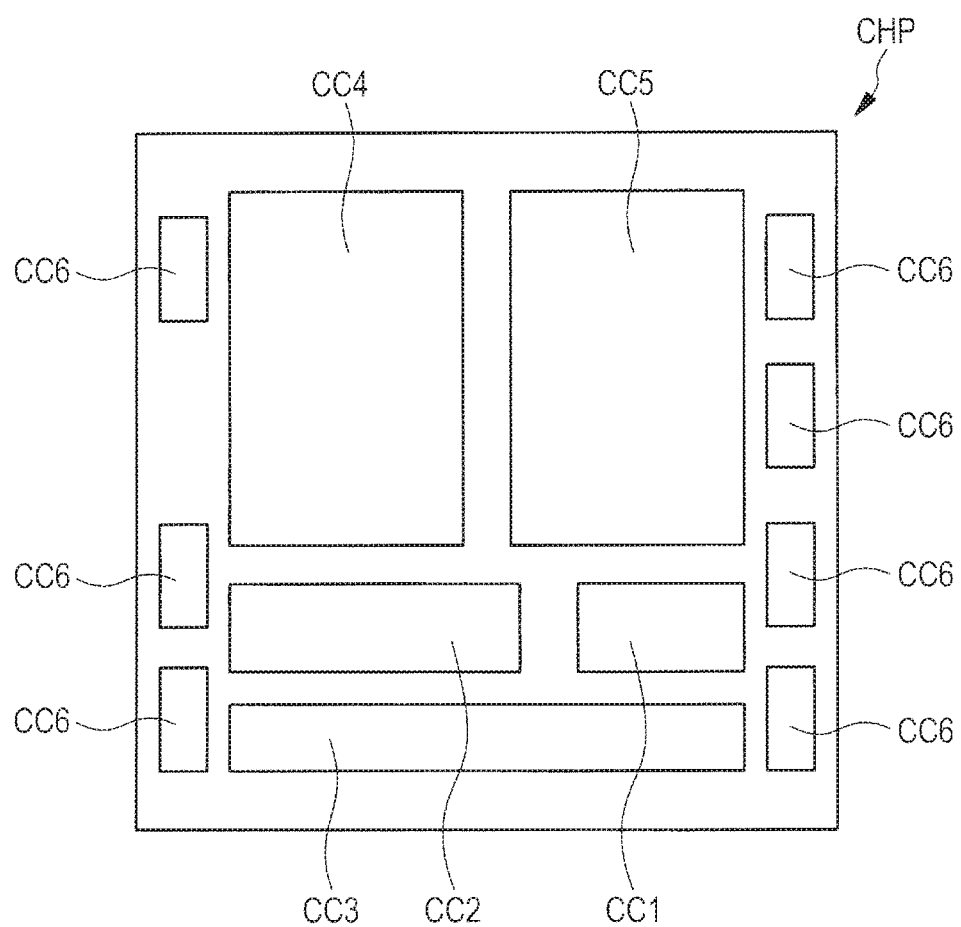
FIG. 1 is a schematic diagram illustrating a layout configuration of a semiconductor chip of a first embodiment of the invention.

Hereinafter, some embodiments are described in detail with reference to the accompanying drawings. In all drawings for explaining the following embodiments, components having the same function are designated by the same reference numeral, and duplicated description is omitted. In the following embodiments, an equivalent or similar portion is not repeatedly described except for a particularly required case.

First Embodiment

Exemplary Layout Configuration of Semiconductor Chip

A semiconductor device having a nonvolatile memory of a first embodiment is now described with reference to some drawings. A layout configuration of a semiconductor device (semiconductor chip) having a system including a nonvolatile memory is now described. FIG. 1 is a schematic diagram illustrating an exemplary layout configuration of a semiconductor chip CHP of the first embodiment. In FIG. 1, the semiconductor chip CHP includes a central processing unit (CPU) CC1, a random access memory (RAM) CC2, and an analog circuit CC3. The semiconductor chip CHP further includes an electrically erasable programmable read only memory (EEPROM) CC4, a flash memory CC5, and an input/output (I/O) circuit CC6, and thus configures a semiconductor device.

The CPU (circuit) CC1, which may be called a central processing unit, reads and decodes instructions from a memory device, and performs various types of arithmetic operation and control based on the instructions.

The RAM (circuit) CC2 is a memory that allows storage information to be randomly read therefrom, i.e., allows storage information being randomly stored to be read therefrom, and allows storage information to be newly written thereinto, and is also called random-access memory. A static RAM (SRAM) using a static circuit is used as the RAM.

The analog circuit CC3 is a circuit that processes a voltage signal and a current signal, which each vary continuously over time, i.e., processes analog signals, and includes, for example, an amplifier circuit, a conversion circuit, a modulation circuit, an oscillation circuit, and a power supply circuit.

The EEPROM CC4 and the flash memory CC5 are each one of nonvolatile memories, which allows storage information to be electrically rewritten in write operation and erase operation, and may each be called electrically erasable programmable read only memory. The EEPROM CC4 and the flash memory CC5 each have a memory cell configured of, for example, a metal oxide nitride oxide semiconductor (MONOS) transistor or a metal nitride oxide semiconductor (MNOS) transistor for memory. For example, the EEPROM CC4 and the flash memory CC5 are different from each other in that the EEPROM CC4 is a nonvolatile memory that can be erased in bytes while the flash memory CC5 is a nonvolatile memory that can be erased in word lines. In general, the flash memory CC5 stores programs for various types of processing to be executed by the CPU CC1. On the other hand, the EEPROM CC4 stores various data to be rewritten at a high frequency. The EEPROM CC4 or the flash memory CC5 includes a memory cell array including a plurality of nonvolatile memory cells arranged in a matrix, and further includes an address buffer, a row decoder, a column decoder, a verify sense amplifier circuit, a sense amplifier circuit, a write circuit, and the like The I/O circuit CC6, which is an input/output circuit, outputs data from within the semiconductor chip CHP to an external device coupled to the semiconductor chip CHP, or receives data from the external device coupled to the semiconductor chip CHP so as to send the data into the semiconductor chip, for example.

The semiconductor device of the first embodiment has a memory cell region and a logic circuit region. The memory cell region has a memory cell array including a plurality of nonvolatile memory cells arranged in a matrix. The logic circuit area has the CPU CC1, a RAM CC2, the analog circuit CC3, the I/O circuit CC6, an address buffer for the EEPROM CC4 or the flash memory CC5, a row decoder, a column decoder, the verify sense amplifier circuit, and the sense amplifier circuit or the write circuit.

Structure of Semiconductor Device

Figure 2:
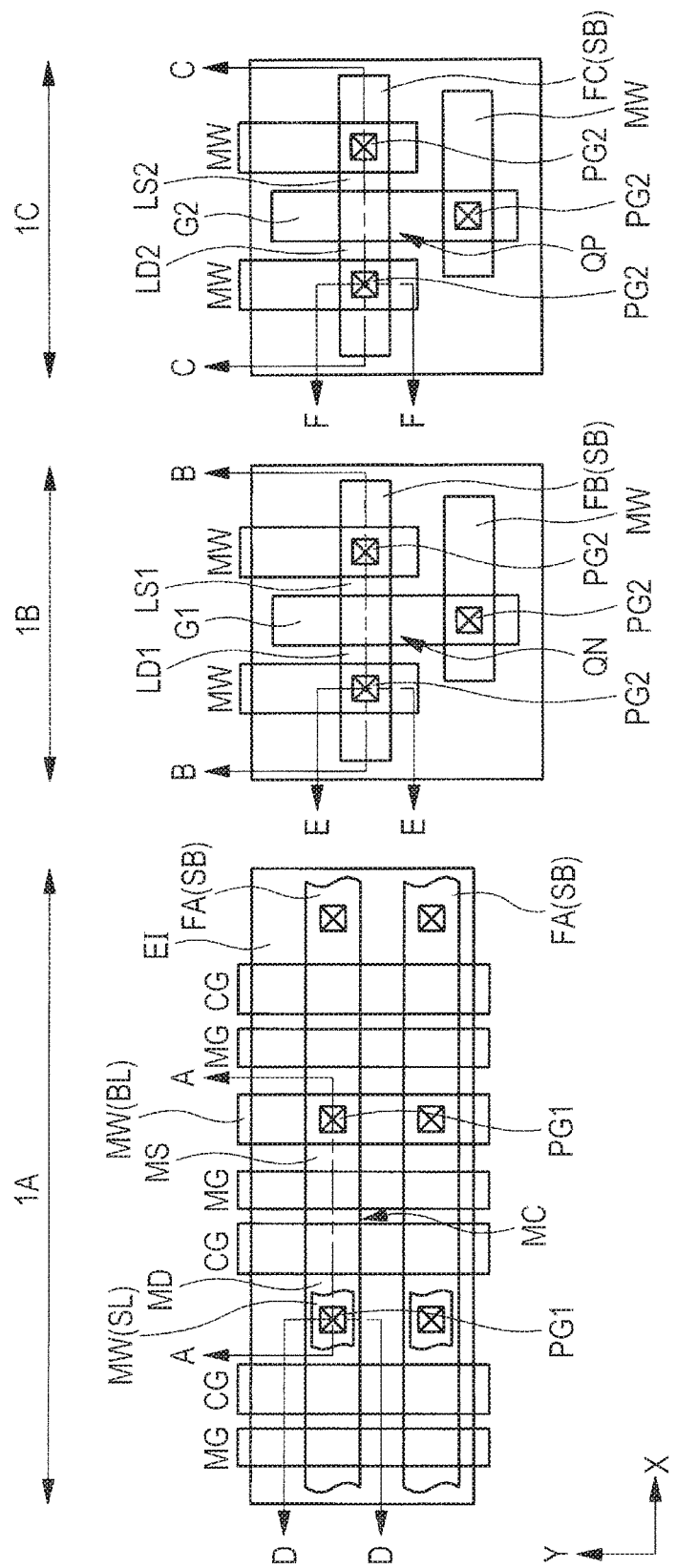
FIG. 2 is a plan view illustrating a semiconductor device of the first embodiment of the invention.
Figure 3:
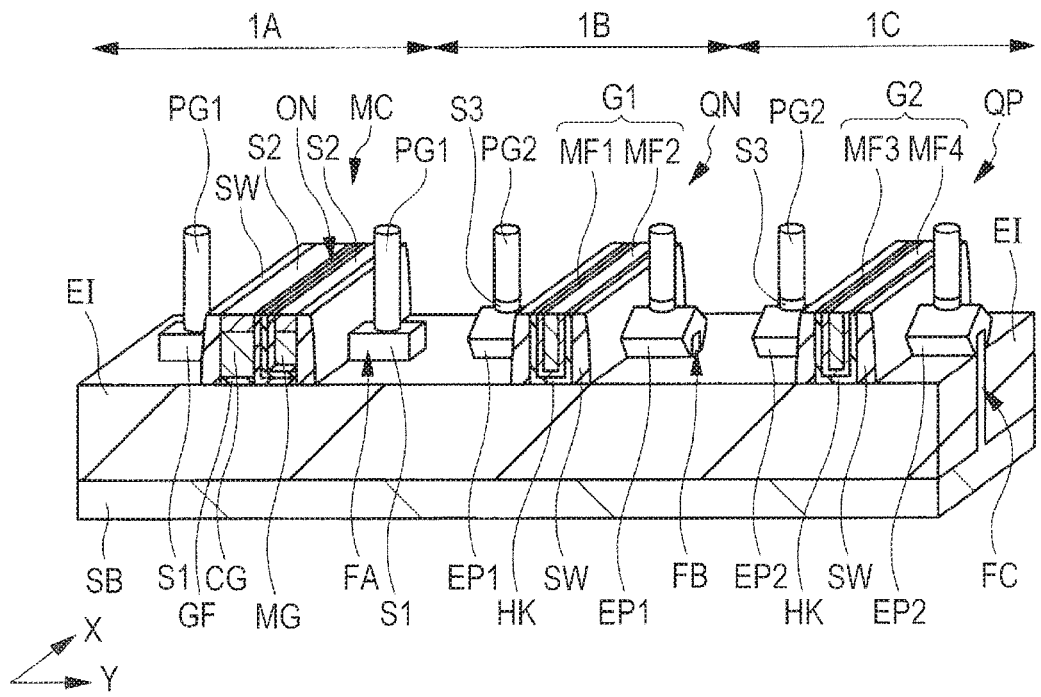
FIG. 3 is a perspective view illustrating the semiconductor device of the first embodiment of the invention.
Figure 4:
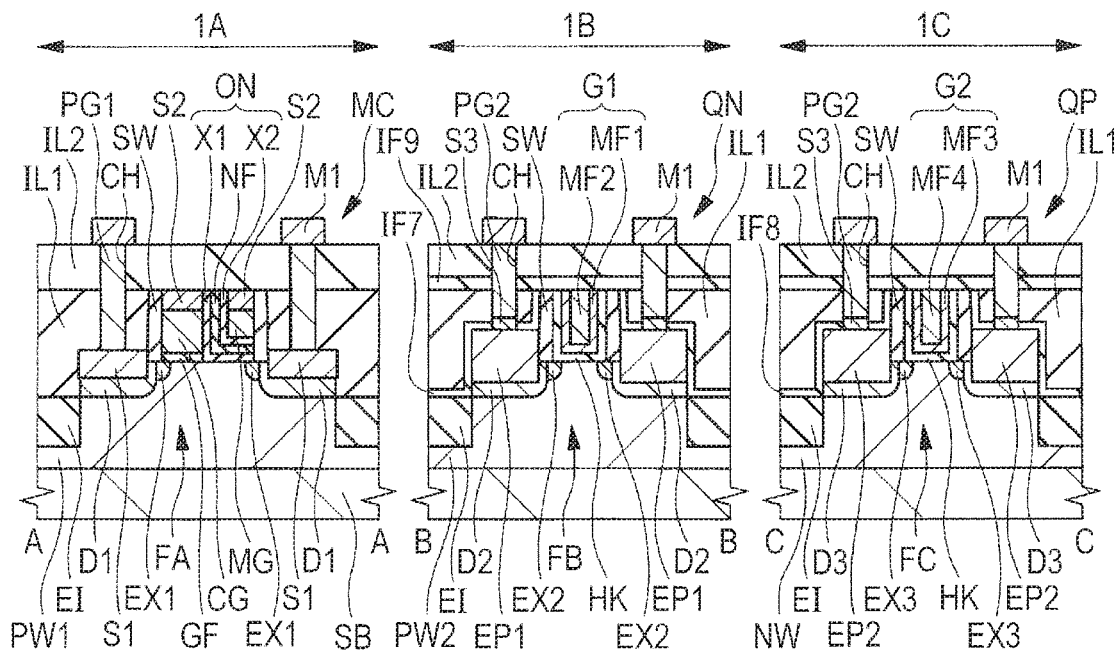
FIG. 4 is a sectional view illustrating the semiconductor device of the first embodiment of the invention.
Figure 5:
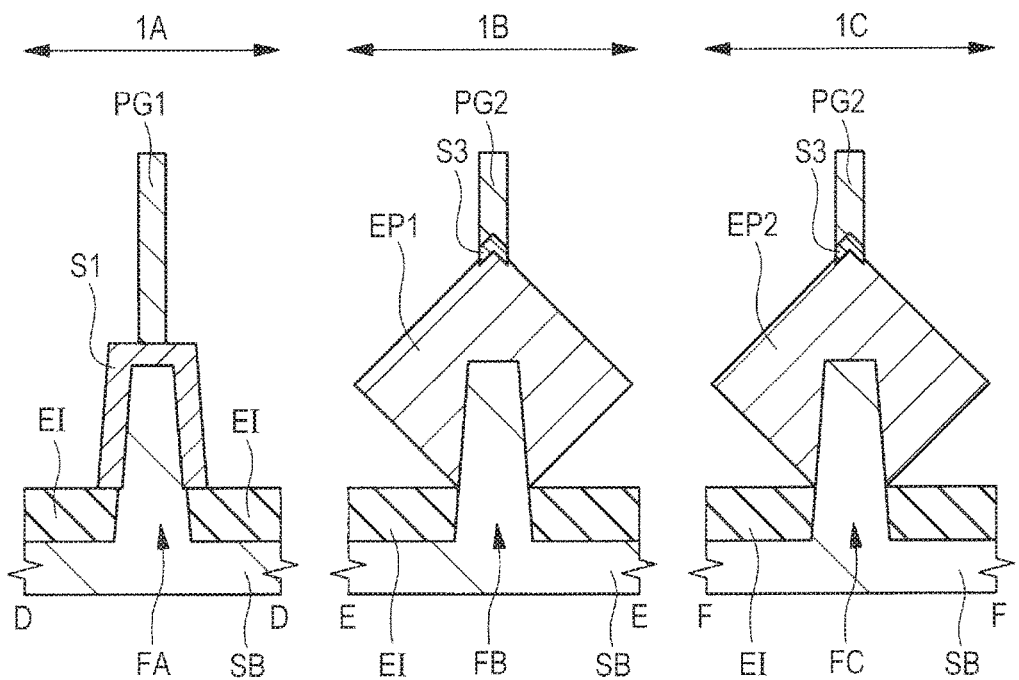
FIG. 5 is a sectional view illustrating the semiconductor device of the first embodiment of the invention.

A structure of the semiconductor device of the first embodiment is now described with reference to FIGS. 2 to 5. FIG. 2 is a plan view of the semiconductor device of the first embodiment. FIG. 3 is a perspective view of the semiconductor device of the first embodiment. FIGS. 4 and 5 are each a sectional view of the semiconductor device of the first embodiment. In FIGS. 3 and 5, wells are omitted. FIG. 5 omits the source/drain region.

In FIG. 2, a plan view of the memory cell array is shown in a memory cell region 1A, a plan view of an n transistor QN configuring a logic circuit in a logic circuit region is shown in a n-MIS region 1B, and a plan view of a p transistor QP configuring a logic circuit in a logic circuit region is shown in the p-MIS region 1C. An n metal insulator semiconductor field effect transistor (n-MISFET) is exemplified as the n transistor QN. A p-MISFET is exemplified as the p transistor QP. In this application, the n-MISFET may be referred to as n-MIS, and the p-MISFET may be referred to as p-MIS.

A memory cell MC formed in the memory cell region 1A is provided in the flash memory CC5 in FIG. 1, for example. The n transistor QN in the n-MIS region 1B and the p transistor QP in the p-MIS region 1C are provided in the RAM CC2 or the CPU CC1, for example.

As shown in FIG. 2, a plurality of fins FA extending in an X direction are disposed at equal intervals in a Y direction in the memory cell region 1A. The X direction and the Y direction are each a direction along the main surface of a semiconductor substrate SB, where the X direction is orthogonal to the Y direction. Each fin FA is, for example, a rectangular parallelepiped protrusion (convex portion) selectively protruding from the main surface of the semiconductor substrate SB, and has a wall-like (plate-like) shape. The lower end portion of the fin FA is surrounded by an element isolation film EI covering the main surface of the semiconductor substrate SB. The fin FA is part of the semiconductor substrate SB, and acts as an active region of the semiconductor substrate SB. A space between the adjacent fins FA is filled with the element isolation film EI, and each fin FA is surrounded by the element isolation film EI in planar view. The fin FA acts as an active region for forming the memory cell MC.

A plurality of control gate electrodes CG and a plurality of memory gate electrodes MG extending in the Y direction are disposed on the fins FA. A drain region MD close to the control gate electrode CG and a source region MS close to the memory gate electrode are provided on a top of the fin FA so as to sandwich the control gate electrode CG and the memory gate electrode MG. Specifically, one control gate electrode CG and one memory gate electrode MG adjacent to each other are located between the source region MS and the drain region MD in the X direction.

The drain region MD and the source region MS are each an n semiconductor region. The drain region MD is provided between two control gate electrodes CG adjacent to each other in the X direction, and the source region MS is provided between two memory gate electrodes MG adjacent to each other in the X direction. The memory cell MC is a nonvolatile memory element having the control gate electrode CG, the memory gate electrode MG, the drain region MD, and the source region MS. Hereinafter, the source region MS and the drain region MD configuring one memory cell MC may be referred to as source/drain region.

Two memory cells MC adjacent in the X direction share the drain region MD or the source region MS. The two memory cells MC sharing the drain region MD are axisymmetric in the X direction with the drain region MD extending in the Y direction as an axis. The two memory cells MC sharing the source region MS are axisymmetric in the X direction with the source region MS extending in the Y direction as an axis.

Each fin FA has a plurality of memory cells MC arranged in the X direction. The drain region MD of each memory cell MC is electrically coupled to a source line SL including an interconnection M1 extending in the X direction via a plug (contact plug) PG1 formed in a contact hole penetrating through an undepicted interlayer insulating film formed on the memory cell MC. The source region MS of each of the memory cells MC arranged in the Y direction is electrically coupled to a bit line BL including an interconnection M1 extending in the Y direction.

The n-MIS region 1B has a fin FB extending in the X direction, for example. As with the fin FA, the fin FB is part of the semiconductor substrate SB, and has a wall-like (plate-like) shape protruding on the main surface of the semiconductor substrate SB. The fin FB is an active region of the semiconductor substrate SB, and the lower end portion of the fin FB is surrounded by an element isolation film EI covering the main surface of the semiconductor substrate SB. A gate electrode G1 extending in the Y direction is disposed on the fin FB, and a drain region LD1 and a source region LS1 are provided on a top of the fin FB so as to sandwich the gate electrode G1. The drain region LD1 and the source region LS1 are each an n semiconductor region.

The n transistor QN has the gate electrode G1, the drain region LD1, and the source region LS1. The gate electrode G1, the drain region LD1, and the source region LS1 are each electrically coupled to the interconnection M1 via a plug PG formed in the contact hole. The fin FB acts as an active region for forming the n transistor QN.

The p-MIS region 1C has a fin FC extending in the X direction and a p transistor QP on the fin FC. The layout of the p transistor QP configured of a gate electrode G2, a drain region LD2, and a source region LS2 is the same as that of the n transistor QN, for example.

The fins FA, FB and FC are each, for example, a rectangular parallelepiped protrusion protruding from the main surface of the semiconductor substrate SB in a direction perpendicular to the main surface. Each of the fins FA, FB and FC may not necessarily have a rectangular parallelepiped shape, but may have a rectangular shape having rounded corners in sectional view in a short side direction. Although each of the sidewalls of the fins FA, FB, and FC may be perpendicular to the main surface of the semiconductor substrate SB, the sidewall may have an inclination angle close to the vertical as illustrated in FIG. 5. That is, each of the sectional shapes of the fins FA, FB and FC is a rectangular parallelepiped or a trapezoid. The sidewalls of the fins FA, FB and FC are each obliquely inclined with respect to the main surface of the semiconductor substrate SB.

As illustrated in FIG. 2, a direction, in which the fins FA, FB and FC extend in planar view, is the long side direction of each fin, and the direction orthogonal to the long side direction is the short side direction of the fin. That is, the length of the fin is larger than the width of the fin. Each of the fins FA, FB and FC may have any shape as long as the fin is configured of a protrusion having a length, a width, and a height. For example, the fin may have a meandering layout in planar view.

In FIGS. 3 to 5, the memory cell region 1A, the n-MIS region 1B, and the p-MIS region 1C are shown in order from the left side to the right side. FIG. 3 omits the interlayer insulating film and the interconnection over the element isolation film EI and the elements. The memory cell MC is provided over the fin FA configuring the semiconductor substrate SB in the memory cell region 1 A, an n transistor QN is provided over the fin FB configuring the semiconductor substrate SB in the n-MIS region 1B, and the p transistor QP is provided over the fin FC configuring the semiconductor substrate SB in the p-MIS region 1C.

FIG. 4 shows cross sections of a semiconductor element taken along lines A-A, B-B, and C-C in FIG. 2. FIG. 5 shows cross sections of the semiconductor element taken along lines D-D, E-E, and F-F in FIG. 2. Although a plurality of elements are provided side by side on one fin, only one element is shown on the fin in FIGS. 3 and 4.

As illustrated in FIG. 3, the control gate electrode CG and the memory gate electrode MG extend in the Y direction so as to stride over the fin FA, the gate electrode G1 extends in the Y direction so as to stride over the fin FB, and the gate electrode G2 extends in the Y direction so as to stride over the fin FC. A top of the control gate electrode CG and A top of the memory gate electrode MG are each covered with a silicide layer S2. The silicide layer S2 includes nickel silicide (NiSi), for example. The silicide layer S2 may contain platinum (Pt).

As illustrated in FIGS. 3 to 5, the sidewall and the top of the fin FA having diffusion regions D1, which configure the source/drain region in the memory cell region 1A, are covered with the silicide layer S1. The silicide layer S1 includes nickel silicide (NiSi), for example. The sidewall and the top of the fin FB having diffusion regions D2, which configure the source/drain region in the n-MIS region 1B, are covered with an epitaxial layer (semiconductor layer) EP1. Similarly, a sidewall and a top of the fin FC having diffusion regions D3, which configure the source/drain region in the p-MIS region 1C, are covered with an epitaxial layer (semiconductor layer) EP2.

The silicide layer S1 and the epitaxial layers EP1 and EP2 are each provided over the element isolation film EI. The silicide layer S1 extends along the top and the sidewall of the fin FA.

On the other hand, each of the epitaxial layers EP1 and EP2 formed by an epitaxial growth process has a rhombic shape in a cross section along the Y direction (see FIG. 5). Specifically, a sidewall of the epitaxial layer EP1 in the n-MIS region 1B, the sidewall being not in contact with the fin FB, has a lower sidewall and an upper sidewall. The lower sidewall has an inclination so as to be more distant from the fin FB in a direction along the main surface of the semiconductor substrate SB as going upward from a side close to the element isolation film EI, and the upper sidewall has an inclination so as to approach the fin FB in the direction along the main surface of the semiconductor substrate SB as going upward from a side close to the element isolation film EI. The upper end of the lower sidewall is coupled to the lower end of the upper sidewall.

In other words, the width in the Y direction between the left terminal and the right terminal of the epitaxial layer EP1 is larger at the middle between the upper end and the lower end of the epitaxial layer EP1 than at the upper end or the lower end. The epitaxial layer EP2 in the p-MIS region 1C also has the same shape as that of the epitaxial layer EP1 in the n-MIS region 1B. The epitaxial layer EP1 in the n-MIS region 1B includes, for example, silicon phosphide (SiP) or silicon carbide (SiC), and the epitaxial layer EP2 in the p-MIS region 1C includes silicon germanium (Site).

The epitaxial layer EP1 in the n-MIS region 1B is a semiconductor layer containing an n impurity (for example, phosphorus (P) or arsenic (As)), and configures the diffusion region D2 of the n transistor QN. The epitaxial layer EP2 in the p-MIS region 1C is a semiconductor layer containing a p impurity (for example, boron (B)), and configures the diffusion region D3 of the p transistor QP.

As illustrated in FIGS. 3 and 4, the lower portion of each of the sidewalls of the fins FA, FB and FC is surrounded by the element isolation film EI formed on the main surface of the semiconductor substrate SB. That is, the fins are isolated from one another by the element isolation film EI. A p well PW1 being a p semiconductor region is provided in the fin FA from the top to a bottom of the fin FA. Similarly, a p well PW2 being a p semiconductor region is provided in the fin FB from the top to a bottom of the fin FB. An n well NW being an n semiconductor region is provided in the fin FC from the top to a bottom of the fin FC.

A control gate electrode CG is provided over the top and the side face of the fin FA with a gate insulating film GF in between, and the memory gate electrode MG is provided in a region adjacent to the control gate electrode CG with an insulating film ON in between in the long side direction (X direction) of the fin FA. The insulating film ON exists between the control gate electrode CG and the memory gate electrode MG, and the control gate electrode CG is electrically isolated from the memory gate electrode MG by the insulating film ON. The insulating film ON exists between the memory gate electrode MG and the top of the fin FA. The insulating film ON is continuously provided so as to cover a sidewall and a bottom of the memory gate electrode MG. Hence, the insulating film ON has an L-shaped section.

The gate insulating film GF is a thermal oxide film (silicon oxide film) formed by thermally oxidizing the main surface and the side face of the fin FA that is a protrusion of the semiconductor substrate SB made of silicon, and has a thickness of 2 nm, for example. The insulating film ON includes a silicon oxide film X1 including a thermal oxide film (silicon oxide film) 4 nm in thickness formed by thermally oxidizing the main surface and the side face of the fin FA that is the protrusion of the semiconductor substrate SB made of silicon, a silicon nitride film NF formed on the silicon oxide film X1, and a silicon oxide film X2 formed on the silicon nitride film NF. The silicon nitride film NF acts as a charge accumulating part (charge accumulating layer) of the memory cell MC. The silicon nitride film has a thickness of, for example, 7 nm, and the silicon oxide film X2 has a thickness of, for example, 9 nm.

That is, the insulating film ON has a stacked structure including a silicon oxide film X1, the silicon nitride film NF, and the silicon oxide film X2 stacked in order from a side close to the top of the fin FA and from a side close to the sidewall of the control gate electrode CG. The thickness of the insulating film ON is larger than the thickness of the gate insulating film GF under the control gate electrode CG, and is 20 nm, for example. The silicon oxide film X2 may include a silicon oxynitride film.

As shown in the memory cell region 1A, the control gate electrode CG is provided on the gate insulating film GF and extends in the short side direction (Y direction) of the fin FA along the top and the side face of the fin FA and along a top of the element isolation film EI. Similarly, the memory gate electrode MG is provided on the insulating film ON and extends in the short side direction of the fin FA along the main surface and the side face of the fin FA and along the top of the element isolation film EI. The silicide layer S2 is provided on each main surface of the control gate electrode CG and the memory gate electrode MG.

A sidewall of a pattern including the control gate electrode CG, the memory gate electrode MG, the gate insulating film GF, the insulating film ON, and the silicide layer S2 is covered with Sidewall (sidewall spacer) SW. The Sidewall SW has a stacked structure of a silicon nitride film and a silicon oxide film, for example. The silicide layer S1 covers the surface of the fin FA exposed from the pattern including the control gate electrode CG and the Sidewall SW.

As illustrated in FIG. 4, a source region and a drain region in pair are provided on the top of the fin FA so as to sandwich the top of the fin FA just below the pattern including the control gate electrode CG. Each of the source and drain regions has an extension region EX1 as an n$^-$ semiconductor region and a diffusion region D1 as an n$^+$ semiconductor region. The diffusion region D1 has a high impurity concentration and a deep depth compared with the extension region EX1. The extension region EX1 is in contact with the diffusion region D1 in each of the source and drain regions, and the extension region EX1 is located in the top of the fin FA just below the pattern compared with the diffusion region D1, i.e., located on a side close to the channel region.

In this way, the source/drain region, which has a structure including the extension region EX1 having a low impurity concentration and the diffusion region D1 having a high impurity concentration, i.e., has a lightly doped drain (LDD) structure, is formed, making it possible to improve short channel characteristics of the transistor having such a source/drain region. That source region corresponds to the source region MS shown in FIG. 2, and that drain region corresponds to the drain region MD shown in FIG. 2.

An interlayer insulating film IL1 including, for example, a silicon oxide film is provided over the fin FA and the element isolation film EI. An interlayer insulating film IL2 including, for example, a silicon oxide film is provided over tops of the interlayer insulating film IL1, the control gate electrode CG, the memory gate electrode MG, the Sidewall SW, and the silicide layer S2. The top of the interlayer insulating film IL1 is planarized at a surface substantially equal to each of tops of the insulating film ON, the Sidewall SW, and the silicide layer S2.

The interconnections M1 are provided on the interlayer insulating film IL2, and each interconnection M1 is electrically coupled to the source region and the drain region of the memory cell MC via a plug PG1 provided in a contact hole CH penetrating through the interlayer insulating films IL2 and IL1. Specifically, a bottom of the plug PG1 is directly in contact with a top of the silicide layer S1, and the plug PG1 is electrically coupled to the source/drain region via the silicide layer S1. The silicide layer S1 reduces a coupling resistance between the plug PG1 as a coupling part made of a metal film mainly containing, for example, tungsten (W) and the source/drain region in the fin FA made of semiconductor.

Although each of the contact hole CH, the plug PG1, and the plug PG2 has a round shape in planar view in the case described herein, the contact hole CH, the plug PG1, and the plug PG2 may each have a rectangular shape in planar view. Furthermore, the contact hole CH, the plug PG1, and the plug PG2 may each have a width larger than any one of the silicide layer S1, the epitaxial layer EP1, and the epitaxial layer EP2 in the short side direction (Y direction) of each fin.

The fin FA having the source/drain region is covered with the silicide layer S1 and thus a resistance of the source/drain region is reduced, thereby performance of the memory cell MC can be improved.

The memory cell MC has the control gate electrode CG, the memory gate electrode MG, the drain region, and the source region. The control gate electrode CG and the source/drain region configure a control transistor, the memory gate electrode MG and the source/drain region configure a memory transistor, and the control transistor and the memory transistor configure the memory cell MC. That is, the control transistor and the memory transistor share the source/drain region. A distance between the drain region and the source region in a gate length direction (X direction) of the control gate electrode CG or the memory gate electrode MG corresponds to the channel length of the memory cell MC.

In the n-MIS region 1B, the gate electrode G1 is provided on the main surface and the side face of the fin FB with an insulating film HK, which serves as a gate insulating film, in between. The insulating film HK continuously covers a bottom and a sidewall of the gate electrode G1. The insulating film HK is an insulating material film having a dielectric constant (specific inductive capacity) higher than silicon nitride, i.e., a so-called High-k film (high dielectric constant film). The gate electrode G1 includes a metal film MF1 covering the surface of the insulating film HK and a metal film MF2 formed on the insulating film HK with the metal film MF1 in between. The metal film MF1 includes, for example, titanium aluminum (TiAl), and the metal film MF2 includes, for example, aluminum (Al). An undepicted silicon oxide film may be provided as part of the gate insulating film between the fin FB and the insulating film HK.

The gate electrode G1 is provided over the insulating film HK, and continuously extends in the short side direction (Y direction) of the fin FB along the top and the side face of the fin FB, and along the top of the element isolation film EI. The sidewall of the gate electrode G1 is covered with the Sidewall SW.

The source region and the drain region are provided in the respective regions beside the gate electrode G1 so as to sandwich the gate electrode G1 in the X direction, and each include an extension region EX2 being an n⁻ semiconductor region and the diffusion region D2 being an n⁺ semiconductor region, and thus each have an LDD structure. The diffusion region D2 is provided from within the fin FB to within the epitaxial layer EP1 formed beside the gate electrode G1 with the Sidewall SW in between. The extension region EX2 is provided within the fin FB. The source region corresponds to the source region LS1 shown in FIG. 2, and the drain region corresponds to the drain region LD1 shown in FIG. 2.

As with the memory cell region 1A, the interlayer insulating films IL1 and IL2 are provided in order over the fin FB and the element isolation film EI in the n-MIS region 1B. However, an insulating film IF9 is provided between the interlayer insulating films IL1 and IL2 so as to cover the top of the gate electrode G1. The top of the interlayer insulating film IL1 is planarized together with the tops of the gate electrode G1, the insulating film HK, and the Sidewall SW. The interlayer insulating film IL1 covers a top of the epitaxial layer EP1, the top being directly in contact with the interlayer insulating film IL1. That is, no silicide layer exists between the top of the epitaxial layer EP1 and the interlayer insulating film IL1.

The interconnection M1 is provided on the interlayer insulating film IL2, and is electrically coupled to each of the source and drain regions via the plug PG2 provided in the contact hole CH penetrating through the interlayer insulating films IL2 and IL1. A silicide layer S3 exists between the plug PG2 and the epitaxial layer EP1. The silicide layer S3 includes, for example, titanium silicide (TiSi$_2$).

The silicide layer S3 is provided just below the plug PG2, i.e., provided only at a bottom of the contact hole CH, and a top of the epitaxial layer EP1 in a region beside the plug PG2 is exposed from the silicide layer S3. The silicide layer S3 reduces a coupling resistance between the plug PG2 as a coupling part including a metal film mainly containing, for example, tungsten (W) and the source/drain region in the epitaxial layer EP1 including semiconductor.

The n transistor QN has the gate electrode G1, the drain region, and the source region. A distance between the drain region and the source region in the gate length direction (X direction) of the gate electrode G1 corresponds to the channel length of the n transistor QN.

In the p-MIS region 1C, a gate electrode G2 is provided on the main surface and the side face of the fin FC with an insulating film HK, which serves as a gate insulating film, in between. The insulating film HK continuously covers a bottom and a sidewall of the gate electrode G2. The insulating film HK is an insulating material film having a dielectric constant (specific inductive capacity) higher than silicon nitride, i.e., a so-called High-k film (high dielectric constant film). The gate electrode G2 includes a metal film MF3 covering the surface of the insulating film HK and a metal film MF4 formed on the insulating film HK with the metal film MF3 in between. The metal film MF3 includes, for example, titanium aluminum (TiAl), and the metal film MF4 includes, for example, aluminum (Al). An undepicted silicon oxide film may be provided as part of the gate insulating film between the fin FC and the insulating film HK.

The gate electrode G2 is provided over the insulating film HK, and continuously extends in the short side direction (Y direction) of the fin FC along the top and the side face of the fin FB, and along the top of the element isolation film EI. The sidewall of the gate electrode G2 is covered with the Sidewall SW.

The source region and the drain region are provided in the respective regions beside the gate electrode G2 so as to sandwich the gate electrode G2 in the X direction, and each include an extension region EX3 being a p⁻ semiconductor region and the diffusion region D3 being a p⁺ semiconductor region, and thus each have an LDD structure. The diffusion region D3 is provided from within the fin FC to within the epitaxial layer EP2 formed beside the gate electrode G2 with the Sidewall SW in between. The extension region EX3 is provided within the fin FC. The source region corresponds to the source region LS2 shown in FIG. 2, and the drain region corresponds to the drain region LD2 shown in FIG. 2.

As with the n-MIS region 1B, the interlayer insulating film IL1, the insulating film IF9, and the insulating film IL2 are provided in order over the fin FC and the element isolation film EI in the p-MIS region 1C. The top of the interlayer insulating film IL1 is planarized together with tops of the gate electrode G2, the insulating film HK, and the Sidewall SW. The interlayer insulating film IL1 covers a top of the epitaxial layer EP2, and the top of the epitaxial layer EP2 is directly in contact with the interlayer insulating film IL1. That is, no silicide layer exists between the top of the epitaxial layer EP2 and the interlayer insulating film IL1.

The interconnection M1 is provided on the interlayer insulating film IL2, and is electrically coupled to each of the source and drain regions via the plug PG2 provided in the contact hole CH penetrating through the interlayer insulating films IL2 and IL1. A silicide layer S3 exists between the plug PG2 and the epitaxial layer EP2. The silicide layer S3 includes titanium silicide (TiSi$_2$), for example.

The silicide layer S3 is provided just below the plug PG2, i.e., provided only at the bottom of the contact hole CH, and the top of the epitaxial layer EP2 in a region beside the plug PG2 is exposed from the silicide layer S3. The silicide layer S3 reduces a coupling resistance between the plug PG2 as a coupling part including a metal film mainly containing, for example, tungsten (W) and the source/drain region in the epitaxial layer EP2 including semiconductor.

The p transistor QP has the gate electrode G2, the drain region, and the source region. A distance between the drain region and the source region in the gate length direction (X direction) of the gate electrode G2 corresponds to a channel length of the p transistor QP.

Effects of Semiconductor Device

A position of the top of each of the epitaxial layers EP1 and EP2 formed in the n-MIS region 1B and the p-MIS region 1C, respectively, the top being a surface coupled to the plug PG2 via the silicide layer S3, is higher than a position of a top of the silicide layer S1, the top corresponding to the surface coupled to the plug PG1. This is because thicknesses of the epitaxial layers EP1 and EP2 formed on the fins FB and FC are each larger than thickness of the silicide layer S1 formed on the fin FA.

In the first embodiment, the thick epitaxial layers EP1 and EP2 are thus formed, which increases sectional area of the source/drain region of each of the n transistor QN and the p transistor QP in a logic region, resulting in a reduction in resistance of the source/drain region. In the memory cell region 1A, the fin FA is covered with the silicide layer S1 having a resistance lower than the semiconductor, thereby the resistance of the source drain region is reduced.

The reason why the structure for reducing the resistance of the source/drain region is thus different between the memory cell region 1A and the n-MIS region 1B or the p-MIS region 1C being the logic region is because stress generation must be prevented as described later. Specifically, although an epitaxial layer covering the source/drain region of the FINFET can be formed to reduce the resistance of the source/drain region, when the epitaxial layer is formed in a MONOS memory cell, stress is generated in the element, leading to deterioration in performance and reliability of the memory device.

In the first embodiment, therefore, the silicide layer S1 is formed to reduce the resistance of the source/drain region for the fin FA having the memory cell MC of a MONOS memory type, and the epitaxial layer EP1 or EP2 having a large volume is formed to reduce the resistance of the source/drain region for the fin FB or FC, in which the transistor in the logic region is provided.

In this way, it is possible to reduce the resistance of each of the memory cell MC, the n transistor QN, and the p transistor QP, and prevent deterioration in performance of the memory cell. It is therefore possible to improve performance of the semiconductor device.

In the logic region, the fins FB and FC and the epitaxial layers EP1 and EP2 are covered with the silicide layer, and thus stress may be increased. The silicide layer S3 is therefore provided only at the bottom of the contact hole CH to prevent such an increase in stress. In such a case, since the silicide layer S3 is formed through a salicide process using a titanium (Ti) film as a material that can be formed by a CVD process, the silicide layer S1 and the silicide layer S3 are formed of materials different from each other. A titanium (Ti) film may be provided in the contact hole CH between the top of the silicide layer S1 and the plug PG1.

Manufacturing Process of Semiconductor Device

Figure 41:
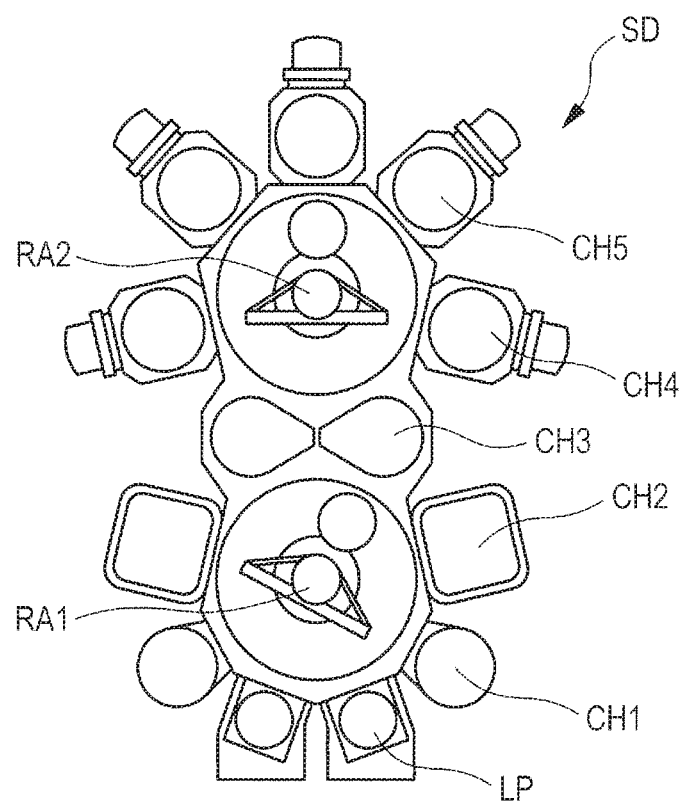
FIG. 41 is a schematic plan view of a sputtering apparatus used in the manufacturing process of the semiconductor device of the first embodiment of the invention.

A method of manufacturing the semiconductor device of the first embodiment is now described with reference to FIGS. 6 to 53. FIGS. 6, 8, 10, 12, 15, 17, 19, 20 to 40, and 42 to 53 are each a sectional view of the semiconductor device of the first embodiment during a formation process of the semiconductor device. FIGS. 7, 9, 11, 13, 14, 16, and 18 are each a perspective view of the semiconductor device of the first embodiment during the formation process of the semiconductor device. FIG. 41 is a schematic plan view of a sputtering apparatus used in the formation process of the semiconductor device of the first embodiment. FIGS. 8, 10, 12, 15, 17, and 19 are views illustrating the respective cross sections taken along the Y direction at the same positions in FIGS. 7, 9, 11, 14, 16 and 18. In the above-described perspective views and FIGS. 42 and 44, wells are omitted.

FIGS. 6 to 20 each illustrate the memory cell region 1A and a logic region 1D arranged in order from the left side to the right side. FIGS. 21 to 40 and 42 to 53 each illustrate the memory cell region 1A, the n-MIS region 1B, and the p-MIS region 1C arranged in order from the left side to the right side. The n-MIS region 1B and the p-MIS region 1C configure the logic region 1D.

Figure 6:
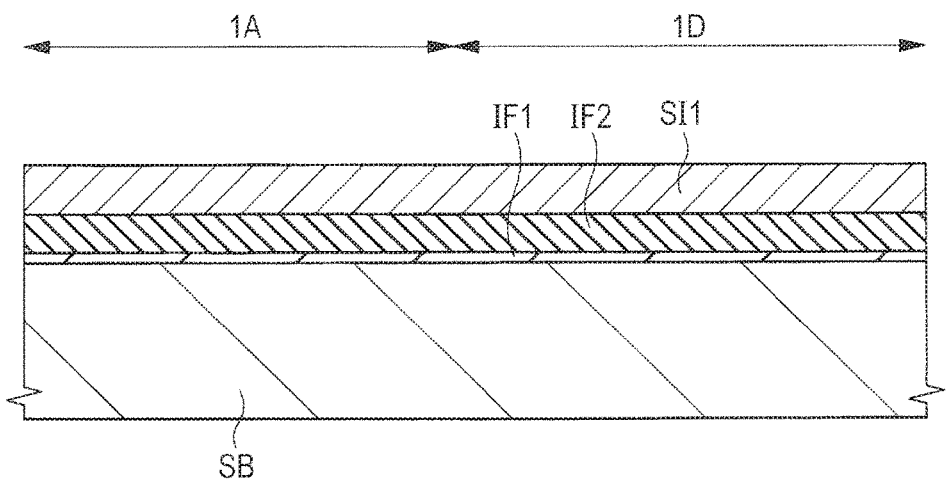
FIG. 6 is a sectional view explaining a manufacturing process of the semiconductor device of the first embodiment of the invention.

First, as illustrated in FIG. 6, a semiconductor substrate SB is provided, and an insulating film IF1, an insulating film IF2, and a semiconductor film SI1 are formed in order on the main surface of the semiconductor substrate SB. The semiconductor substrate SB is made of p single-crystal silicon having a specific resistance of about 1 to 10 Ω·cm, for example. The insulating film IF1 includes, for example, a silicon oxide film, and can be formed by an oxidation process or a chemical vapor deposition (CVD) process, for example. The insulating film IF1 has a thickness of about 2 to 10 nm. The insulating film IF2 includes, for example, a silicon nitride film, and has a thickness of about 20 to 100 nm. The insulating film IF2 is formed by a CVD process, for example. The semiconductor film SI1 includes, for example, a silicon film, and is formed by a CVD process, for example. The semiconductor film SI1 has a thickness of 20 to 200 nm, for example.

Figure 7:
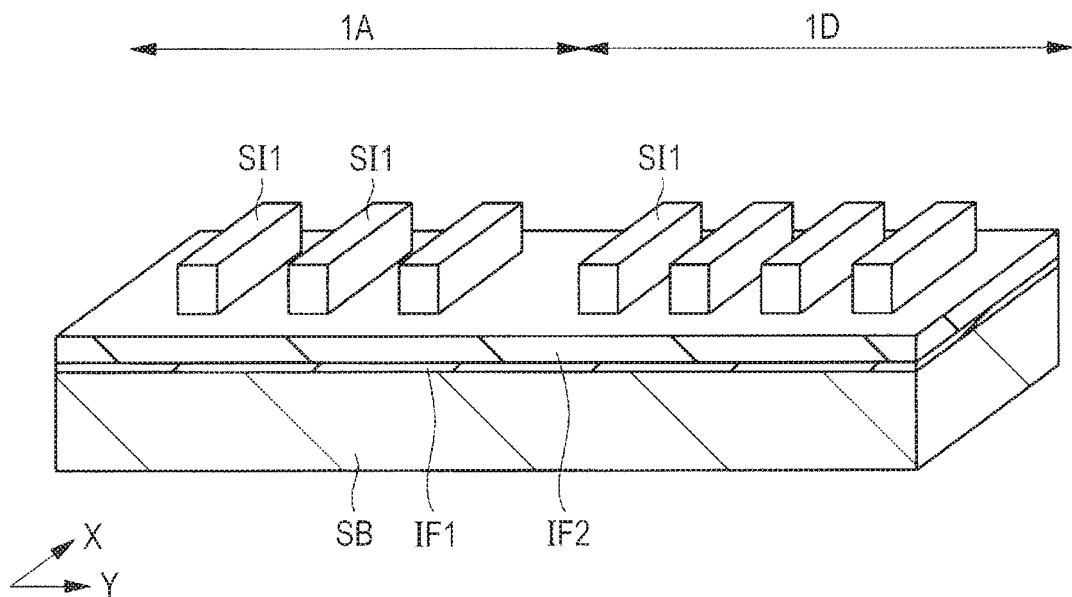
FIG. 7 is a perspective view explaining the manufacturing process of the semiconductor device following FIG. 6.
Figure 8:
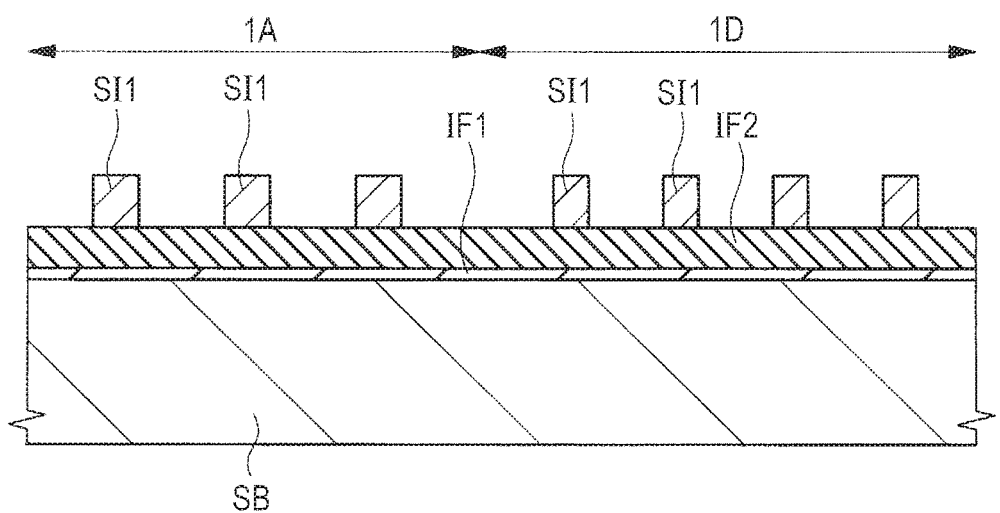
FIG. 8 is a sectional view along a Y direction of the semiconductor device shown in FIG. 7 during the manufacturing process thereof.

Subsequently, as illustrated in FIGS. 7 and 8, the semiconductor film SI1 in each of the memory cell region 1A and the logic region 1D is processed by a photolithography technique and an etching process. Consequently, a plurality of patterns of the semiconductor film SI1 extending in the X direction are formed side by side in the Y direction on the insulating film IF2. FIG. 8 is a sectional view including the patterns of the semiconductor film SI1 illustrated in FIG. 7.

The width in the Y direction of the pattern in the memory cell region 1A is larger than the width in the Y direction of the pattern in the logic region 1D. An interval between the patterns arranged in the Y direction in the memory cell region 1A is larger than an interval between the patterns arranged in the Y direction in the logic region 1D. Since fins are formed in a region close to the semiconductor film SI1 in the Y direction in a later step, the interval between adjacent fins can be adjusted by changing the width of the pattern and the interval between the patterns.

Figure 9:
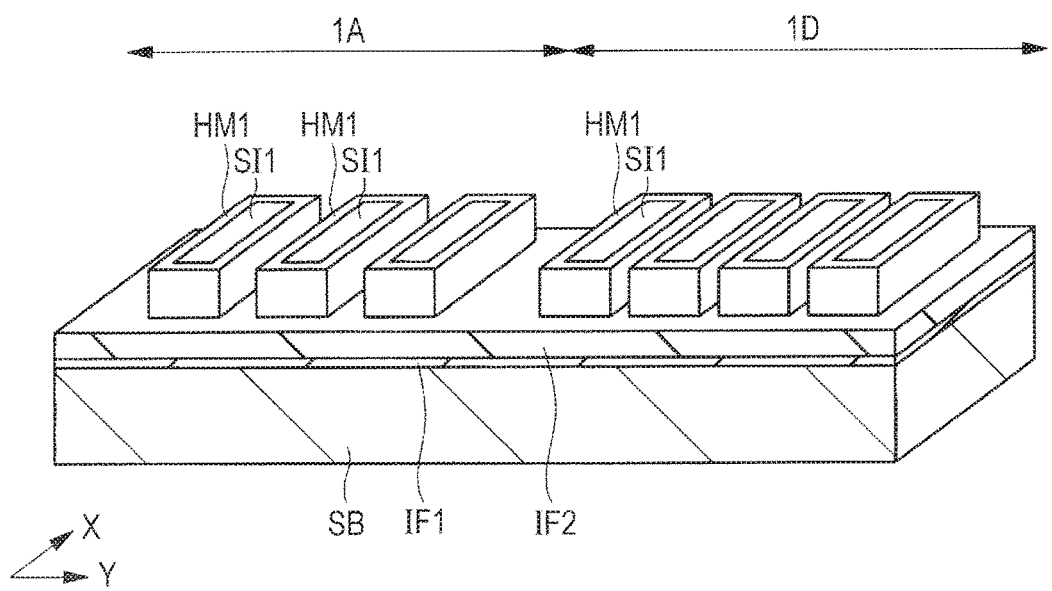
FIG. 9 is a perspective view explaining the manufacturing process of the semiconductor device following FIG. 8.
Figure 10:
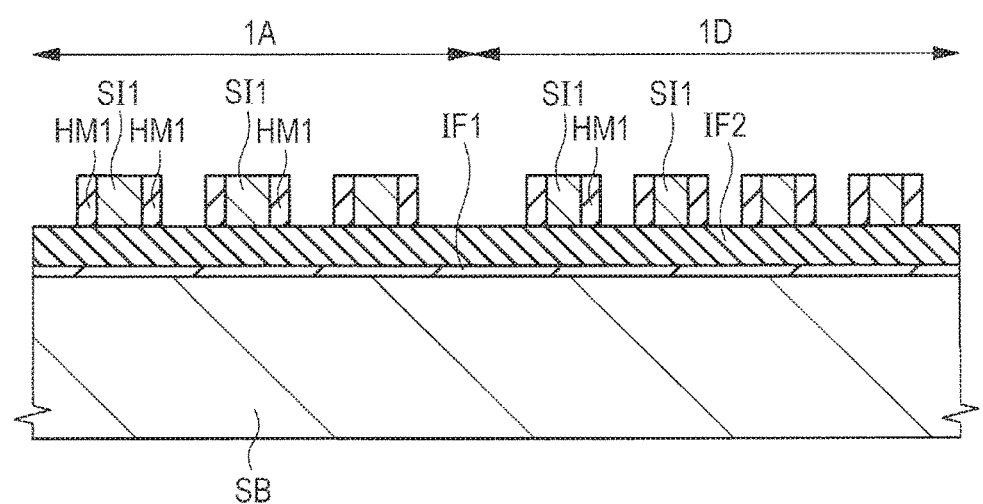
FIG. 10 is a sectional view along the Y direction of the semiconductor device shown in FIG. 9 during the manufacturing process thereof.

Subsequently, as illustrated in FIGS. 9 and 10, a hard mask HM1, which covers each of sidewalls of the semiconductor films SI1, is formed. For example, a silicon oxide film having a thickness of 10 to 40 nm is formed on the semiconductor substrate SB by a CVD process, and is then subjected to dry etching being anisotropic etching. Consequently, tops of the insulating film IF2 and the semiconductor film SI1 are exposed to form the hard mask HM1 including the silicon oxide film remaining on the sidewall of the semiconductor film SI1. The hard mask HM1 does not completely fill the space between the adjacent semiconductor films SI1. As illustrated in FIG. 9, the hard mask HM1 is annularly formed so as to enclose each semiconductor film SI1.

Figure 11:
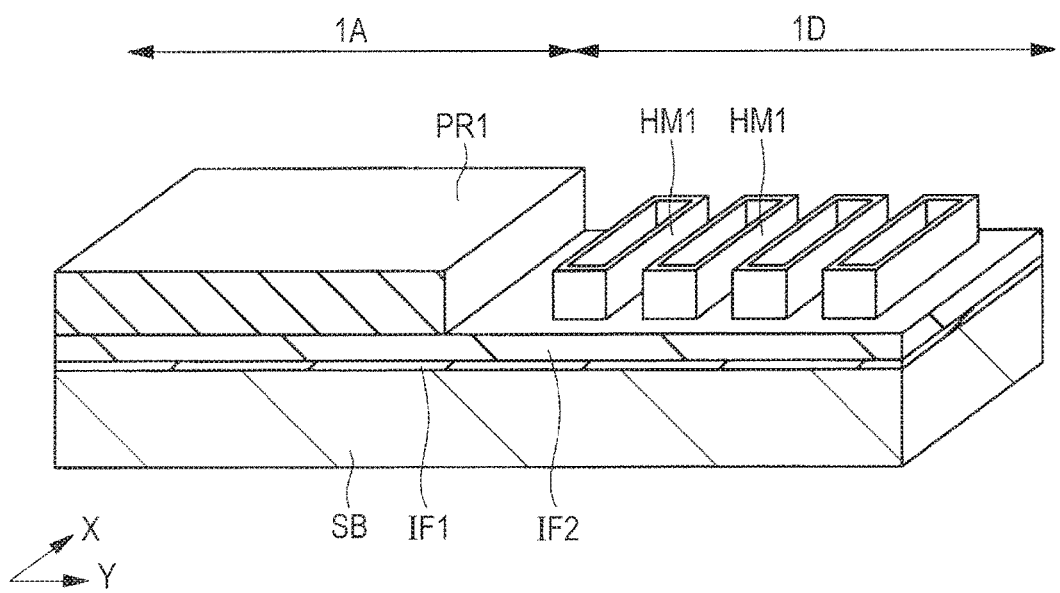
FIG. 11 is a perspective view explaining the manufacturing process of the semiconductor device following FIG. 10.
Figure 12:
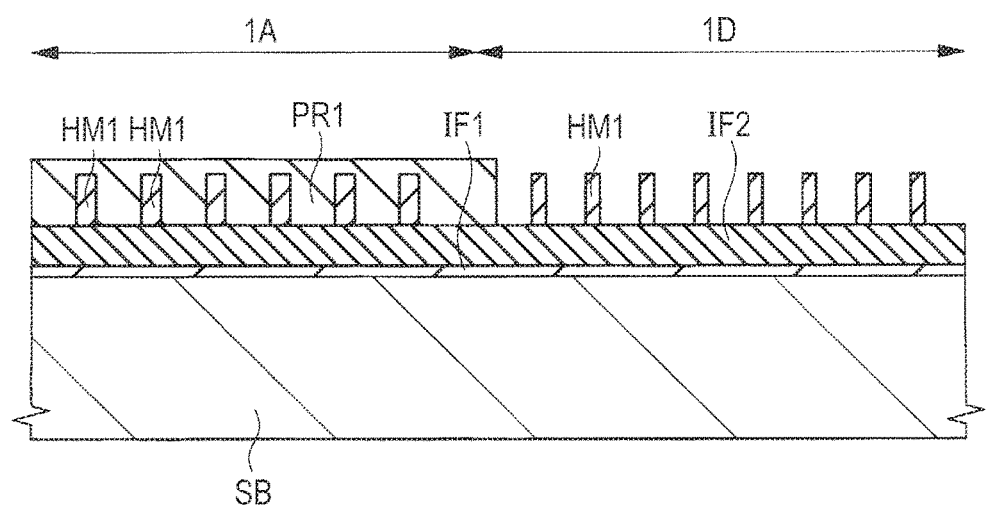
FIG. 12 is a sectional view along the Y direction of the semiconductor device shown in FIG. 11 during the manufacturing process thereof.

Subsequently, as illustrated in FIGS. 11 and 12, the semiconductor films SI1 are removed by a wet etching process. Subsequently, a photoresist film PR1, which covers the hard masks HM1 in the memory cell region 1 A, but exposes the hard masks HM1 in the logic region 1D, is formed. Subsequently, the surface of each hard mask HM1 is partially removed by wet etching. Consequently, the width of the hard mask HM1 in the logic region 1D is narrowed. The width referred to in the present application means the length of a pattern in a direction along the main surface of the semiconductor substrate SB.

The hard mask HM1 is used to form the fins just thereunder. Hence, a difference between the width of the hard mask HM1 in the memory cell region 1A and the width of the hard mask HM1 in the logic region 1D is provided in the above-described manner, making it possible to provide a difference between the widths of the fins formed in the memory cell region 1A and the logic region 1D.

Figure 13:
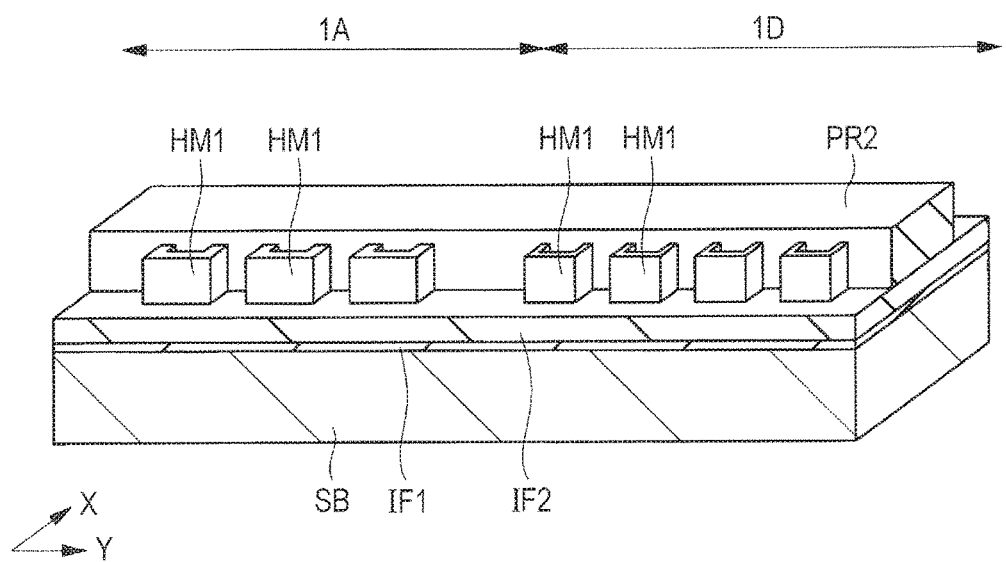
FIG. 13 is a perspective view explaining the manufacturing process of the semiconductor device following FIG. 12.

Subsequently, as illustrated in FIG. 13, the photoresist film PR1 is removed, and then a photoresist film PR2, which covers part of the hard mask HM1 in each of the memory cell region 1A and the logic region 1D, is formed. The photoresist film PR2 is a resist pattern, which covers a portion of each hard mask HM1 extending in the X direction, but exposes either end of that portion and a portion of the hard mask HM1 extending in the Y direction. Specifically, both ends of the hard mask HM1 in the X direction are exposed from the photoresist film PR2.

Figure 14:
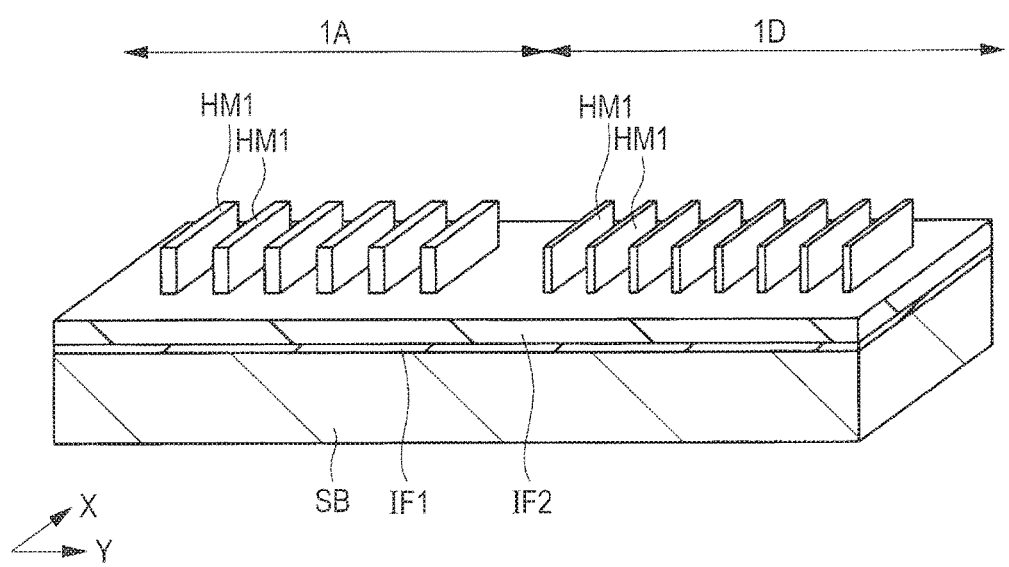
FIG. 14 is a perspective view explaining the manufacturing process of the semiconductor device following FIG. 13.
Figure 15:
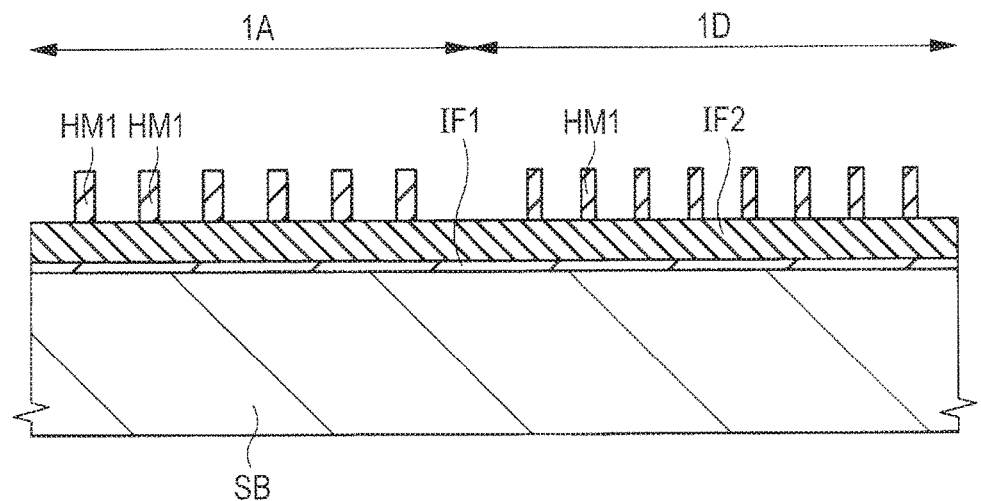
FIG. 15 is a sectional view along the Y direction of the semiconductor device shown in FIG. 14 during the manufacturing process thereof.

Subsequently, as illustrated in FIGS. 14 and 15, part of each hard mask HM1 is removed by etching using the photoresist film PR2 as a mask, and then the photoresist film PR2 is removed. Thus, the remaining hard mask HM1 includes only portions extending in the X direction. Specifically, a plurality of hard masks HM1 as patterns extending in the X direction are arranged side by side in the Y direction on the insulating film IF2.

Figure 16:
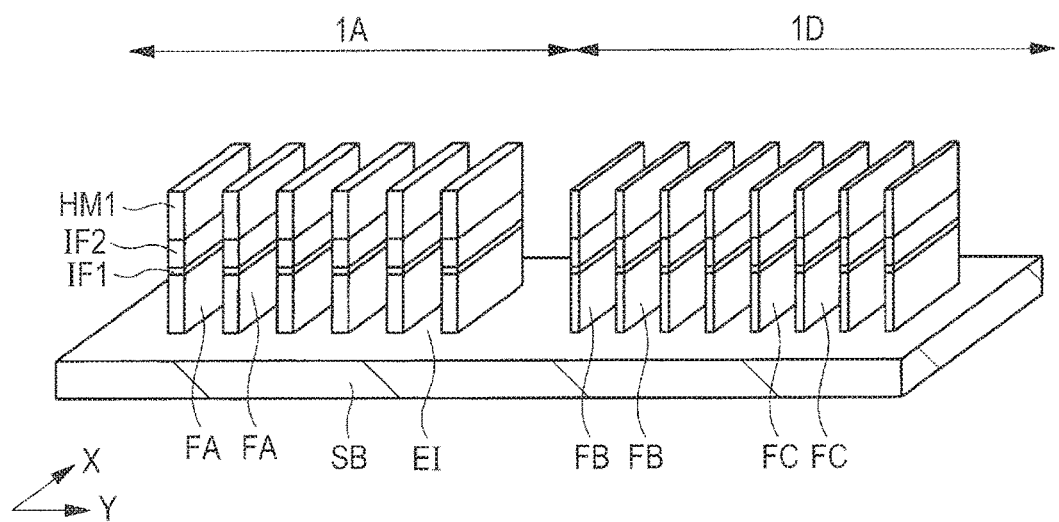
FIG. 16 is a perspective view explaining the manufacturing process of the semiconductor device following FIG. 15.
Figure 17:
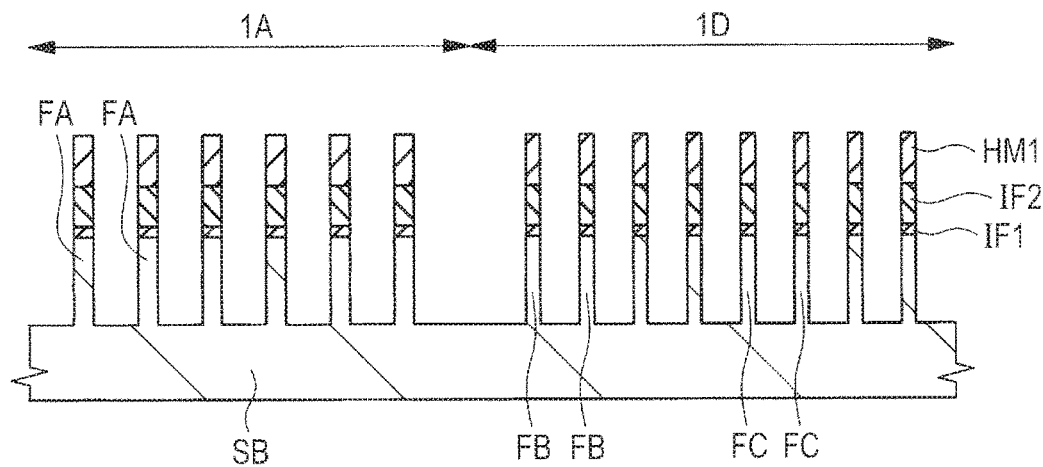
FIG. 17 is a sectional view along the Y direction of the semiconductor device shown in FIG. 16 during the manufacturing process thereof.

Subsequently, as illustrated in FIGS. 16 and 17, the insulating films IF2 and IF1 and the semiconductor substrate SB are subjected to anisotropic dry etching using the hard masks HM1 as a mask. Consequently, a pattern, which is part of the semiconductor substrate SB processed into a plate shape (wall shape), i.e., the fins FA, FB, and FC are formed. The semiconductor substrate SB in a region exposed from the hard mask HM1 is dug from its main surface by 100 to 250 nm herein, thereby the fins FA, FB and FC, each of which has a height of 100 to 250 nm from the main surface of the semiconductor substrate SB, can be formed.

Figure 18:
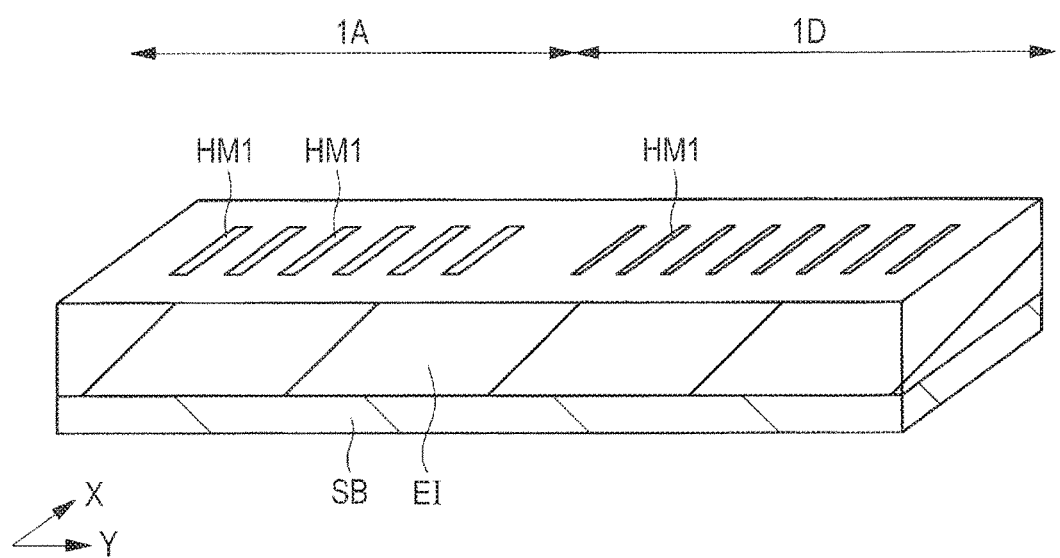
FIG. 18 is a perspective view explaining the manufacturing process of the semiconductor device following FIG. 17.
Figure 19:
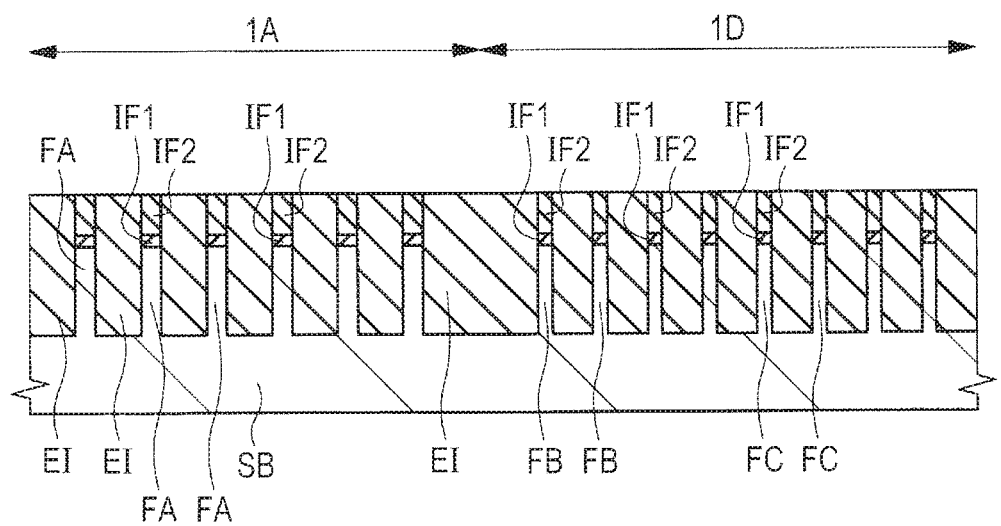
FIG. 19 is a sectional view along the Y direction of the semiconductor device shown in FIG. 18 during the manufacturing process thereof.

Subsequently, as illustrated in FIGS. 18 and 19, an insulating film including a silicon oxide film or the like is deposited on the semiconductor substrate SB so as to completely bury the fins FA, FB, FC, and the insulating films IF1 and IF2. Subsequently, the insulating film is polished by chemical mechanical polishing (CMP) process to expose the top of the insulating film IF2. This results in formation of the element isolation film EI including the insulating film. The hard mask HM 1 is removed by the CMP step. The hard masks HM1 may be removed before forming the insulating film configuring the element isolation film EI.

Figure 20:
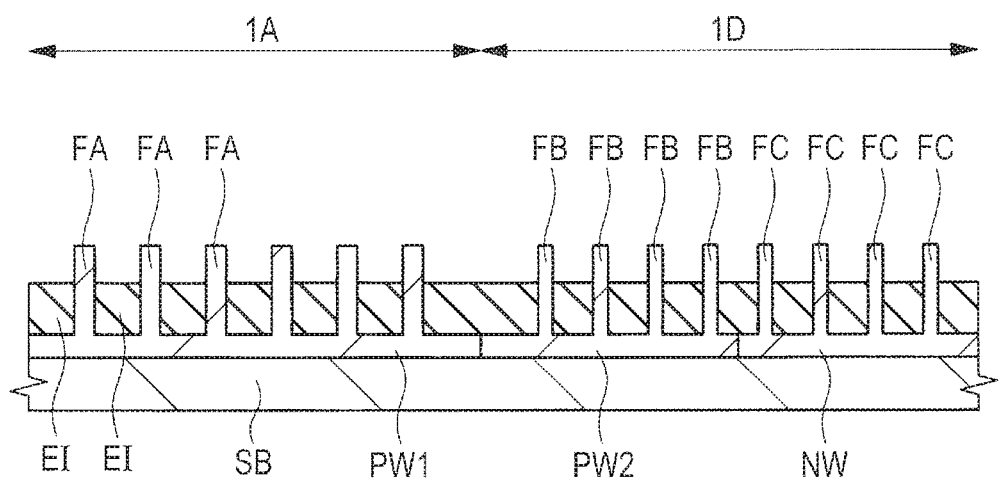
FIG. 20 is a sectional view explaining the manufacturing process of the semiconductor device following FIG. 19.

Subsequently, as illustrated in FIG. 20, the insulating films IF1 and IF2 are removed. Subsequently, the top of the element isolation film EI is etched so as to be retract (lowered) in a height direction. Consequently, part of the side face and the top of each of the fins FA, FB, and FC are exposed.

Subsequently, impurities are introduced into the main surface of the semiconductor substrate SB by an ion implantation process, thereby a p well PW1 is formed in the fin FA in the memory cell region 1A, a p well PW2 is formed in the fin FB in the logic region 1D, and an n well NW is formed in the fin FC in the logic region 1D. The p wells PW1 and PW2 are formed by implanting a p impurity (for example, boron (B)). The n well NW is formed by implanting an n impurity (for example, phosphorus (P) or arsenic (As)). Each well is formed within the entire fin while spreading over part of the semiconductor substrate SB under the fin.

Figure 21:
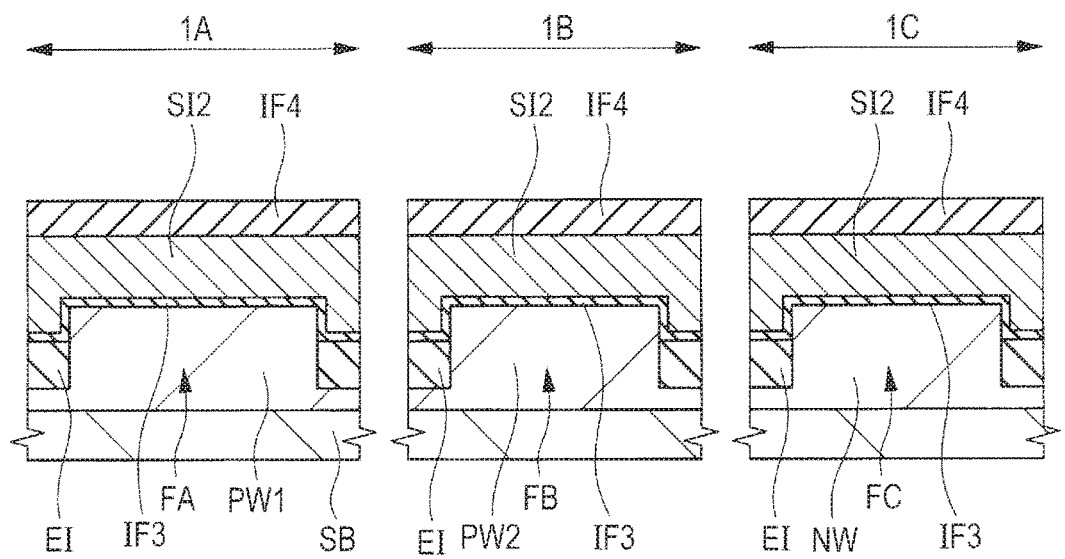
FIG. 21 is a sectional view explaining the manufacturing process of the semiconductor device following FIG. 20.

Subsequently, as illustrated in FIG. 21, an insulating film IF3 covering the tops and the sidewalls of the fins FA, FB, and FC is formed. The insulating film IF3 can be formed by, for example, a thermal oxidation process, and includes a silicon oxide film having a thickness of about 2 nm, for example. Subsequently, a semiconductor film SI2 having a thickness equal to or greater than the height of any of the fins FA, FB, and FC is deposited on the insulating film IF3 by a CVD process or the like, and a top of the semiconductor film SI2 is planarized by a CMP process or the like, thereby the semiconductor film SI2 having a flat top is formed. Subsequently, an insulating film IF4 is formed on the semiconductor film SI2 by a CVD process, for example. The semiconductor film SI2 includes, for example, a polysilicon film (silicon film), and the insulating film IF4 includes, for example, a silicon nitride film. The semiconductor film SI2 remains on the tops of the fins FA, FB, and FC even after the polishing step by the CMP process is performed on the semiconductor film SI2 as described above.

Figure 22:
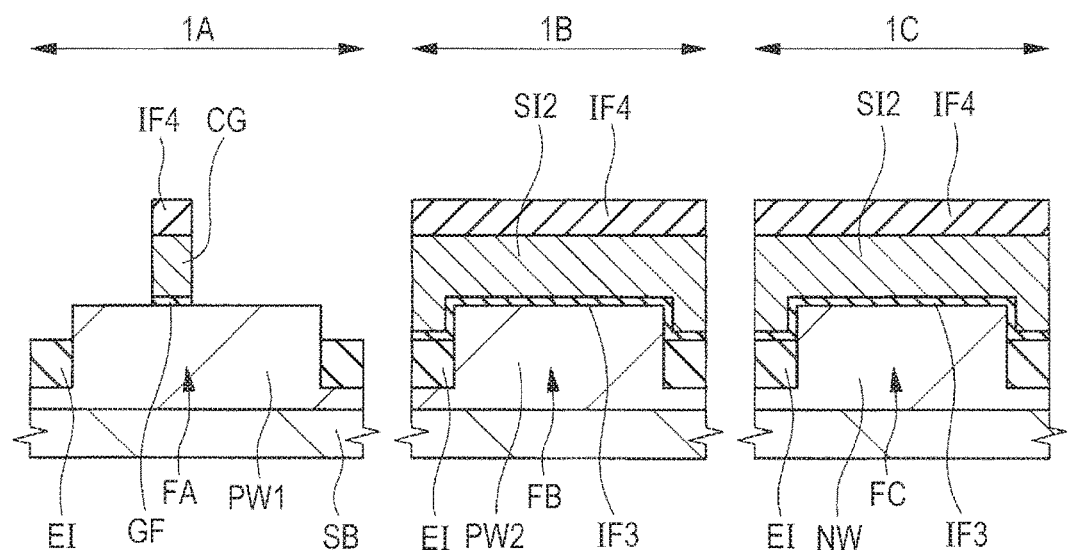
FIG. 22 is a sectional view explaining the manufacturing process of the semiconductor device following FIG. 21.

Subsequently, as illustrated in FIG. 22, an undepicted photoresist film is formed, the photoresist film covering just over part of the fin FA in the memory cell region 1A and covering the n-MIS region 1B and the p-MIS region 1C. The photoresist film includes a resist pattern extending in the Y direction in the memory cell region 1A, the resist pattern being formed so as to cover part of each of the fins FA arranged in the Y direction (depth direction in the drawing). The top of the fin FA is exposed from the photoresist film in a region beside the resist pattern.

Subsequently, part of the insulating film IF4 and part of the semiconductor film SI2 in the memory cell region 1A are removed by etching using the photoresist film as a mask to expose the top of the element isolation film EI and the surface of the insulating film IF3 in the memory cell region 1A. Specifically, part of each of the top and the sidewall of the fin FA is exposed from the insulating film IF4 and the semiconductor film SI2. Consequently, a control gate electrode CG including the semiconductor film SI2 is formed on the fin FA. Consequently, the gate insulating film GF including the insulating film IF3 is formed between the control gate electrode CG and the fin FA.

Although the insulating film IF3 covering the surface of the fin FA exposed from the control gate electrode CG is removed by the etching and a subsequent cleaning step and thus the surface of the fin FA is exposed in the case described herein, the top and the sidewall of the fin FA may be still covered with the insulating film IF3.

Figure 23:
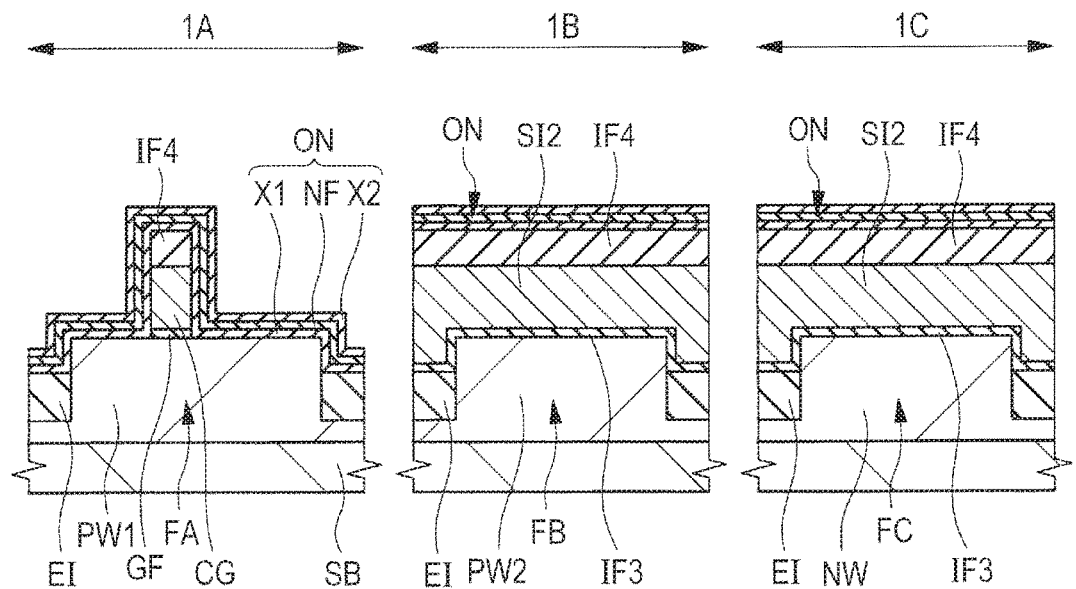
FIG. 23 is a sectional view explaining the manufacturing process of the semiconductor device following FIG. 22.

Subsequently, as illustrated in FIG. 23, a silicon oxide film (bottom oxide film) X1, a silicon nitride film NF, and a silicon oxide film (top oxide film) X2 are formed in order on the semiconductor substrate SB, thereby the insulating film ON having a stacked structure is formed, the stacked structure including the silicon oxide film X1, the silicon nitride film NF, and the silicon oxide film X2. That is, the insulating film ON is an oxide nitride oxide (ONO) film. The silicon oxide film X1 can be formed by an oxidation process, a CVD process, or the like. The silicon nitride film NF and the silicon oxide film X2 are formed (deposited) by a CVD process, for example.

The insulating film ON covers the top of the element isolation film EI as well as the top and the sidewall of the fin FA. The insulating film ON covers the top and a sidewall of the stacked pattern including the control gate electrode CG and the insulating film IF4. Although the silicon nitride film NF serves as a charge accumulating part (charge accumulating film) of a memory cell to be formed later, a high-k film including HfSiO or the like may be formed instead of the silicon nitride film NF. An aluminum oxide (A10) film may be formed instead of the silicon oxide film X2.

Figure 24:
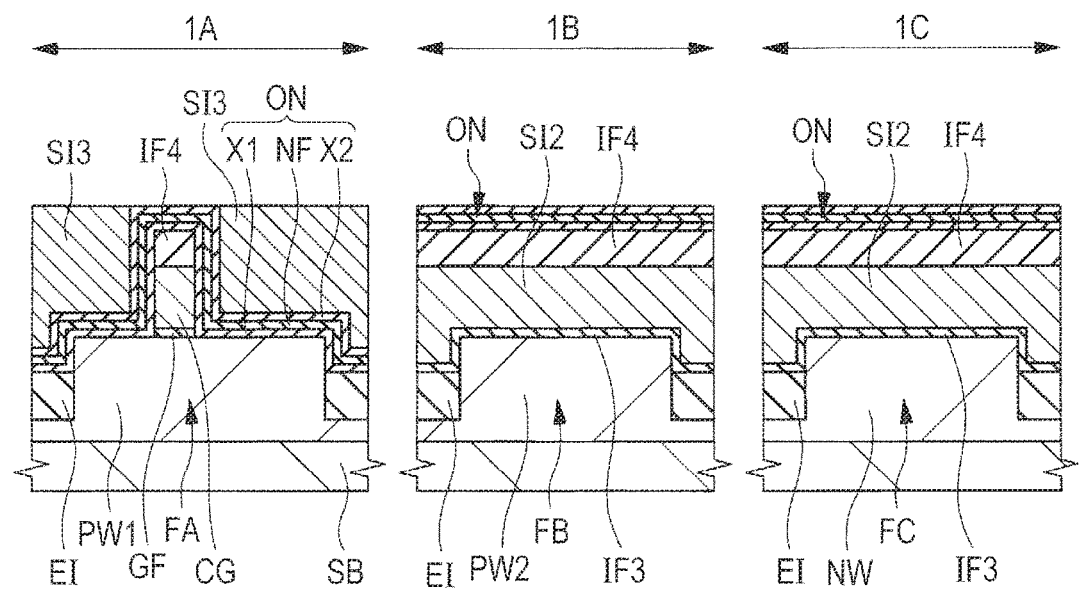
FIG. 24 is a sectional view explaining the manufacturing process of the semiconductor device following FIG. 23.

Subsequently, as illustrated in FIG. 24, a semiconductor film SI3 is formed on the semiconductor substrate SB by a CVD process, for example. The semiconductor film SI3 includes, for example, a polysilicon film and has a thickness larger than a height of a stacked body including the control gate electrode CG and the insulating film IF4. Subsequently, a top of the semiconductor film SI3 is polished by a CMP process to expose the top of the insulating film ON over the insulating film IF4.

Figure 25:
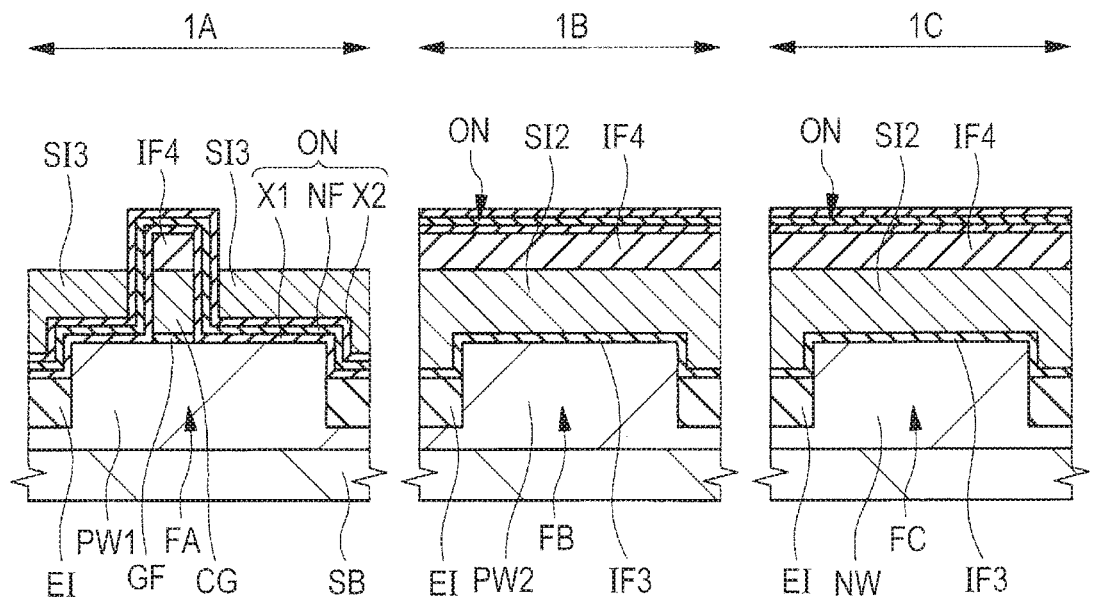
FIG. 25 is a sectional view explaining the manufacturing process of the semiconductor device following FIG. 24.

Subsequently, as illustrated in FIG. 25, the top of the semiconductor film SI3 is retracted through an etch-back step. Consequently, a position of the top of the semiconductor film SI3 becomes substantially equal in height to a position of the top of the control gate electrode CG, for example.

Figure 26:
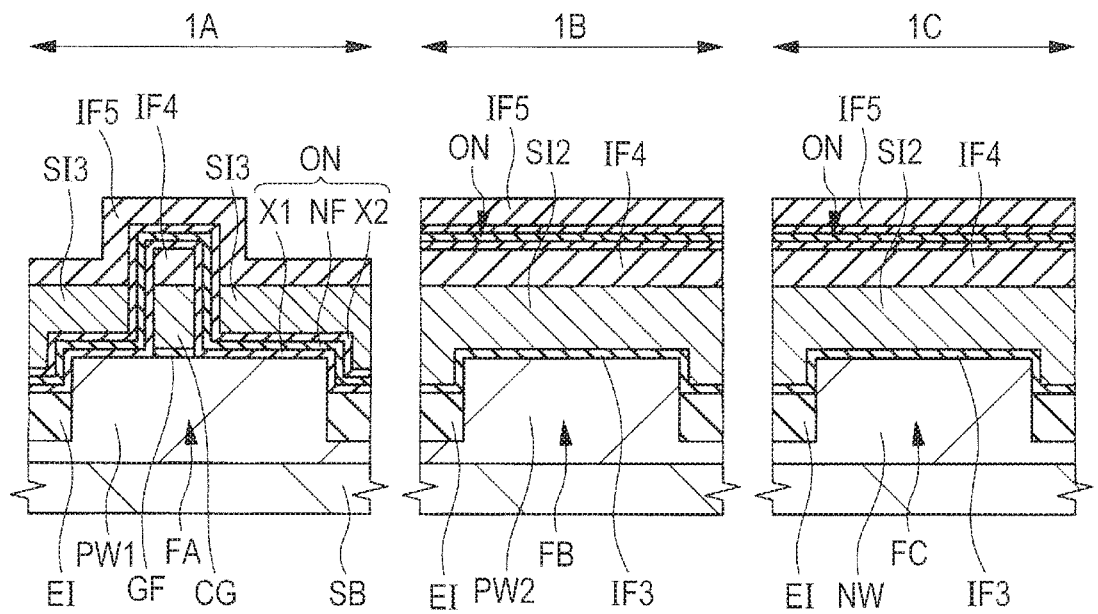
FIG. 26 is a sectional view explaining the manufacturing process of the semiconductor device following FIG. 25.

Subsequently, as illustrated in FIG. 26, an insulating film IF5 is formed on the semiconductor substrate SB by a CVD process, for example. The insulating film IF5 includes, for example, a silicon nitride film, and covers a sidewall and a top of the insulating film IF4 and a top of the semiconductor film SI3 with the insulating film ON in between.

Figure 27:
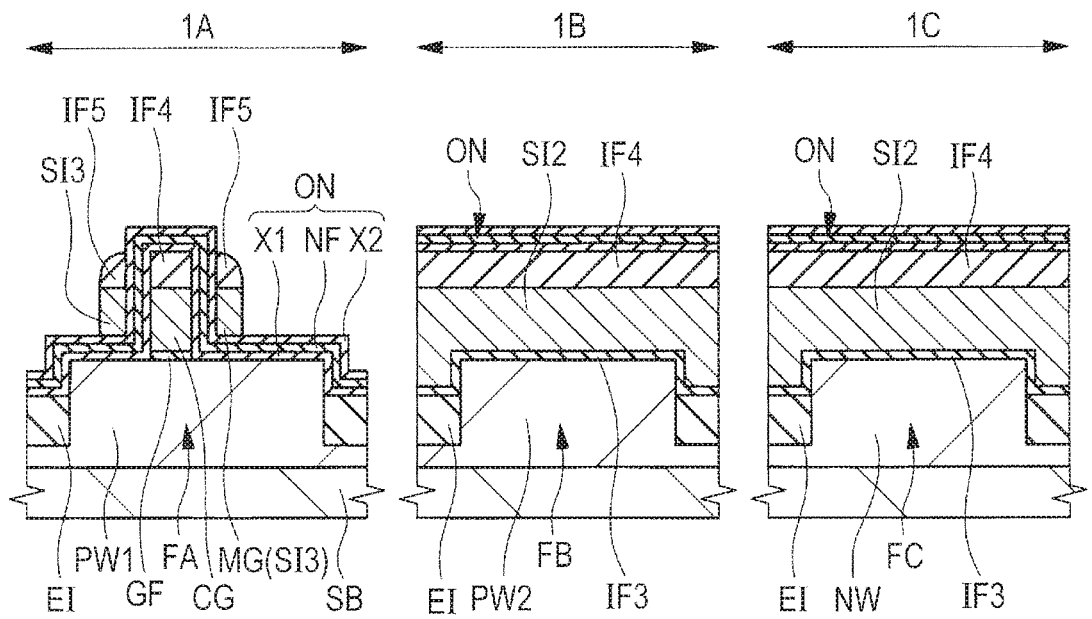
FIG. 27 is a sectional view explaining the manufacturing process of the semiconductor device following FIG. 26.

Subsequently, as illustrated in FIG. 27, part of the insulating film IF5 is removed by dry etching to expose the top of the insulating film ON and part of the top of the semiconductor film SI3. That is, the insulating film IF5 remains on the sidewall of the insulating film IF4 in a form of the Sidewall with the insulating film ON in between. Subsequently, the semiconductor film SI3 is processed through etching using the insulating film IF5 as a mask. Consequently, the semiconductor film SI3 remains in a region close to a sidewall on either side of the control gate electrode CG, and the top of the fin FA is exposed from the semiconductor film SI3 in a region other than the region close to the sidewall on either side of the control gate electrode CG.

The semiconductor film SI3 is close to one sidewall in the gate length direction (X direction) of the control gate electrode CG with the insulating film ON in between, and configures the memory gate electrode MG. The memory gate electrode MG extends in the Y direction so as to straddle the fins FA in parallel with the control gate electrode CG.

Figure 28:
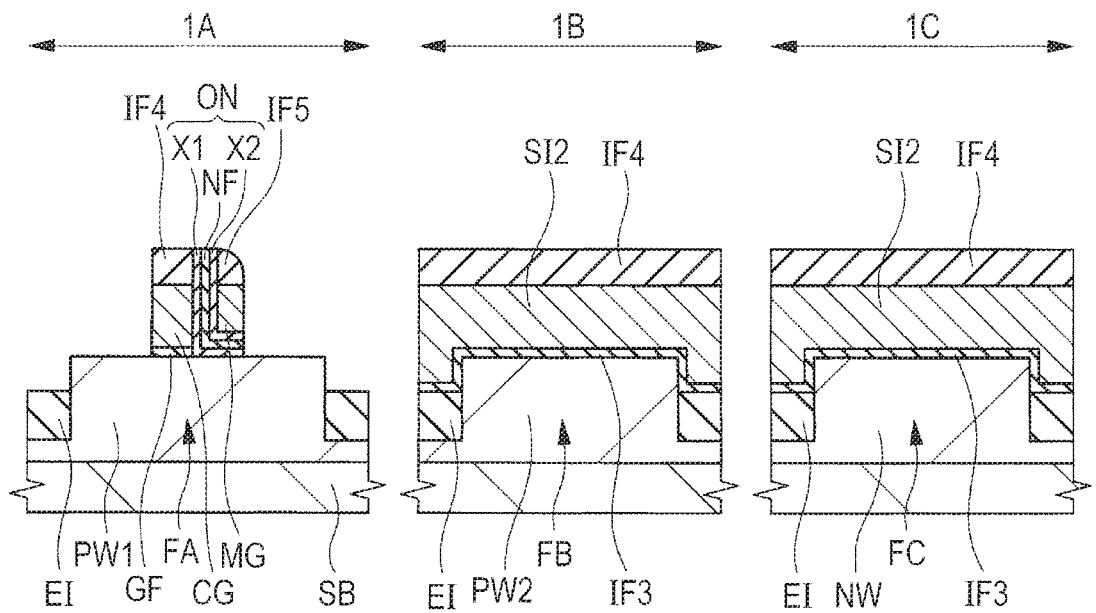
FIG. 28 is a sectional view explaining the manufacturing process of the semiconductor device following FIG. 27.

Subsequently, as illustrated in FIG. 28, an undepicted resist pattern, which covers the memory gate electrode MG and the insulating film IF5 just over the memory gate electrode MG, is formed, and then the insulating film IF5 and the semiconductor film SI3 exposed from the resist pattern are removed by etching using the resist pattern as a mask. Consequently, the memory gate electrode MG remains along the gate length direction on one sidewall of the control gate electrode CG with the insulating film ON in between, and the other side wall of the control gate electrode CG is exposed from the semiconductor film SI3 along the gate length direction.

Subsequently, a portion of the insulating film ON, which is not covered with the insulating film IF5 and the memory gate electrode MG, is removed by etching. This results in exposure of a top of the insulating film IF4, the top of the fin FA, the sidewall of the fin FA, and the top of the element isolation film EI. The further results in exposure of a sidewall portion of the insulating film IF4 and a sidewall portion of the control gate electrode CG, the portions being not covered with the memory gate electrode MG.

Figure 29:
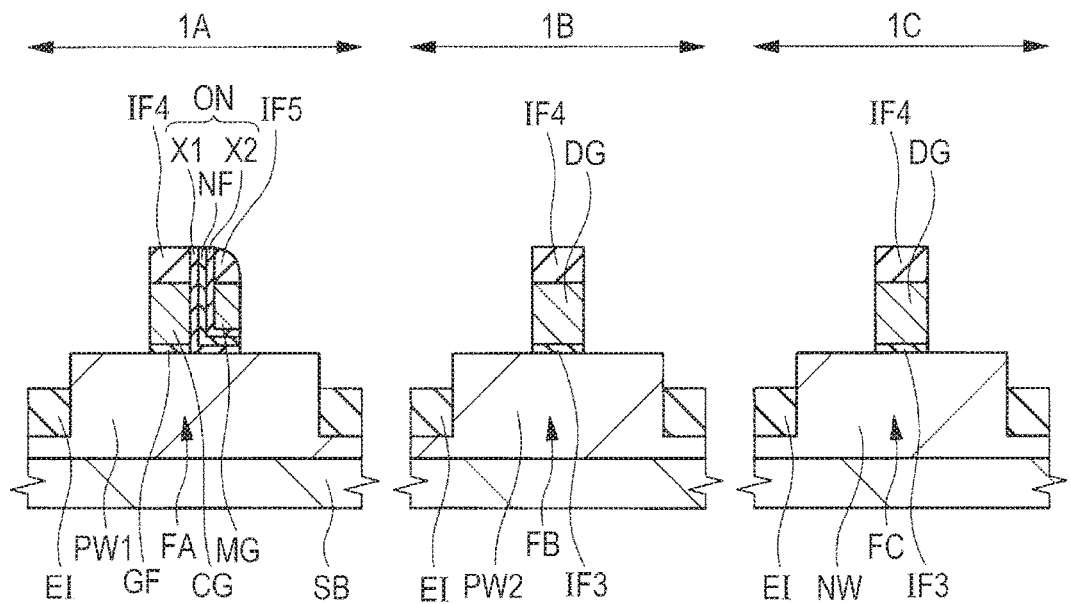
FIG. 29 is a sectional view explaining the manufacturing process of the semiconductor device following FIG. 28.

Subsequently, as illustrated in FIG. 29, an undepicted photoresist film is formed so as to cover the memory cell region 1A and just over part of each of the fins FB and FC in the n-MIS region 1B and the p-MIS region 1C. The photoresist film includes a resist pattern extending in the Y direction, which is formed so as to cover part of each of the fins FB arranged in the Y direction (the depth direction in the drawing), and a resist pattern extending in the Y direction, which is formed so as to cover part of each of the fins FC arranged in the Y direction. The top of each of the fins FB and FC is exposed from the photoresist film in the region beside the resist pattern.

Subsequently, etching is performed using the photoresist film as a mask to remove part of the insulating film IF4 and part of the semiconductor film SI2 in each of the n-MIS region 1B and the p-MIS region 1C, thereby the top of the element isolation film EI and the surface of the insulating film IF3 are exposed in each of the n-MIS region 1B and the p-MIS region 1C. That is, part of the top and part of the sidewall of each of the fins FB and FC are exposed from the insulating film IF4 and the semiconductor film SI2. Consequently, a dummy gate electrode DG including the semiconductor film SI2 is formed on each of the fins FB and FC with the insulating film IF3 in between.

The dummy gate electrode DG is a film which is removed in a later step and replaced with a metal gate electrode, and does not remain in a completed semiconductor device. That is, the dummy gate electrode DG is a pseudo gate electrode. In the case described herein, the insulating film IF3, which covers the surfaces of the fins FB and FC exposed from the dummy gate electrode DG, is removed. Subsequently, an undepicted silicon oxide film covering a sidewall of the dummy gate electrode DG is formed.

Figure 30:
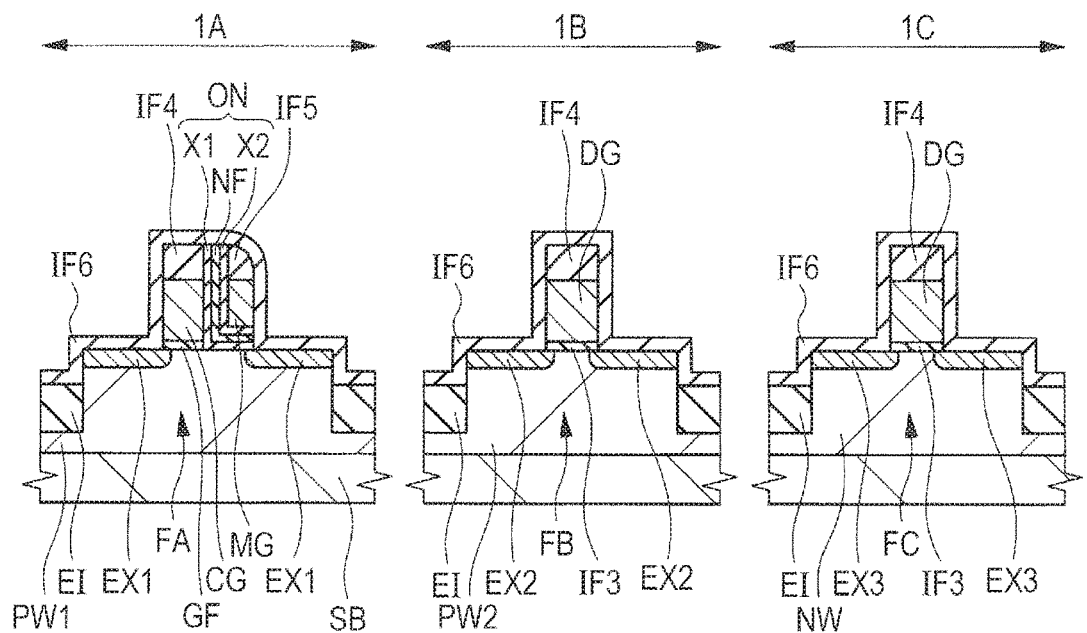
FIG. 30 is a sectional view explaining the manufacturing process of the semiconductor device following FIG. 29.

Subsequently, as illustrated in FIG. 30, the insulating films IF4 and IF5, the control gate electrode CG, the memory gate electrode MG, and the dummy gate electrode DG are used as masks to perform ion implantation on the respective upper surfaces of the fins FA, FB and FC. Consequently, a pair of extension regions EX1, each being an n semiconductor region, are formed in the upper surface of the fin FA. A pair of extension regions EX2, each being an n semiconductor region, are formed in the upper surface of the fin FB. A pair of extension regions EX3, each being a p semiconductor region, are formed in the upper surface of the fin FC.

At least the extension region EX3 is formed in a step different from the step of forming the extension region EX1 or EX2. The extension region EX1 or EX2 can be formed by implanting an n impurity (for example, phosphorus (P) or arsenic (As)). The extension region EX3 can be formed by implanting a p impurity (for example, boron (B)).

Subsequently, an insulating film IF6 is formed on the semiconductor substrate SB by a CVD process, for example. The insulating film IF6 includes, for example, a silicon nitride film. The insulating film IF6 covers the surfaces of the device isolation film EI, the fins FA, FB, and FC, the control gate electrode CG, the memory gate electrode MG, the dummy gate electrode DG, and the insulating films IF4 and IF5.

Figure 31:
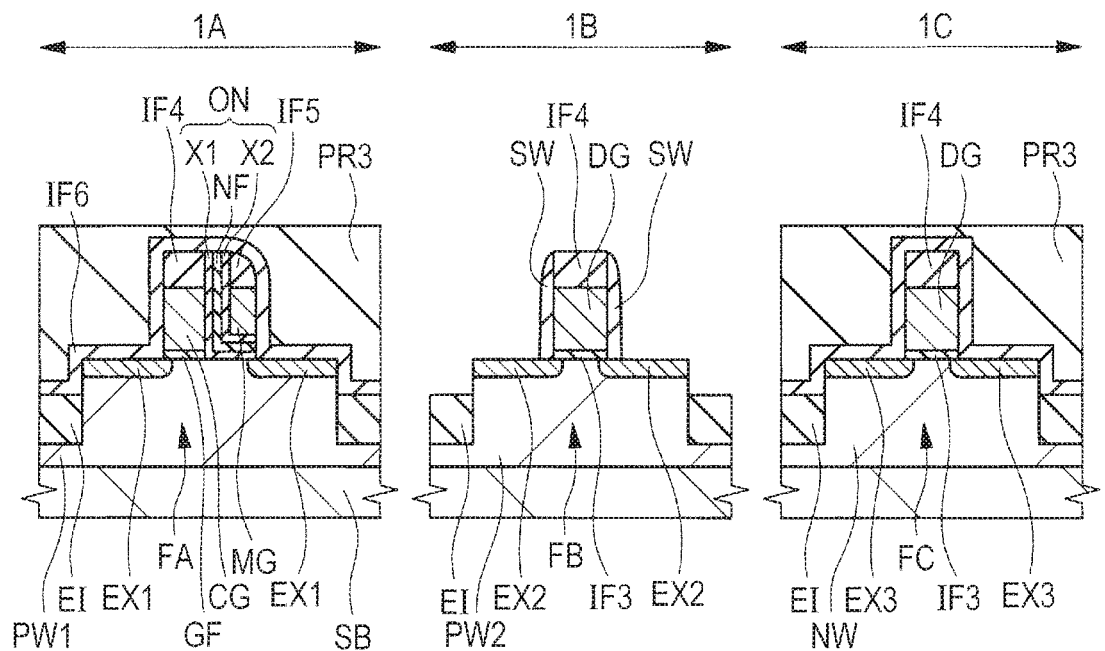
FIG. 31 is a sectional view explaining the manufacturing process of the semiconductor device following FIG. 30.

Subsequently, as illustrated in FIG. 31, a photoresist film PR3, which covers the memory cell region 1A and the p-MIS region 1C while exposing the n-MIS region 1B, is formed, and then dry etching is performed with the photoresist film PR 3 as a mask to remove part of the insulating film IF6 in the n-MIS region 1B, thereby the tops of the element isolation film EI, the fin FB, and the insulating film IF4 are exposed. The Sidewall SW including the insulating film IF6 is thus formed on a sidewall of a stacked body including the dummy gate electrode DG and the insulating film IF on the dummy gate electrode DG in the n-MIS region 1B.

At this time, Sidewall including the insulating film IF6 may be formed on the sidewall of the fin FB. The drawing, however, omits the Sidewall formed on the sidewall of the fin FB. When such a Sidewall is formed on the sidewall of the fin FA or FC in a later step, illustration of the Sidewall is omitted.

Figure 32:
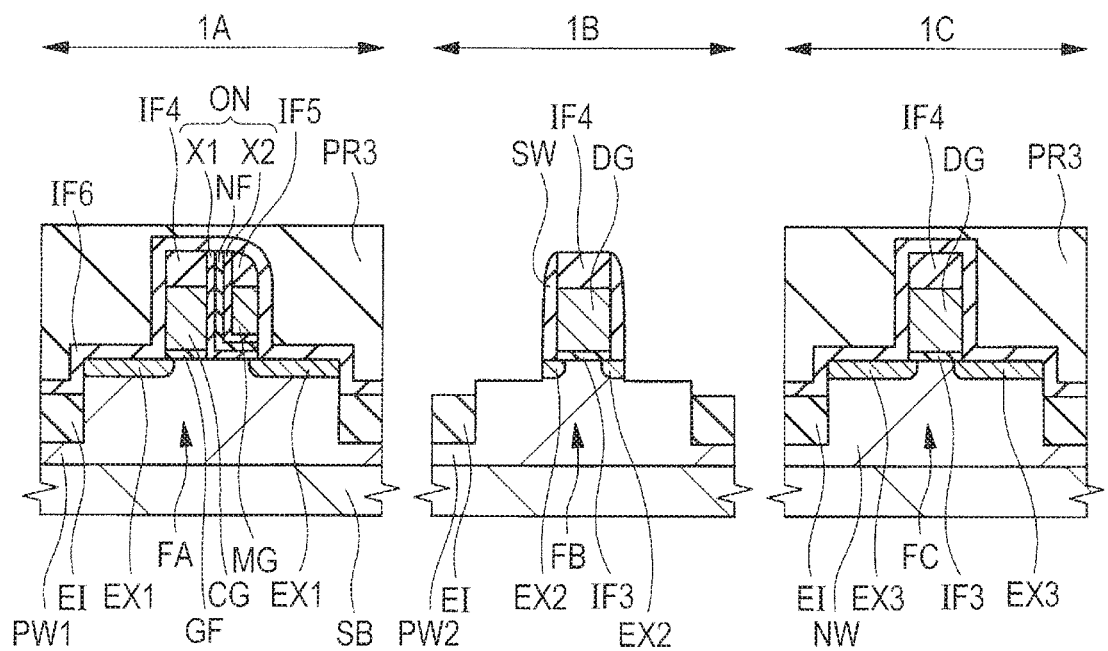
FIG. 32 is a sectional view explaining the manufacturing process of the semiconductor device following FIG. 31.

Subsequently, as illustrated in FIG. 32, dry etching is performed using a mask including the photoresist film PR3, the insulating film IF4, and the Sidewall SW, thereby the top of the fin FB, which is exposed beside a pattern including the dummy gate electrode DG and the Sidewall SW in the n-MIS region 1B, is retracted. Consequently, the top of the fin FB exposed from that pattern is retracted to a position higher than the top of the element isolation film EI and lower than the top of the fin FB just below the dummy gate electrode DG.

Figure 33:
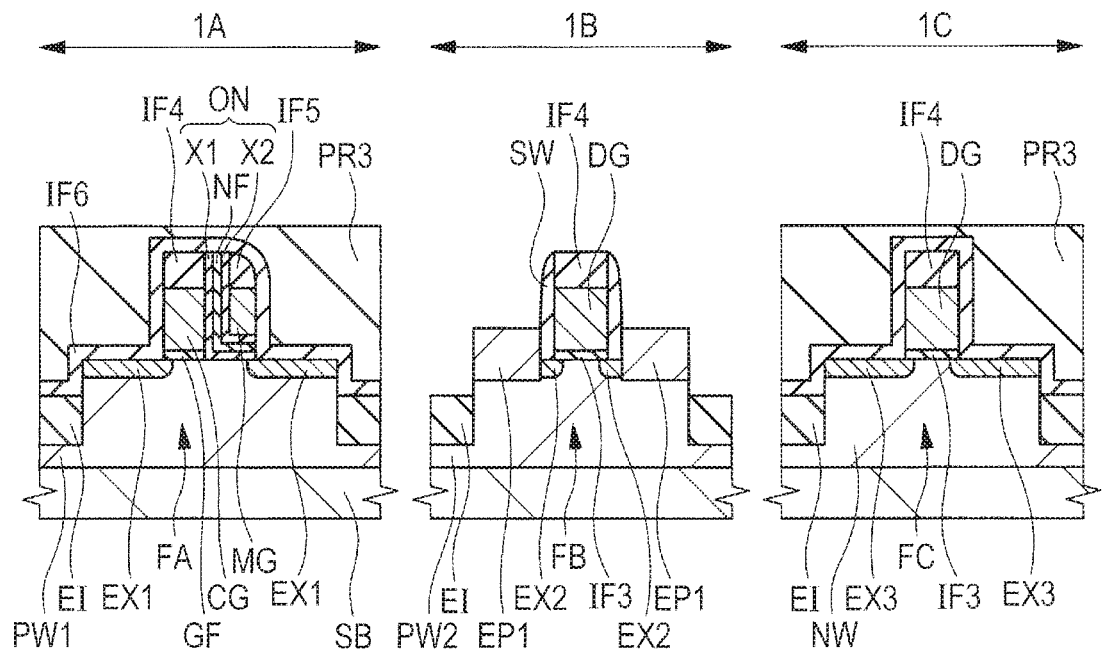
FIG. 33 is a sectional view explaining the manufacturing process of the semiconductor device following FIG. 32.

Subsequently, as illustrated in FIG. 33, an epitaxial growth process is used to form an epitaxial layer EP1 covering the top and the sidewall of the fin FB exposed beside the pattern including the dummy gate electrode DG and the Sidewall SW in the MIS region 1B. The epitaxial layer EP1 includes, for example, silicon (Si). Alternatively, an epitaxial layer EP1 including, for example, a silicon phosphate (SiP) or silicon carbide (SiC) film may be formed.

As described with reference to FIG. 5, the epitaxial layer EP1, which is a semiconductor layer having a rhombic sectional shape, covers the sidewall of the fin FB in the Y direction. The epitaxial layer EP1 may cover the sidewall of the fin FB in the X direction though it does not cover the sidewall in FIG. 33. When the sidewall of the fin FB in the X direction is covered with a silicon oxide film or the like, the sidewall is probably not covered with the epitaxial layer EP1.

Figure 34:
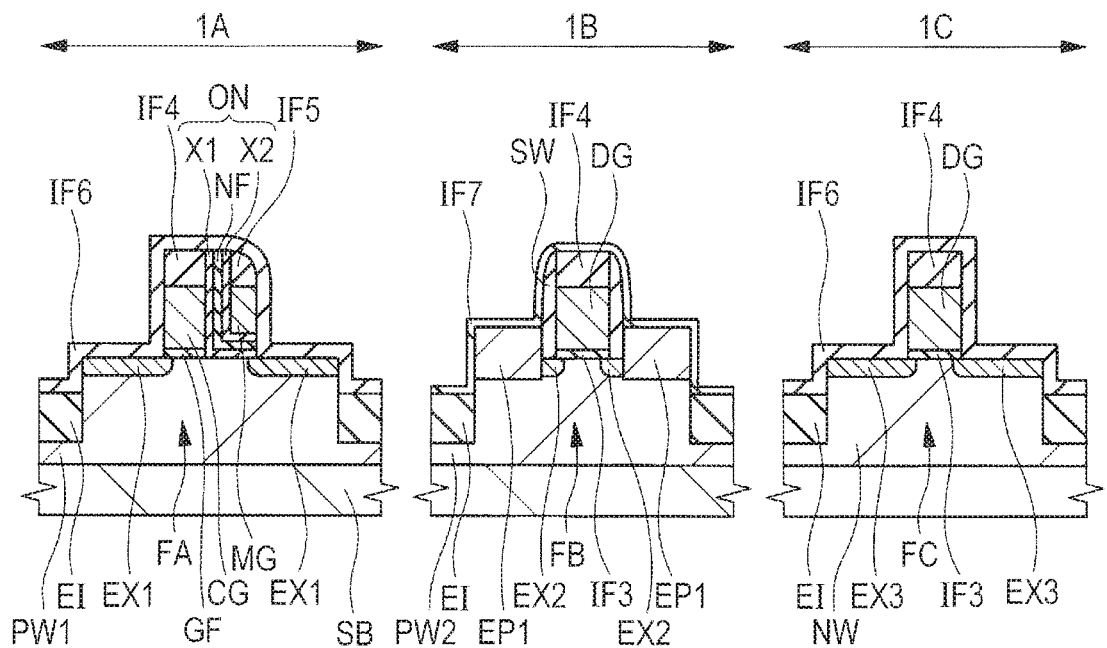
FIG. 34 is a sectional view explaining the manufacturing process of the semiconductor device following FIG. 33.

Subsequently, as illustrated in FIG. 34, the photoresist film PR3 is removed, and then an insulating film IF7 including, for example, a silicon nitride film is formed on the semiconductor substrate. The insulating film IF7 can be formed by a CVD process, for example. In the memory cell region 1A and the p-MIS region 1C, the insulating film IF7 is formed so as to cover the surface of the insulating film IF6. The drawing, however, omits the insulating film IF in each of the memory cell region 1A and the p-MIS region 1C assuming the insulating film IF7 is integrated with the insulating film IF6.

Figure 35:
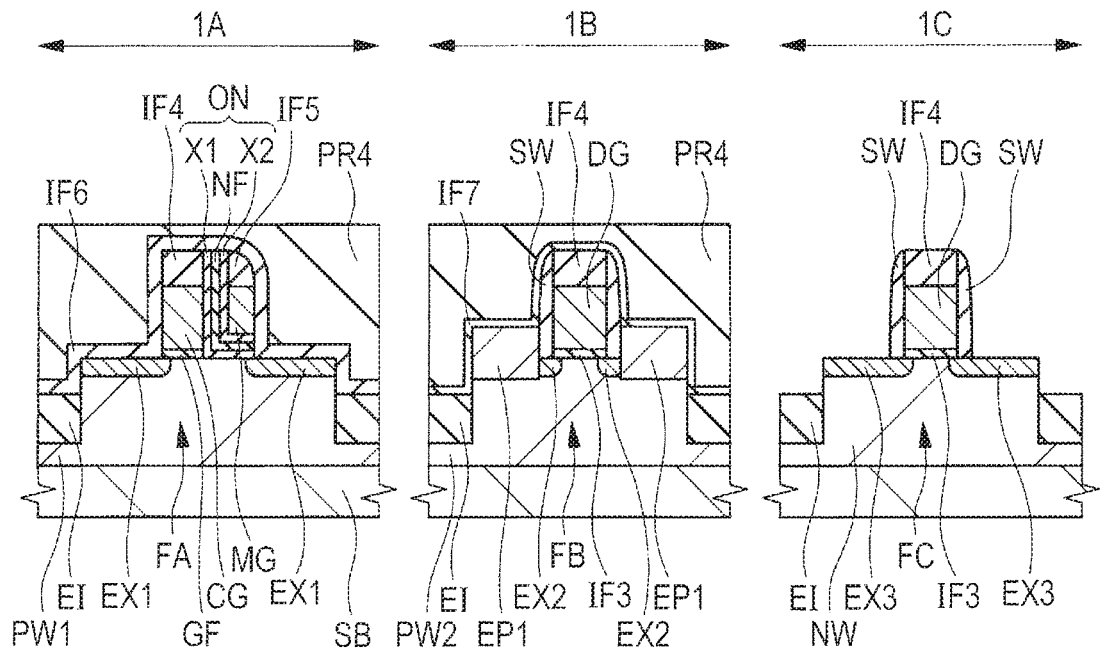
FIG. 35 is a sectional view explaining the manufacturing process of the semiconductor device following FIG. 34.

Subsequently, as illustrated in FIG. 35, the photoresist film PR4, which exposes the p-MIS region 1C and covers the memory cell region 1A and the n-MIS region 1B, is formed, and then part of the insulating film IF6 in the p-MIS region 1C is removed by dry etching using the photoresist film PR4 as a mask, thereby the respective tops of the element isolation film EI, the fin FC, and the insulating film IF4 are exposed. The Sidewall SW including the insulating film IF6 is thus formed on the sidewall of a stacked body including the dummy gate electrode DG and the insulating film IF4 on the dummy gate electrode DG in the p-MIS region 1C.

Figure 36:
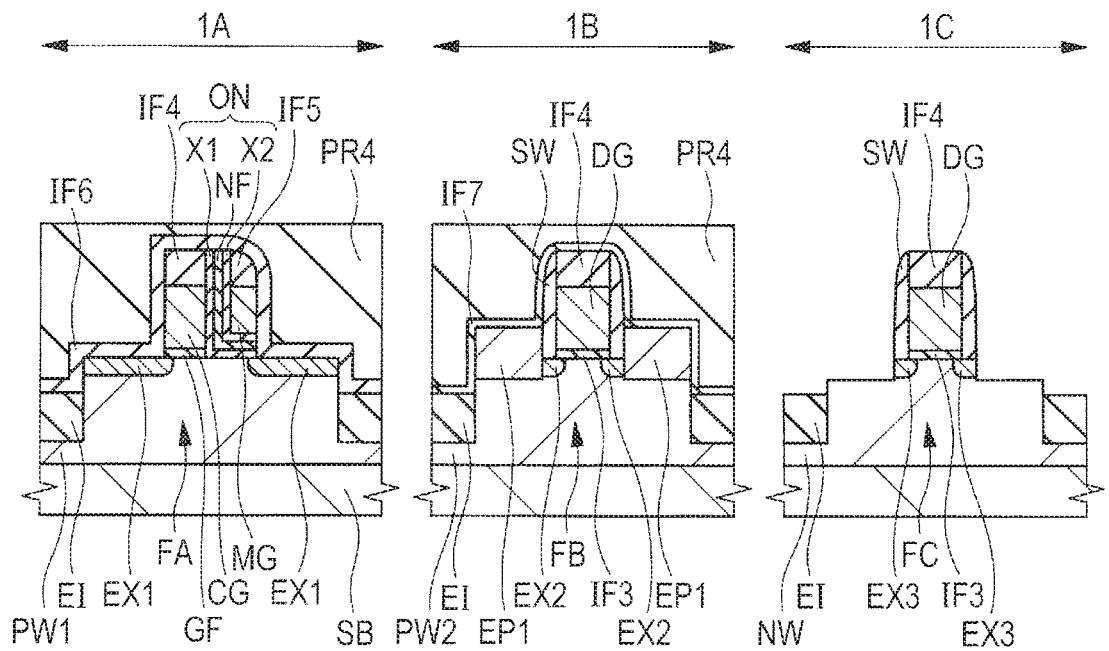
FIG. 36 is a sectional view explaining the manufacturing process of the semiconductor device following FIG. 35.

Subsequently, as illustrated in FIG. 36, dry etching is performed using a mask including the photoresist film PR4, the insulating film IF4, and the Sidewall SW to retract the top of the fin FC exposed beside a pattern including the dummy gate electrode DG and the Sidewall SW in the p-MIS region 1C. Consequently, the top of the fin FC exposed from the pattern is retracted to a position higher than the top of the element isolation film EI and lower than the top of the fin FC just below the dummy gate electrode DG.

Figure 37:
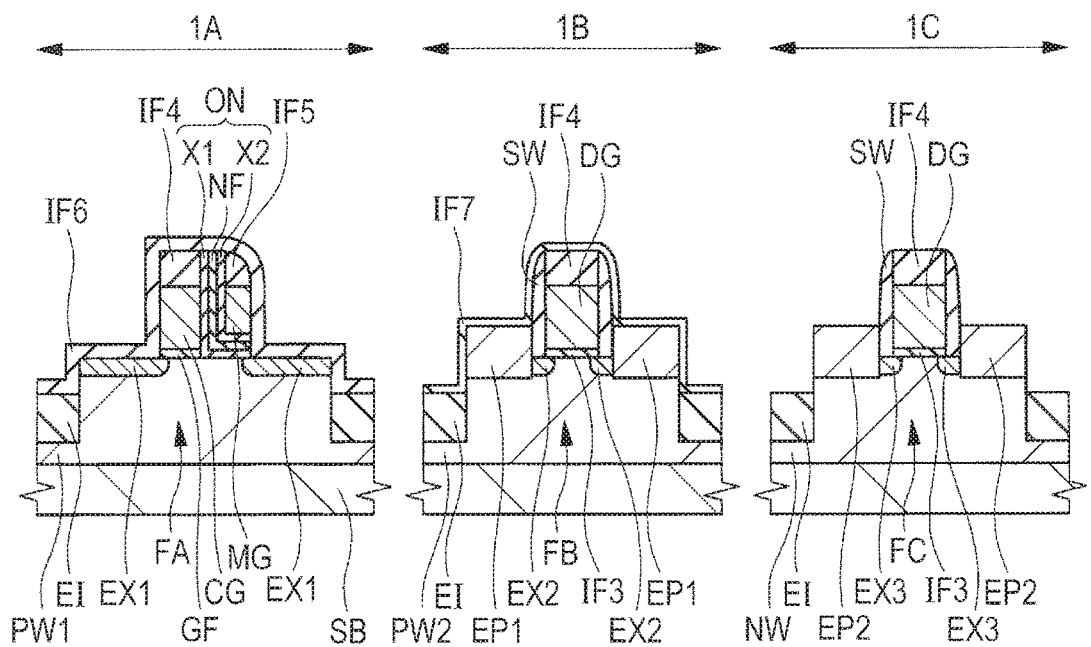
FIG. 37 is a sectional view explaining the manufacturing process of the semiconductor device following FIG. 36.

Subsequently, as illustrated in FIG. 37, an epitaxial layer EP2 is formed by an epitaxial growth process so as to cover the top and the sidewall of the fin FC exposed beside the pattern including the dummy gate electrode DG and the Sidewall SW in the p-MIS region 1C. The epitaxial layer EP2 includes, for example, silicon germanium (Site).

As described with reference to FIG. 5, the epitaxial layer EP2 is a semiconductor layer having a rhombic sectional shape and covering the sidewall of the fin FC in the Y direction. The sidewall of the fin FC may be covered in the X direction with the epitaxial layer EP2 while being not covered in FIG. 37. When the sidewall of the fin FC in the X direction is covered with a silicon oxide film or the like, the sidewall is probably not covered with the epitaxial layer EP2.

Figure 38:
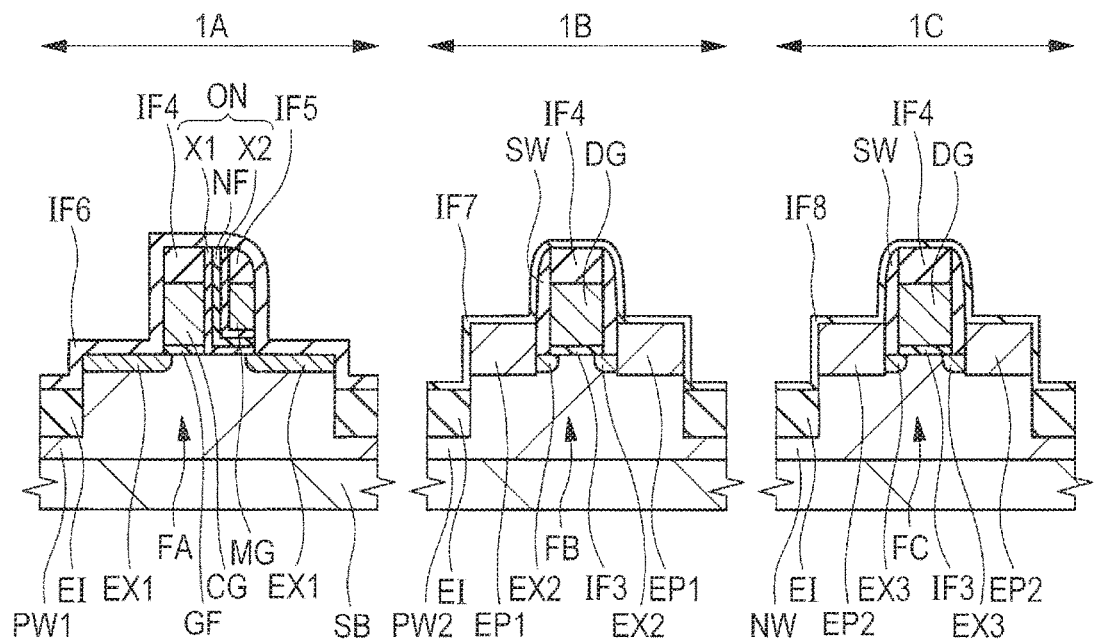
FIG. 38 is a sectional view explaining the manufacturing process of the semiconductor device following FIG. 37.

Subsequently, as illustrated in FIG. 38, the photoresist film PR4 is removed, and then an insulating film IF8 including, for example, a silicon nitride film is formed on the semiconductor substrate. The insulating film IF8 can be formed by a CVD process, for example. The insulating film IF8 is formed so as to cover the surface of the insulating film IF6 in the memory cell region 1A, and cover the surface of the insulating film IF7 in the n-MIS region 1B. The drawing, however, omits the insulating film IF8 in each of the memory cell region 1A and the n-MIS region 1B assuming the insulating film IF8 is integrated with the insulating film IF6 in the memory cell region 1A and with the insulating film IF7 in the n-MIS region 1B.

Subsequently, as illustrated in FIG. 39, a photoresist film PR5 is formed so as to cover the n-MIS region 1B and the p-MIS region 1C, but expose the memory cell region 1A. Subsequently, part of the insulating film IF6 in the memory cell region 1A is removed by dry etching using the photoresist film PR5 as a mask to expose the tops of the element isolation film EI, the fin FA, and the insulating films IF4 and IF5. The Sidewall SW including the insulating film IF6 is thus formed on the sidewall of a stacked body including the control gate electrode CG, the memory gate electrode MG, and the insulating films IF4 and IF5 in the memory cell region 1A.

Subsequently, as illustrated in FIG. 40, the photoresist film PR5 is removed, and then ion implantation is performed on the tops of the fins FA, FB, and FC with a mask including the insulating films IF4 and IF5, the dummy gate electrode DG, the control gate electrode CG, the memory gate electrode MG, and the Sidewall SW. Consequently, a pair of diffusion regions D1 each being an n semiconductor region are formed on the top of the fin FA. A pair of diffusion regions D2 each being an n semiconductor region are formed on the top of the fin FB. A pair of diffusion regions D3 each being a p semiconductor region are formed on the top of the fin FC. The impurity is implanted into the respective fins FB and FC through the insulating films IF7 and IF8 in the n-MIS region 1B and the p-MIS region 1C.

At least the diffusion region D3 is formed in a step different from the step of forming each of the diffusion regions D1 and D2. The diffusion regions D1 and D2 can each be formed by implanting an n impurity (for example, phosphorus (P) or arsenic (As)). The diffusion region D3 can be formed by implanting a p impurity (for example, boron (B)). In the respective formation steps of the diffusion regions D1 and D2, ion implantation is performed with impurity concentrations higher than those in the ion implantation steps in formation of the extension regions EX1 and EX2. In the formation step of the diffusion region D3, ion implantation is performed with an impurity concentration higher than that in the ion implantation step in formation of the extension region EX3.

This results in formation of a source/drain region including the diffusion region D1 and the extension region EX1, a source/drain region including the diffusion region D2 and the extension region EX2, and a source/drain region including the diffusion region D3 and the extension region EX3. In such ion implantation steps, the diffusion region D2 is formed in the epitaxial layer EP1 and in the fin FB below the epitaxial layer EP1. The diffusion region D3 is formed in the epitaxial layer EP2 and in the fin FC below the epitaxial layer EP2.

In the memory cell region 1A, the source/drain region and the control gate electrode CG configure a control transistor, while the source/drain region and the memory gate electrode MG configure a memory transistor. The control transistor and the memory transistor configure a memory cell MC.

Although the diffusion regions D1 to D3 are formed after formation of the epitaxial layers EP1 and EP2 herein, the diffusion region D2 may be formed after formation of the Sidewall SW as described with reference to FIG. 31 and before the etching step described with reference to FIG. 32, for example. The diffusion region D3 may be formed after formation of the Sidewall SW as described with reference to FIG. 35 and before the etching step as described with reference to FIG. 36, for example.

Figure 42:
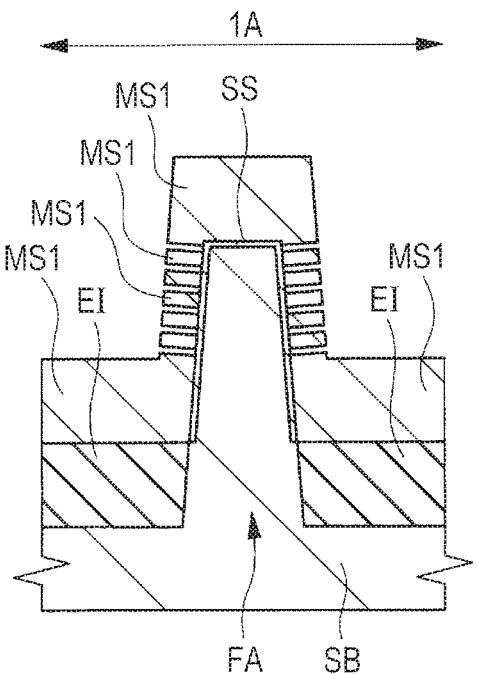
FIG. 42 is a sectional view explaining the manufacturing process of the semiconductor device following FIG. 40.

Subsequently, a silicide layer is formed so as to cover the source/drain region formed in the fin FA in the memory cell region. First, as illustrated in FIG. 42, a metal film MS1 is formed so as to cover the fin FA with a sputtering apparatus SD illustrated in FIG. 41. The sputtering apparatus SD illustrated in FIG. 41 has a load port LP, chambers CH1 to CH5, and robot arms RA1 and RA2, and can be sealed for each of the chambers CH1 to CH5. The insides of the chambers CH1 to CH5 and the insides of transfer chambers, in which the respective robot arms RA1 and RA2 are disposed, can each be maintained at a desired atmospheric pressure and a desired temperature by using a vacuum pump or the like.

For formation of the metal film MS1, first, a semiconductor substrate (semiconductor wafer) having the memory cell MC (see FIG. 40) and the like is disposed in the load port LP that connects the sputtering apparatus SD to the outside thereof. Subsequently, the semiconductor wafer within the load port LP is transferred through the transfer chamber by the robot arm RA1, and placed within the chamber CH2 being a pretreatment chamber, and cleaned in the chamber CH2. At this time, a native oxide film formed on the surface of the fin FA (see FIG. 40) is removed, and the top and the sidewall of the fin FA are exposed. Subsequently, the semiconductor wafer is transferred into the chamber CH3 by the robot arm RA1.

Subsequently, the semiconductor wafer is transferred from within the chamber CH3 into the chamber (heat treatment chamber) CH4 by the robot arm RA2, and is subjected to heat treatment in the chamber CH4. The heat treatment is a rapid thermal annealing (RTA) performed at 200° C. for 90 sec, for example. Subsequently, the heated semiconductor wafer is transferred from within the chamber CH4 into the chamber (film formation chamber) CH5 by the robot arm RA2. Subsequently, a metal film MS1 (see FIG. 42) including NiPt is deposited on the main surface of the semiconductor wafer (semiconductor substrate) by a sputtering process in the chamber CH5.

Such deposition by the sputtering process also starts in the chamber CH4 within 30 to 60 sec after the heat treatment step is finished. A vacuum is maintained in each of the chambers CH4 and CH5 and in the transfer chamber having the robot arm RA2 disposed therein. That is, the semiconductor wafer can be transferred from within the chamber CH4 into the chamber CH5 while the vacuum atmosphere is maintained. It is therefore possible to prevent lowering of temperature of the semiconductor wafer during transfer of the semiconductor wafer from within the chamber CH4 into the chamber CH5. Specifically, the heat-treated semiconductor wafer is transferred in a short time before start of the deposition, thereby the sputtering can be performed before lowering of the temperature (for example, 200° C.) of the semiconductor wafer heated by the heat treatment.

As illustrated in FIG. 42, when the metal film MS1 is formed on the high-temperature semiconductor substrate SB by a sputtering process, part of the surface of the high-temperature fin FA reacts with part of the metal film MS1 and thus a thin silicide layer SS is formed so as to cover the sidewall and the top of the fin FA. The silicide layer SS includes, for example, nickel silicide (NiSi) and platinum (Pt). That is, the silicide layer SS is a NiPt silicide layer.

At this time, the metal film MS1 does not continuously cover the sidewall and the top of the fin FA, but covers the fin FA while being split into a plurality of films. Specifically, the entire top of the fin FA and the entire top of the element isolation film EI are covered with the metal film MS1, while the sidewall of the fin FA is partially covered with a plurality of columnar metal films MS1 extending in a direction perpendicular to the sidewall. That is, the metal film MS1 covering the sidewall is configured by a plurality of films (patterns) arranged side by side apart from one another in the direction along the sidewall.

The reason why the metal film MS1 formed on the sidewall of the fin FA has a columnar shape is that the metal film MS1 formed by the sputtering process is less likely to be formed on the surface, which is formed at an angle close to perpendicular to the main surface of the semiconductor substrate SB, such as the sidewall of the fin FA, and that the sidewall of the fin FA is covered with the silicide layer SS. Since the columnar metal films MS1 formed on the sidewall of the fin FA are spaced apart from one another, even if the metal film MS1 has stress, the fin FA can be prevented from being affected by the stress.

In the sputtering step, the metal film MS1 having a thickness of, for example, 60 nm is formed on the top of the fin FA and on the top of the element isolation film EI. As described above, since the metal film MS1 is poor in coating performance on the sidewall of the fin FA, i.e., poor in coverage, thickness of the metal film MS1, which is formed in contact with the sidewall of the fin FA, is smaller than the thickness (for example, 60 nm) of the metal film MS1 on the fin FA. The metal film MS1 is formed with a thickness necessary for forming a silicide layer S1 described later with a desired thickness on the sidewall and the top of the fin FA.

Figure 43:
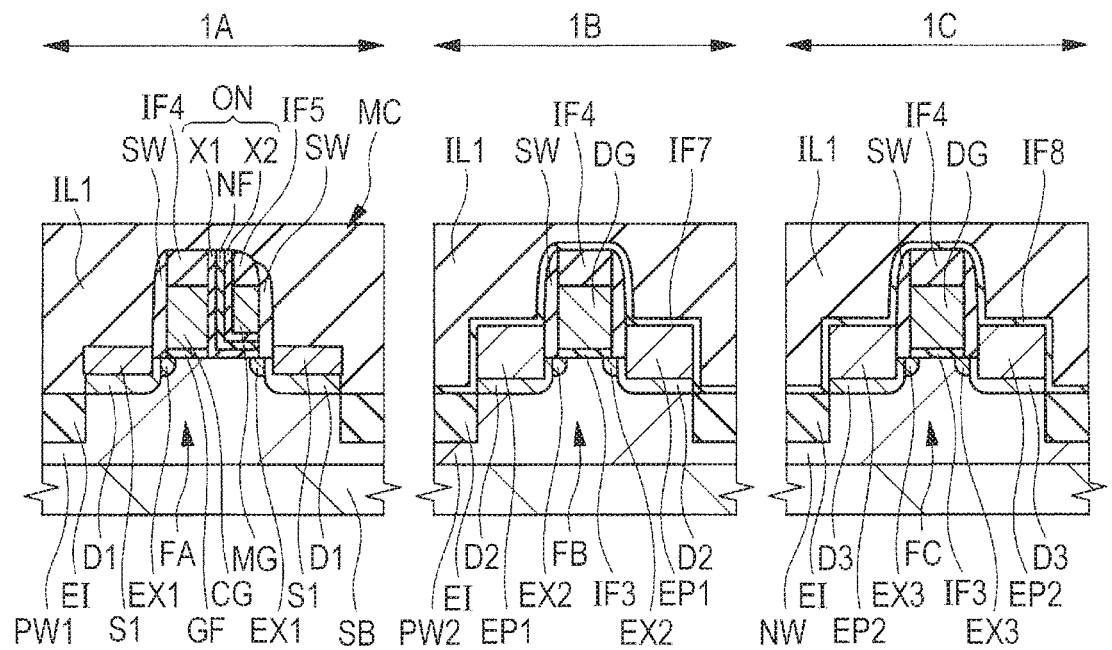
FIG. 43 is a sectional view explaining the manufacturing process of the semiconductor device following FIG. 42.
Figure 44:
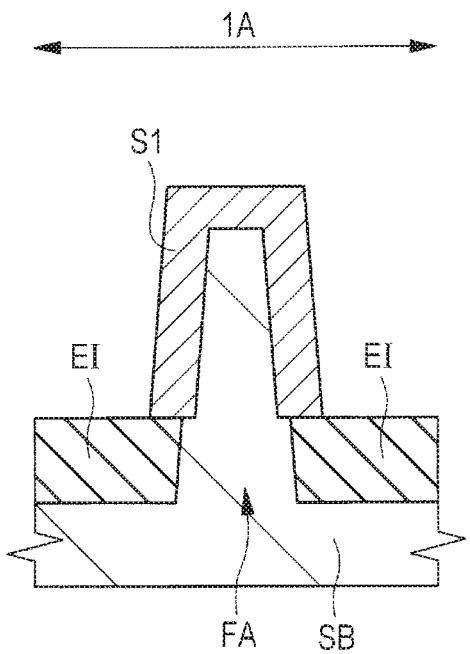
FIG. 44 is a sectional view explaining the manufacturing process of the semiconductor device following FIG. 43.

Subsequently, as illustrated in FIGS. 43 and 44, heat treatment is performed two times, thereby the silicide layer S1 is formed so as to cover the sidewall and the top of the fin FA. Specifically, in the first heat treatment, RTA is performed at 260° C. for 11 to 35 sec, thereby the metal film MS1 is reacted with the top and the sidewall of the fin FA, and thus the silicide layer S1 mainly containing di-nickel silicide ($Ni_2Si$) is formed. The thickness of the silicide layer S1 can be adjusted by controlling time of the first heat treatment. Subsequently, the unreacted metal film MS1 is removed using a chemical solution, and then RTA is performed at 500° C. for 11 sec as the second heat treatment. Consequently, the silicide layer S1 has a main composition including mono-nickel silicide (NiSi), and the resistance of the silicide layer S1 becomes lower than that before the second heat treatment. FIG. 44 is a sectional view of the fin FA at the same position as in FIG. 42.

The thickness of the silicide layer S1 along the sidewall of the fin FA is substantially equal to the thickness of the silicide layer S1 along the top of the fin FA. In the n-MIS region 1B and the p-MIS region 1C, since the fins FB and FC or the epitaxial layers EP1 and EP2 are covered with the insulating films (protective films) IF7 and IF8, respectively, even if the metal film MS1 is deposited over each of the insulating films IF7 and IF8 and is then subjected to heat treatment, the surfaces of the fins FB and FC and the epitaxial layers EP1 and EP2 are each not formed into a silicide. The position of the uppermost surface of the silicide layer S1 is lower than the position of the uppermost surface of each of the epitaxial layers EP1 and EP2.

The silicide layer S1 is formed by reacting the columnar metal films MS1, which are arranged along the sidewall of the fin FA, with the sidewall of the fin FA. At this time, only a small space exists between the metal films MS1 adjacent in a direction along the sidewall is small. In addition, the silicide layer S1 expands in both the vertical and horizontal directions during the first heat treatment. Hence, the silicide layer S1 is formed while continuously covering the sidewall.

Subsequently, an undepicted liner film including, for example, a silicon nitride film and the interlayer insulating film IL1 including a silicon oxide film are formed in order on the main surface of the semiconductor substrate SB. The liner film and the interlayer insulating film IL1 can each be formed by, for example, a CVD process. The interlayer insulating film IL1 has a thickness larger than the total of the height of the fin FA on the element isolation film EI and the height of the stacked body including the control gate electrode CG and the insulating film IF4. Subsequently, a top of the interlayer insulating film IL1 is planarized by a CMP process, for example.

Figure 45:
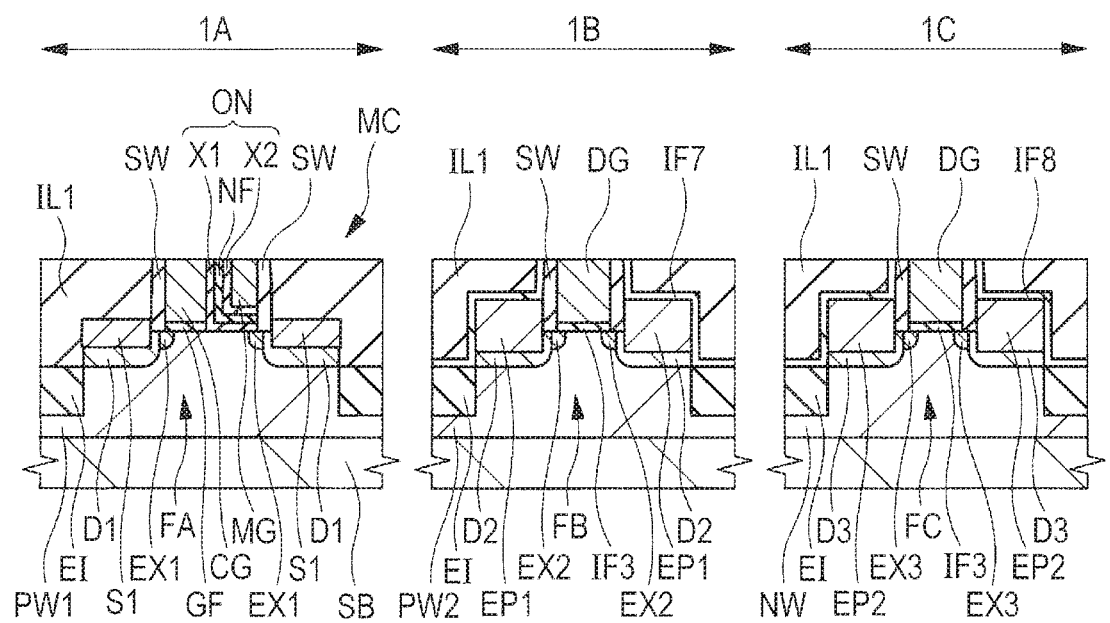
FIG. 45 is a sectional view explaining the manufacturing process of the semiconductor device following FIG. 44.

Subsequently, as illustrated in FIG. 45, the top of the interlayer insulating film IL1, the insulating films IF4 and IF5, and the Sidewall SW are polished by, for example, a CMP process, thereby a top of the dummy gate electrode DG in each of the n-MIS region 1B and the p-MIS region 1C is exposed. Consequently, since the insulating films IF4 and IF5 are removed, the tops of the control gate electrode CG and the memory gate electrode MG are also exposed.

Figure 46:
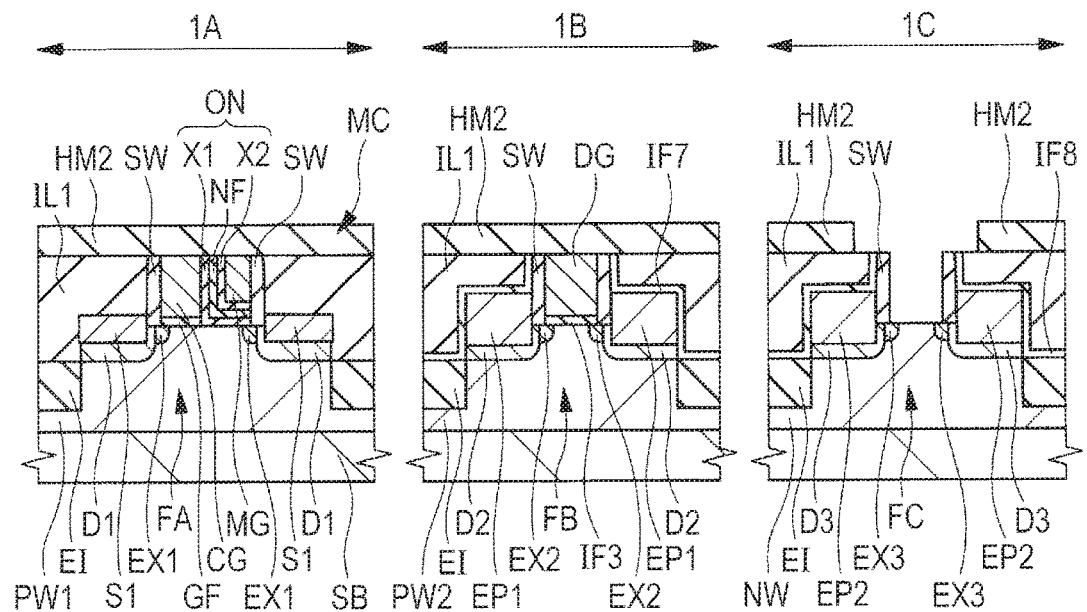
FIG. 46 is a sectional view explaining the manufacturing process of the semiconductor device following FIG. 45.

In a subsequent step, as illustrated in FIG. 46, the exposed dummy gate electrode DG in the p-MIS region 1C is removed. Specifically, the hard mask HM2 is formed on the semiconductor substrate SB by, for example, a CVD process, and then the hard mask HM2 in the p-MIS region 1C is removed by a photolithography technique and an etching process to expose the dummy gate electrode DG in the p-MIS region 1C. The hard mask HM2 includes, for example, a silicon oxide film or a titanium nitride (TiN) film, and the gate electrode in each of the n-MIS region 1B and the memory cell region 1A is covered with the hard mask HM2.

Subsequently, the dummy gate electrode DG exposed from the hard mask HM2 is removed by wet etching. Although the insulating film IF3 below the dummy gate electrode DG is also removed herein, the insulating film IF3 may be left. After the insulating film IF3 is removed, an insulating film may be formed so as to cover a bottom of a trench formed by removing the dummy gate electrode DG.

Figure 47:
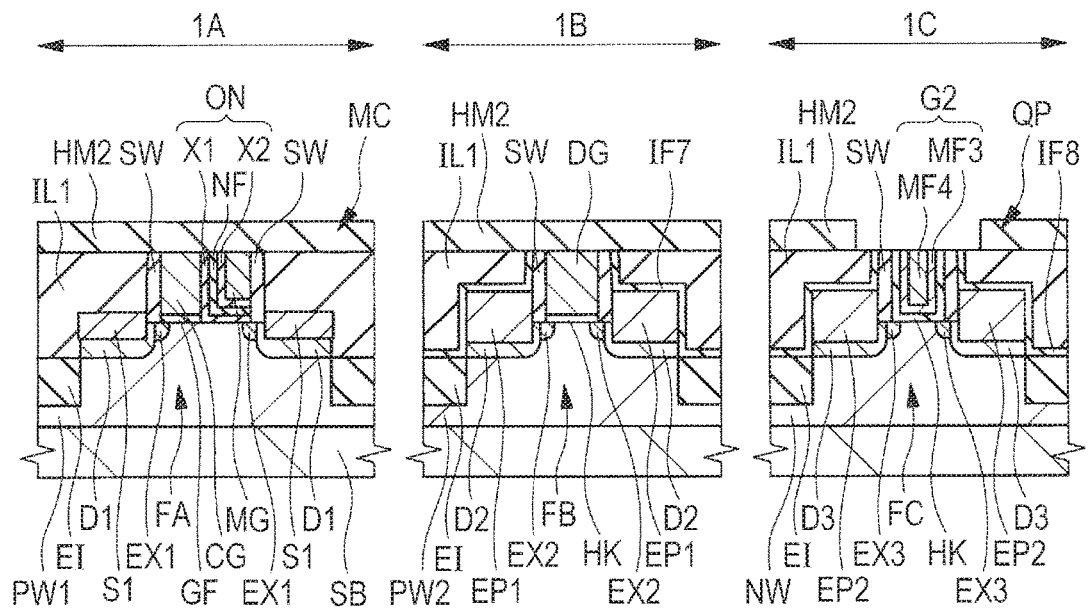
FIG. 47 is a sectional view explaining the manufacturing process of the semiconductor device following FIG. 46.

Subsequently, as illustrated in FIG. 47, the insulating film HK as a gate insulating film and the gate electrode G2 as a metal gate electrode are formed in the trench. Specifically, first, the insulating film HK, the metal film MF3, and the metal film MF4 are formed in order on the semiconductor substrate SB including over the hard mask HM2 by a CVD process or a sputtering process, for example. The insulating film HK, which is a high-k film having a dielectric constant higher than the silicon nitride film, includes a hafnium oxide film herein, but may include a metal oxide film such as a zirconium oxide film, an aluminum oxide film, a tantalum oxide film, or a lanthanum oxide film.

The metal film MF3 includes a titanium nitride (TiN) film herein, but may include a tantalum nitride (TaN) film, a tungsten nitride (WN) film, a titanium carbide (TiC) film, a tantalum carbide (TaC) film, a tungsten carbide (WC) film, a tantalum nitride carbide (TaCN) film, a titanium (Ti) film, a tantalum (Ta) film, a titanium aluminum (TiAl) film, or the like. The metal film MF4 includes, for example, an aluminum (Al) film.

The trench formed by removing the dummy gate electrode DG in the p-MIS region 1C is completely filled with a stacked film including the insulating film HK, the metal film MF3, and the metal film MF4. Subsequently, unnecessary films on the interlayer insulating film IL1 are removed by, for example, a CMP process to expose the top of the interlayer insulating film IL1 in the p-MIS region 1C, resulting in formation of a gate insulating film including the insulating film HK provided in the trench and formation of the gate electrode G2 including the metal films MF3 and MF4 provided in the trench. This results in formation of the p transistor QP including the gate electrode G2 and the source/drain region in the p-MIS region 1C.

Figure 48:
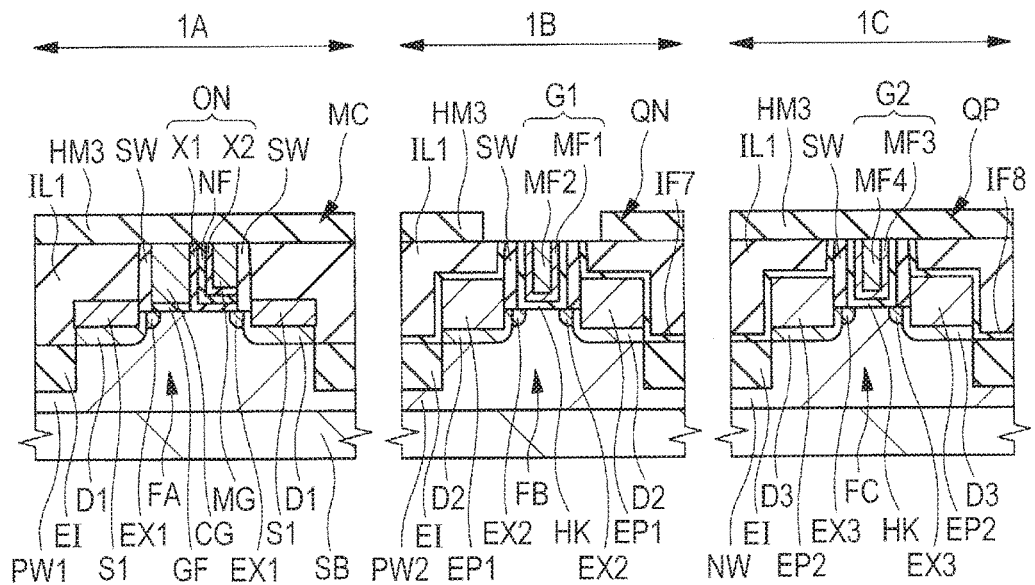
FIG. 48 is a sectional view explaining the manufacturing process of the semiconductor device following FIG. 47.

In a subsequent step, as illustrated in FIG. 48, the exposed dummy gate electrode DG in the n-MIS region 1B is removed. Specifically, the hard mask HM2 is removed and then a hard mask HM3 is formed on the semiconductor substrate SB by, for example, a CVD process, and then the hard mask HM3 in the n-MIS region 1B is removed by a photolithography technique and an etching process, thereby the dummy gate electrode DG in the n-MIS region 1B is exposed. The hard mask HM3 includes, for example, a silicon oxide film or a titanium nitride (TiN) film, and the gate electrode in each of the p-MIS region 1C and the memory cell region 1A is covered with the hard mask HM3.

Subsequently, the dummy gate electrode DG exposed from the hard mask HM3 is removed by wet etching. Although the insulating film IF3 below the dummy gate electrode DG is also removed herein, the insulating film IF3 may be left. After the insulating film IF3 is removed, an insulating film may be formed so as to cover the bottom of the trench formed by removing the dummy gate electrode DG.

Figure 49:
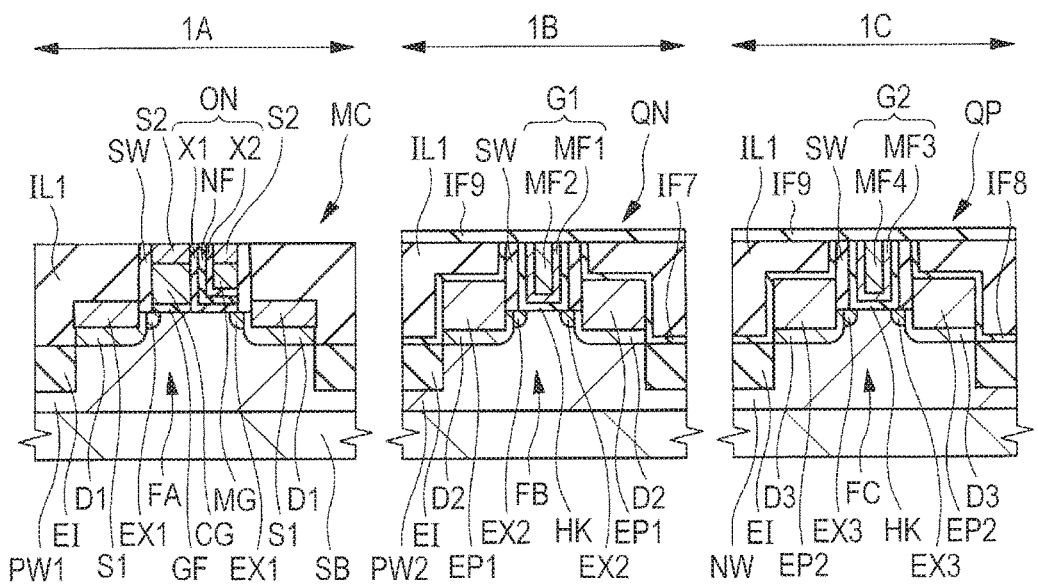
FIG. 49 is a sectional view explaining the manufacturing process of the semiconductor device following FIG. 48.

Subsequently, as illustrated in FIG. 49, the insulating film HK as a gate insulating film and the gate electrode G1 as a metal gate electrode are formed in the trench. Specifically, first, the insulating film HK, the metal film MF1, and the metal film MF2 are formed in order on the semiconductor substrate SB including the hard mask HM3 by a CVD process and a sputtering process, for example. The insulating film HK, which is a high-k film having a dielectric constant higher than the silicon nitride film, includes a hafnium oxide film herein, but may include a metal oxide film such as a zirconium oxide film, an aluminum oxide film, a tantalum oxide film, or a lanthanum oxide film.

The metal film MF1 includes a titanium aluminum (TiAl) film herein, but may include a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum nitride carbide (TaCN) film, a titanium (Ti) film, a tantalum (Ta) film, or the like. The metal film MF2 includes, for example, an aluminum (Al) film.

The trench formed by removing the dummy gate electrode DG in the n-MIS region 1B is completely filled with a stacked film including the insulating film HK, the metal film MF1, and the metal film MF2. Subsequently, unnecessary films on the interlayer insulating film IL1 are removed by, for example, a CMP process to expose the top of the interlayer insulating film IL1 in the n-MIS region 1B, resulting in formation of a gate insulating film including the insulating film HK provided in the trench and formation of the gate electrode G1 including the metal films MF1 and MF2 provided in the trench. This results in formation of the n transistor QN including the gate electrode G1 and the source/drain region in the n-MIS region 1B.

Subsequently, as illustrated in FIG. 49, the hard mask HM3 is removed and then an insulating film IF9 is formed on the semiconductor substrate SB by, for example, a CVD process, and then the insulating film IF9 in the memory cell region 1A is removed by a photolithography technique and an etching process. Consequently, while the gate electrodes G1 and G2 in the n-MIS region 1B and the p-MIS region 1C are covered with the insulating film IF9, the control gate electrode CG and the memory gate electrode MG are exposed from the insulating film IF9.

Subsequently, a known salicide process is performed to form the silicide layer S2 on the top of each of the control gate electrode CG and the memory gate electrode MG. A NiPt film is deposited on the semiconductor substrate SB including over the insulating film IF9 by a sputtering process using the sputtering apparatus SD, for example, as illustrated in FIG. 41, and then the silicide layer S2 is formed through the first heat treatment. Subsequently, the excess NiPt film is removed, and then the second heat treatment is performed, allowing a low-resistance silicide layer S2 to be formed. The silicide layer S2 is a NiPt silicide layer, for example. That is, the silicide layers S1 and S2 are made of the same material.

In the salicide process, the thickness of the NiPt film (metal film) deposited on each of the control gate electrode CG and the memory gate electrode MG before the first heat treatment is smaller than the thickness of the metal film MS1 on the fin FA as illustrated in FIG. 42. In this way, the thickness of the metal film deposited during formation of the silicide layer S2 is controlled to be small, which makes it possible to prevent the semiconductor substrate SB including the fin FA from being affected by the stress of the metal film.

Figure 50:
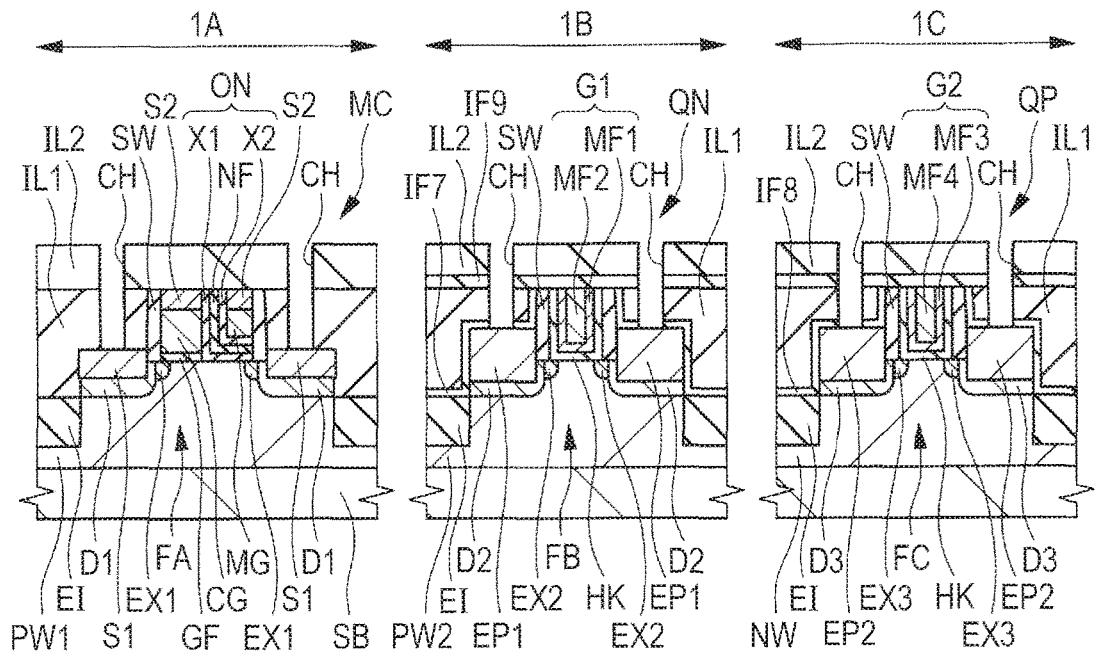
FIG. 50 is a sectional view explaining the manufacturing process of the semiconductor device following FIG. 49.

Subsequently, as illustrated in FIG. 50, the interlayer insulating film IL2 is formed by, for example, a CVD process on the semiconductor substrate SB including over the insulating film IF9. The interlayer insulating film IL2 includes, for example, a silicon oxide film. Subsequently, the top of the interlayer insulating film IL2 is planarized by a CMP process or the like. Subsequently, a plurality of contact holes CH penetrating through the interlayer insulating films IL2 and IL1 are formed by a photolithography technique and a dry etching process. The contact hole CH in each of the n-MIS region 1B and the p-MIS region 1C also penetrates through the insulating film IF9.

In the memory cell region 1A, part of the top of the silicide layer S1 just over the source/drain region is exposed at the bottom of the contact hole CH. In the n-MIS region 1B, part of the top of the epitaxial layer EP1, which is part of the source/drain region, is exposed at the bottom of the contact hole CH. In the p-MIS region 1C, part of the top of the epitaxial layer EP2, which is part of the source/drain region, is exposed at the bottom of the contact hole CH.

Contact holes CH are provided in an undepicted region so as to partially expose the respective tops of the gate electrode G1, the gate electrode G2, the control gate electrode CG, and the memory gate electrode MG. Each contact hole CH does not pass through the interlayer insulating film IL1. The length of the contact hole CH just over the epitaxial layer EP1 or EP2 is smaller than the length of the contact hole CH just over the silicide layer S1 in a direction perpendicular to the main surface of the semiconductor substrate SB.

Figure 51:
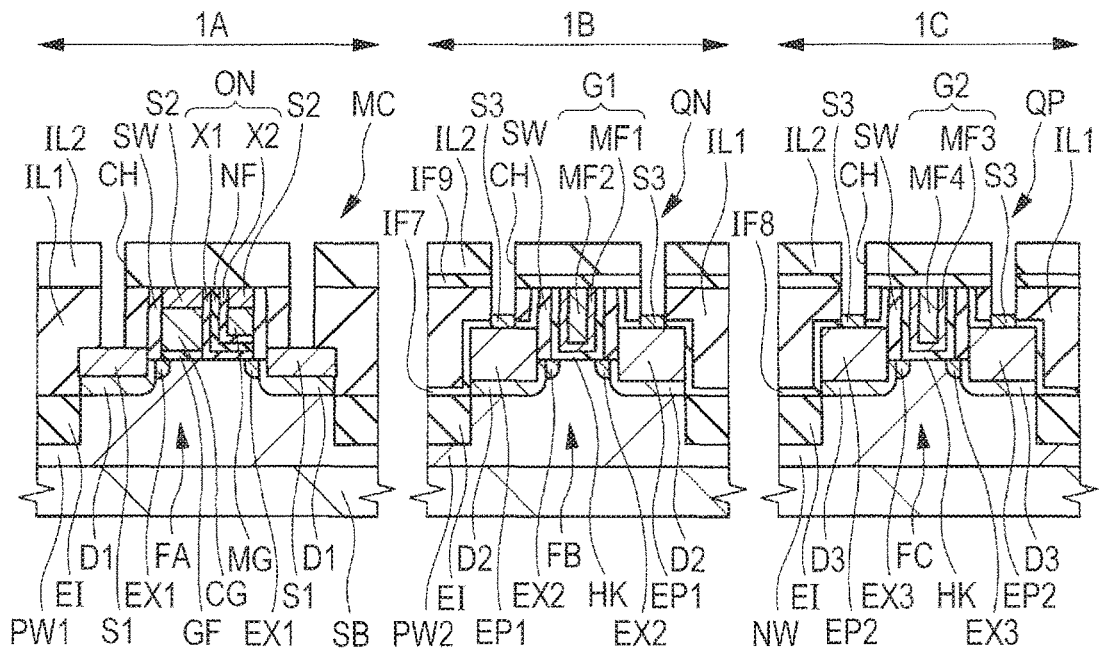
FIG. 51 is a sectional view explaining the manufacturing process of the semiconductor device following FIG. 50.

Subsequently, as illustrated in FIG. 51, a silicide layer S3 is formed by a known salicide process on the respective tops of the epitaxial layers EP1 and EP2 exposed from the bottoms of the contact holes CH in the n-MIS region 1B and the p-MIS region 1C. Specifically, a metal film is formed on the main surface of the semiconductor substrate SB including the insides of the contact holes CH by, for example, a CVD process, and then heat treatment is performed to react the metal film with the respective tops of the epitaxial layers EP1 and EP2, thereby the silicide layer S3 is formed at the bottom of each contact hole CH. Subsequently, the metal film is removed.

Since the metal film is less likely to be formed by a sputtering process in a narrow opening such as the contact hole CH, the metal film is formed by a CVD process. However, a nickel (Ni) film is less likely to be formed by the CVD process; hence, a titanium (Ti) film, which is easily formed by the CVD process, is formed as the metal film. The silicide layer S1 therefore includes a titanium silicide ($TiSi_2$) film. That is, the silicide layer S3 is made of a material different from that of each of the silicide layers S1 and S2. In the process of forming the silicide layer S3, the titanium (Ti) film may remain on the bottom of the contact hole CH just over the silicide layer S1 in the memory cell region 1A.

Figure 52:
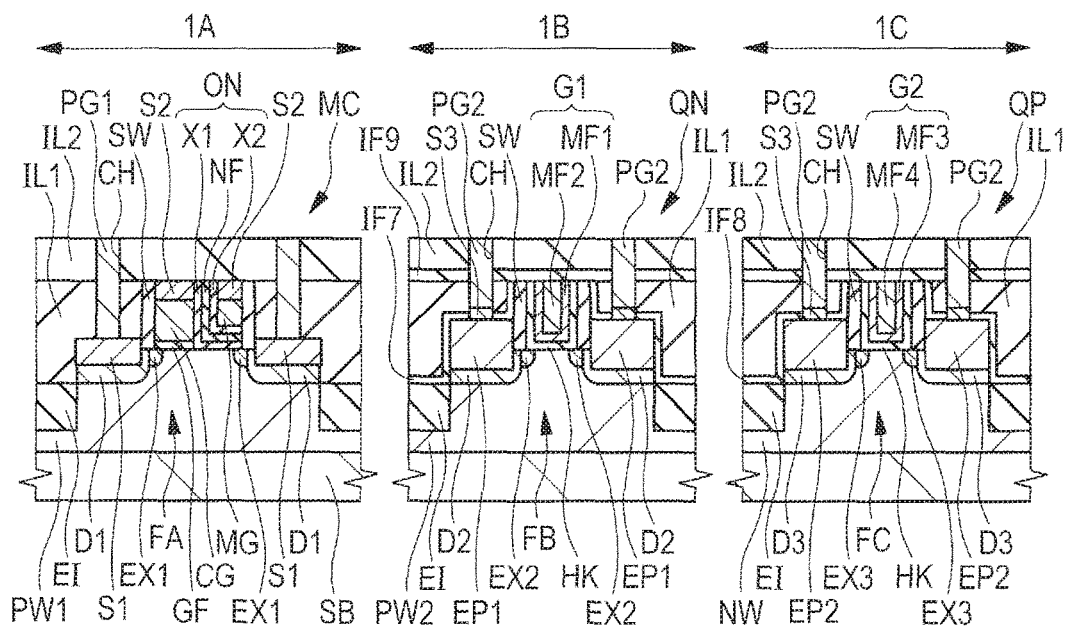
FIG. 52 is a sectional view explaining the manufacturing process of the semiconductor device following FIG. 51.

Subsequently, as illustrated in FIG. 52, a conductive plug PG1 or PG2 made of tungsten (W) or the like is formed as a coupling conductive component in the contact hole CH. Each of the plugs PG1 and PG2 has a stacked structure of a barrier conductor film (for example, a titanium film, a titanium nitride film, or a stacked film thereof) and a main conductor film (for example, tungsten film) located on the barrier conductor film.

The plug PG1 is electrically coupled to the source or drain region of the memory cell MC via the silicide layer S1. When the Ti film remains on the silicide layer S1 as described above, the Ti film exists between the plug PG1 and the silicide layer S1. The plug PG2 fills the contact hole CH in the n-MIS region 1B, and is electrically coupled to the epitaxial layer EP1 via the silicide layer S3. That is, the plug PG2 is electrically coupled to the source/drain region of the n transistor QN. The plug PG2 fills the contact hole CH in the p-MIS region 1C and is electrically coupled to the epitaxial layer EP2 via the silicide layer S3. That is, the plug PG2 is electrically coupled to the source/drain region of the p transistor QP.

The length of the contact hole CH just over each of the epitaxial layers EP1 and EP2 is smaller than the length of the contact hole CH just over the silicide layer S1 in a direction perpendicular to the main surface of the semiconductor substrate SB. This is because the height of the top of the silicide layer S1 with respect to the main surface of the semiconductor substrate SB is lower than the height of the top of each of the epitaxial layers EP1 and RP2 with respect to the main surface of the semiconductor substrate SB.

The reason why the height of the top of each of the epitaxial layers EP1 and EP2 is higher than the height of the top of the silicide layer S1 is because the epitaxial layers EP1 and EP2 are each formed with a large volume to reduce the resistance of the source/drain region of each of the n transistor QN and the p transistor QP. Specifically, since the silicide layer S1 in the memory cell region 1A is made of a material having a resistance lower than the semiconductor layer, even if the silicide layer S1 does not have a large volume and a large thickness, the resistance of the source/drain region of the memory cell MC can be sufficiently reduced.

On the other hand, the epitaxial layers EP1 and EP2 each have a resistance higher than the silicide layer S1. Hence, the source/drain region of each of the n transistor QN and the p transistor QP must have a large volume and a large thickness compared with the silicide layer S1 to reduce the resistance of the source/drain region. In other words, the height of the top of each of the epitaxial layers EP1 and EP2 is adjusted to be higher than the height of the top of the silicide layer S1, making it possible to reduce the resistance of the source/drain region of each of the n transistor QN and the p transistor QP.

When the metal film (titanium film) deposited to form the silicide layer S3 remains on the bottom of the contact hole CH on the silicide layer S1, a titanium (Ti) film exists between the top of the silicide layer S1 and the plug PG1.

Figure 53:
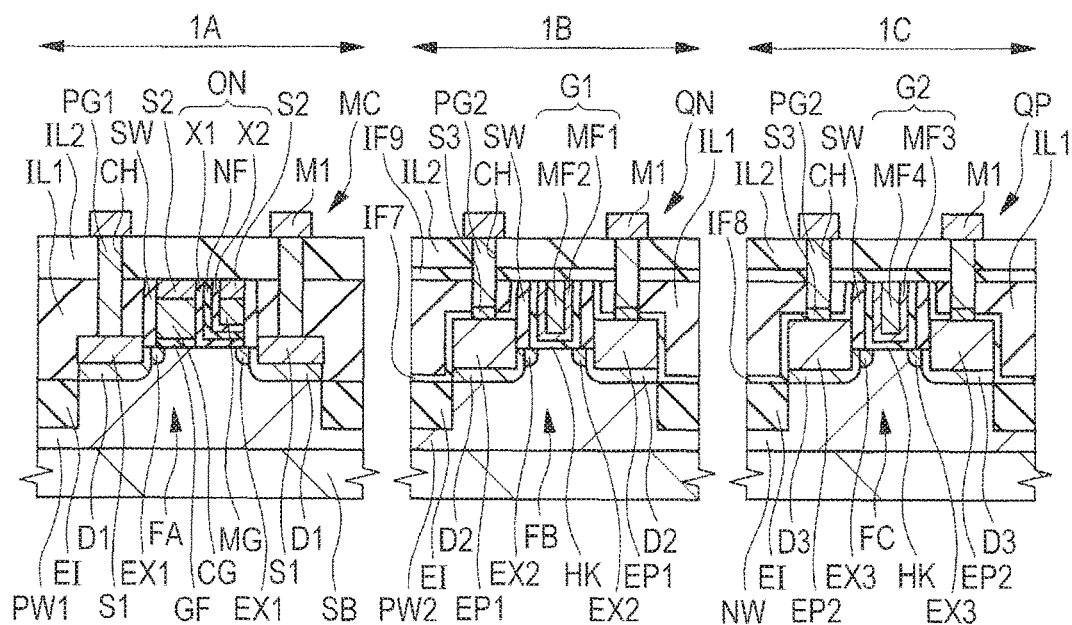
FIG. 53 is a sectional view explaining the manufacturing process of the semiconductor device following FIG. 52.

Subsequently, as illustrated in FIG. 53, the interconnection M1 is formed on the interlayer insulating film IL2. The interconnection M1 has a stacked structure including a barrier conductor film (for example, a titanium nitride film, a tantalum film, a tantalum nitride film, or the like) and a main conductor film (copper film) formed on the barrier conductor film. In FIG. 3, the interconnection M1 is shown while the barrier conductor film and the main conductor film are integrated to simplify the drawing. The same applies to the plugs PG1 and PG2.

The interconnection M1 can be formed by, for example, a so-called single damascene process. Specifically, an interlayer insulating film having an interconnection trench is formed on the interlayer insulating film IL2, and the interconnection trench is filled with a metal film, thereby the interconnection M1 can be formed. The drawing, however, omits the interlayer insulating film beside the interconnection M1.

Operation of Nonvolatile Memory

Exemplary operation of the nonvolatile memory is now described with reference to FIGS. 54 and 55.

Figures 54, 55:
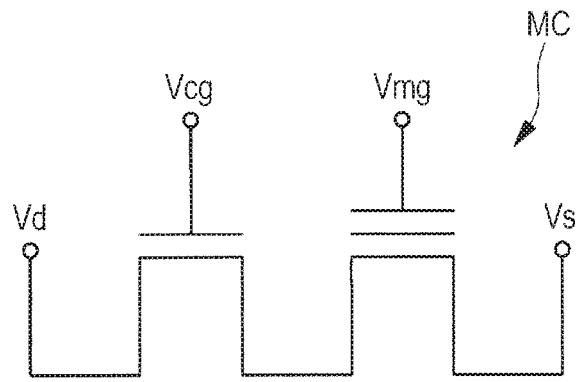
FIG. 54 is an equivalent circuit diagram of a memory cell MC of a nonvolatile memory.
FIG. 55 is a table showing an exemplary voltage application condition to each part of a selected memory cell in "write", "erase", and "read".

FIG. 54 is an equivalent circuit diagram of the memory cell MC of the nonvolatile memory. FIG. 55 is a table showing an example of a voltage application condition to each part of a selected memory cell in "write", "erase", and "read". The table of FIG. 55 shows voltages for each of "write", "erase", and "read", such as a voltage Vmg applied to the memory gate electrode MG (see FIG. 53) of the memory cell (selected memory cell) MC shown in FIG. 54, a voltage Vs applied to the source region thereof, a voltage Vcg applied to the control gate electrode CG (see FIG. 53) thereof, a voltage Vd applied to the drain region thereof, and a voltage Vb applied to the p well PW1 (see FIG. 4). The table shown in FIG. 55 is a preferred example of the voltage application condition, and can be variously modified or altered as necessary without limitation. In the first embodiment, injection of electrons into the silicon nitride film NF (see FIG. 53), which is a charge accumulating part of the insulating film ON of the memory transistor, is defined as "write", and injection of holes thereinto is defined as "erase".

Write methods may include a write method (hot electron injection write method) called source side injection (SSI) method, in which hot electrons are injected through source side injection to perform write. For example, a voltage as shown in the column of "write" in FIG. 55 is applied to each part of the selected memory cell to be written, and thus electrons are injected into the silicon nitride film NF of the selected memory cell to perform write.

At this time, hot electrons are generated in the channel region (between the source and the drain) below between the two gate electrodes (the memory gate electrode MG and the control gate electrode CG), and the hot electrons are injected into the silicon nitride film NF as a charge accumulating part under the memory gate electrode MG. The injected hot electrons (electrons) are trapped in trap levels in the silicon nitride film NF. As a result, the threshold voltage of the memory transistor increases. That is, the memory transistor becomes into a write state.

Erase methods may include an erase method (hot hole injection erase method), i.e., a so-called BTBT method, in which erase is performed by hot hole injection through band-to-band tunneling (BTBT). Specifically, erase is performed by injecting holes, which are generated by the band-to-band tunneling phenomenon (BTBT), into the charge accumulating part (the silicon nitride film NF in the insulating film ON). For example, a voltage as shown in the column of "erase" in FIG. 55 is applied to each part of the selected memory cell to be erased, and holes are generated through the BTBT phenomenon and accelerated by an electric field, thereby the holes are injected into the silicon nitride film NF of the selected memory cell, so that the threshold voltage of the memory transistor is reduced. That is, the memory transistor becomes into an erase state.

For read, for example, a voltage as shown in the column of "read" in FIG. 55 is applied to each part of the selected memory cell to be read. A voltage Vmg to be applied to the memory gate electrode MG during read is set to a value between the threshold voltage of the memory transistor in a write state and the threshold voltage of the memory transistor in an erase state, thereby the write state can be distinguished from the erase state.

Effects of Manufacturing Method of Semiconductor Device

Figure 58:
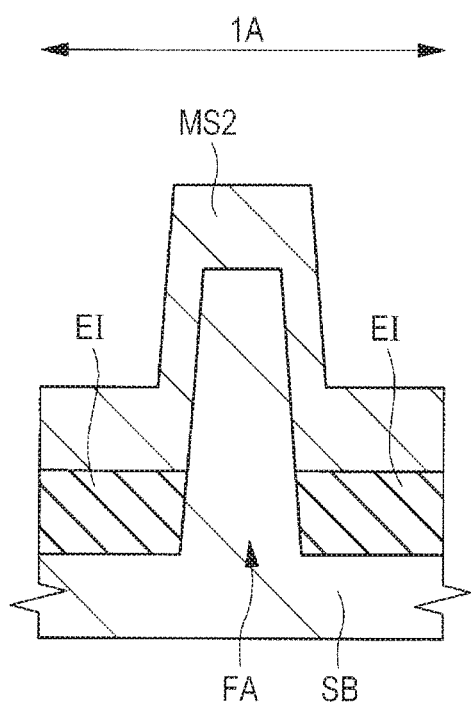
FIG. 58 is a sectional view explaining a manufacturing process of a semiconductor device of a comparative example.

Main features and effects of the method of manufacturing the semiconductor device of the first embodiment are now described with reference to FIG. 58 as a comparative example. FIG. 58 is a sectional view of a semiconductor device of the comparative example during a manufacturing process thereof, and corresponds to the sectional view shown in FIG. 42.

For a transistor in which no fin is provided and the source/drain region and the channel region are provided in the main surface of a semiconductor substrate, a top of the source/drain region is probably covered with a silicide layer in order to reduce the resistance of the source/drain region and reduce a coupling resistance between the source/drain region and the plug. When the silicide layer is formed, for example, a metal film having a thickness of 25 nm is deposited on the semiconductor substrate by a sputtering process, and then heat treatment is performed to react the metal film with the semiconductor, thereby the silicide layer is formed.

It is therefore considered that a silicide layer covering the surface of the source/drain region is also provided in a transistor (FINFET) formed on the fin. However, the silicide layer is not easily formed on the sidewall of the fin protruding on the main surface of the semiconductor substrate. This is because, when the metal film is deposited on the surface of the fin by the sputtering process to form the silicide layer, almost no metal film is deposited on the sidewall of the fin due to poor coverage of the film, which is deposited by the sputtering process, on the sidewall. For example, when the metal film is deposited on the semiconductor substrate, the thickness of the metal film covering the sidewall of the fin may be about 20% of the thickness of the metal film covering the top of the fin.

Hence, even if the heat treatment is performed to react the metal film with the surface of the fin so that the silicide layer is formed, since the metal film on the sidewall of the fin has a small thickness, the silicide layer having a thickness necessary for sufficiently reducing the resistance of the source/drain region cannot be formed on the sidewall.

In a possible method, therefore, a metal film having a larger thickness is formed by the sputtering process so that a metal film having a sufficient thickness is formed on the sidewall of the fin. Specifically, as illustrated in FIG. 58 as the comparative example, a thick metal film MS2 is probably formed so as to cover the top and the sidewall of the fin FA in the memory cell region 1A. The metal film MS2 is a NiPt film, and has a thickness of, for example, 60 nm on the top of the fin FA. When the metal film MS2 is formed, a NiPt film is deposited on the semiconductor substrate SB at room temperature by a sputtering process. This makes it possible to form a thick metal film MS2 that continuously covers the top of the element isolation film EI, the sidewall of the fin FA, and the top of the fin FA. The metal film MS2 is in direct contact with the fin FA, and no silicide layer is formed between the metal film MS2 and the fin FA.

Subsequently, heat treatment is performed to form the silicide layer. Since the metal film MS2 covering the sidewall of the fin FA has a sufficient thickness to form the silicide layer having a desired thickness, the sidewall of the fin FA can be covered with the silicide layer having a thickness necessary for reducing the resistance of the source/drain region of the memory cell.

However, since the metal film MS2 containing, for example, Ni has a large internal stress, if the metal film MS2 having a larger thickness is deposited on the surface of the fin FA, the metal film MS2 has a larger stress. In such a case, the fin FA is affected by such stress, leading to deterioration in performance and reliability of the FINFET formed on the fin FA.

On the other hand, an epitaxial layer (lifting layer) is formed on the surface of the fin instead of forming the silicide layer on the surface, thereby volume of the semiconductor region configuring the source/drain region of the FINFET can be increased. It is therefore possible to reduce the resistance of the source/drain region. The epitaxial layer provides a smaller influence of stress on the fin than in the case where the silicide layer is formed by the above-described method, which makes it possible to improve performance and reliability of the FINFET.

However, when the FINFET configures a split-gate MONOS memory, an ONO film as a charge accumulating part is affected by increased stress due to formation of the epitaxial layer. This leads to deterioration in performance and reliability of the memory cell. The inventors therefore have investigated that the silicide layer is formed without forming the epitaxial layer in order to reduce the resistance of the source/drain region in the MONOS memory on the fin.

For a split-gate MONOS memory including the FINFET, when the sidewall of the fin is continuously and uniformly covered with a metal film having a sufficient thickness, the internal stress of the metal film increases, which may cause abnormal growth of the subsequently formed silicide layer. Specifically, the abnormal growth of the silicide layer in the fin interferes with normal operation of the memory cell due to, for example, short circuit, leading to a reduction in performance and reliability of the memory cell. In addition, when the metal film MS2 having a large stress is formed, the ONO film including the charge accumulating part of the memory cell is affected by the stress, and thus performance and reliability of the memory cell are deteriorated.

In contrast, in the first embodiment, as described with reference to FIGS. 41 and 42, the metal film MS1 is formed by the sputtering process while the semiconductor wafer is heated at, for example, 200° C. Consequently, it is possible to form a thin silicide layer SS on the surface of the fin FA during the film formation step using the sputtering process, and thus improve the coating performance of the subsequently deposited metal film MS1. At this time, a plurality of columnar metal films MS1 are formed on the sidewall of the fin FA with the silicide layer SS in between. Since the columnar metal films MS1 formed on the sidewall of the fin FA are spaced apart from one another, even if the metal film MS1 is formed with a large thickness of, for example, about 60 nm on the top of the fin FA, an increase in internal stress of the metal film MS1 can be suppressed. Furthermore, it is possible to reduce influence of the internal stress of the metal film MS1 on the entire fin FA.

Hence, even if the metal film MS1 is subsequently reacted to form the silicide layer S1 as shown in FIG. 53, the fin FA of the memory cell MC can be prevented from being affected by the stress of the metal film MS1. It is therefore possible to prevent deterioration in performance and reliability of each of the memory transistor and the control transistor, and to reduce the resistance of the source/drain region of the memory cell MC. Furthermore, it is possible to prevent performance and reliability of the memory cell MC from being deteriorated due to influence of the stress on the ONO film. In addition, it is possible to prevent abnormal growth of the silicide layer S1 due to the stress of the metal film MS1 during formation of the silicide layer S1.

It is therefore possible to improve the performance of the memory cell MC while preventing deterioration in reliability of the memory cell MC. In the logic region, the epitaxial layer EP1 is formed as part of the source/drain region of the n transistor QN, and the epitaxial layer EP2 is formed as part of the source/drain region of the p transistor QP, which reduces the resistance of the source/drain region of each of the n transistor QN and the p transistor QP. This makes it possible to reduce the resistance of the memory cell MC and the resistance of the transistor in the logic region, leading to an improvement in performance of the semiconductor device.

In addition, the gate insulating film in the logic region is formed of a high-k film, and the dummy gate electrode is replaced with a low-resistance metal gate electrode, thereby a reduction in size of the transistor and a reduction in resistance of the gate electrode can be achieved while the short channel effect is suppressed.

Second Embodiment

Figure 56:
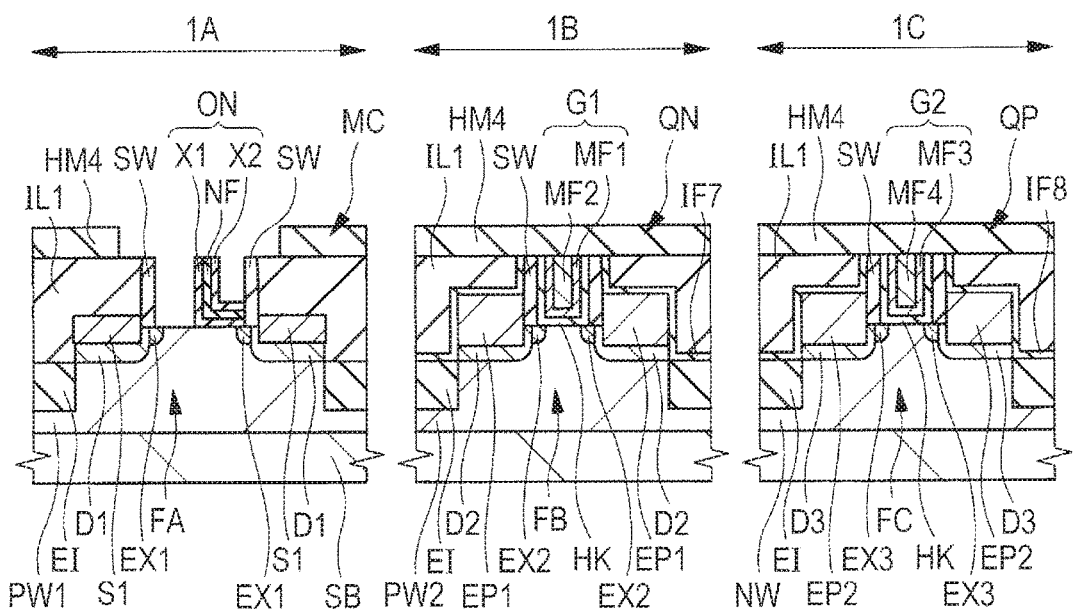
FIG. 56 is a sectional view explaining a manufacturing process of a semiconductor device of a second embodiment of the invention.
Figure 57:
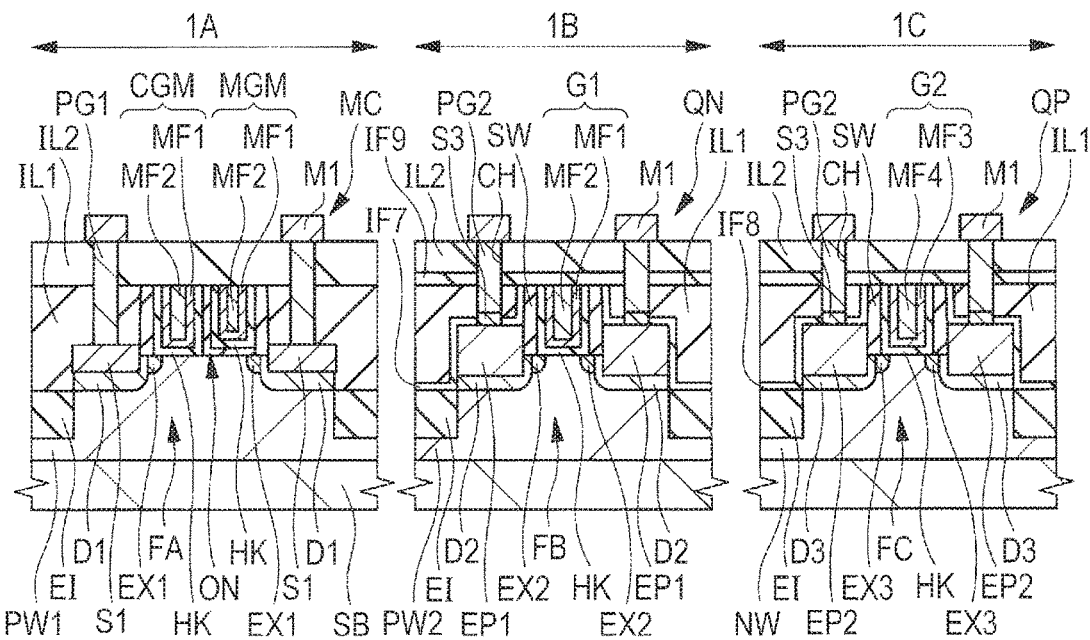
FIG. 57 is a sectional view explaining the manufacturing process of the semiconductor device following FIG. 56.

A method of manufacturing a semiconductor device of a second embodiment is now described with reference to FIGS. 56 and 57. FIGS. 56 and 57 are each a sectional view of the semiconductor device of the second embodiment during a formation process thereof. In FIG. 57, the insulating film ON being a stacked film illustrated in FIG. 56 is shown as one film for better understanding of the drawing.

First, the steps described with reference to FIGS. 6 to 48 are performed. However, the control gate electrode CG and the memory gate electrode MG (FIG. 48) are each formed as a dummy gate electrode including a polysilicon film.

Subsequently, as illustrated in FIG. 56, the hard mask HM3 is removed, and then a hard mask HM4, which exposes the memory cell region 1A and covers the n-MIS region 1B and the p-MIS region 1C, is formed on the semiconductor substrate SB. Subsequently, etching is performed using the hard mask HM2 as a mask to remove the control gate electrode CG and the memory gate electrode MG as dummy gate electrodes, thereby a trench is formed in the region in which the control gate electrode CG or the memory gate electrode MG has been provided.

Subsequently, as illustrated in FIG. 57, the same steps as those described with reference to FIG. 48 are performed. Specifically, the insulating film HK, the metal film MF1, and the metal film MF2 are formed in order on the semiconductor substrate SB to fill the trenches, and then polishing is performed by a CMP process to form a gate insulating film including the insulating film HK, a control gate electrode CGM including the metal films MF1 and MF2, and a memory gate electrode MGM including the metal films MF1 and MF2.

Subsequently, the hard mask HM4 is removed, and then the same steps as those described with reference to FIGS. 50 to 53 are performed, thereby the semiconductor device illustrated in FIG. 57 is completed. Since the control gate electrode CGM and the memory gate electrode MGM configuring the memory cell MC are each formed of a metal gate electrode, no silicide layer is required to be formed on the respective tops of such gate electrodes.

In the second embodiment, the same effects as in the first embodiment can be exhibited. In addition, the gate insulating film of the control transistor is formed of a high-k film, and the dummy gate electrode in the memory cell MC is replaced with a low-resistance metal gate electrode, thereby size of the transistor and the resistance of the gate electrode can be reduced together while the short channel effect is suppressed. That is, performance of each of the control transistor and the memory transistor can be improved.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:

1. A semiconductor device, comprising:
    a semiconductor substrate having a first region and a second region arranged along a main surface of the semiconductor substrate;
    a first protrusion that is part of the semiconductor substrate in the first region, and protrudes from a top of the semiconductor substrate while extending in a first direction along the main surface of the semiconductor substrate;
    a first gate electrode that is formed over a top of the first protrusion with a first insulating film in between while extending in a second direction orthogonal to the first direction;
    a second gate electrode that is formed over the top of the first protrusion with a second insulating film as a charge accumulating part in between, and is adjacent to one sidewall of the first gate electrode with the second insulating film in between while extending in the second direction;
    a first source/drain region formed over the top of the first protrusion so as to sandwich a pattern including the first gate electrode and the second gate electrode in the first direction;
    a second protrusion that is part of the semiconductor substrate in the second region, and protrudes from the top of the semiconductor substrate while extending in the first direction;
    a third gate electrode that is formed over a top of the second protrusion with a third insulating film in between and extends in the second direction;
    a second source/drain region formed over the top of the second protrusion so as to sandwich the third gate electrode in the first direction;
    a first silicide layer that covers a top and a sidewall of the first source/drain region, and is in contact with the first protrusion; and
    a semiconductor layer that covers a top and a sidewall of the second source/drain region, and is in contact with the second protrusion,
    wherein the first gate electrode, the second gate electrode, and the first source/drain region configure a nonvolatile memory element, and
    wherein the third gate electrode and the second source/drain region configure a transistor.

2. The semiconductor device according to claim 1, wherein a position of a top of the semiconductor layer is higher than a position of a top of the first silicide layer.

3. The semiconductor device according to claim 1, further comprising:
    a fourth insulating film that is formed over the semiconductor substrate and covers the nonvolatile memory element and the transistor;
    a first coupling part that penetrates through the fourth insulating film and is electrically coupled to the first source/drain region with the first silicide layer in between; and
    a second coupling part that penetrates the fourth insulating film and is electrically coupled to the second source/drain region,
    wherein a position of a bottom of the second coupling part is higher than a position of a bottom of the first coupling part.

4. The semiconductor device according to claim 3,
    wherein the first coupling part is in contact with the first silicide layer, and
    wherein the second coupling part is coupled to the second source/drain region in the second protrusion via a second silicide layer and the semiconductor layer, the second silicide layer being formed between the second coupling part and the semiconductor layer.

5. The semiconductor device according to claim 4, wherein the top of the semiconductor layer beside the second coupling part is exposed from the second silicide layer.

6. The semiconductor device according to claim 4, wherein the first silicide layer includes nickel silicide, and the second silicide layer includes titanium silicide.

7. The semiconductor device according to claim 3,
    wherein a first metal film containing titanium exists between the first coupling part and the first silicide layer, and
    wherein the second coupling part is coupled to the second source/drain region in the second protrusion via a second silicide layer and the semiconductor layer, the second silicide layer being formed between the second coupling part and the semiconductor layer.

8. The semiconductor device according to claim 1, wherein the semiconductor layer configures part of the second source/drain region.

9. The semiconductor device according to claim 1, wherein the third gate electrode includes a second metal film.

10. The semiconductor device according to claim 1, wherein the first gate electrode includes a third metal film, and the second gate electrode includes a fourth metal film.

11. A method of manufacturing a semiconductor device, the method comprising the steps of:
    (a) providing a semiconductor substrate;
    (b) retracting part of a top of the semiconductor substrate, thereby forming a first protrusion that is part of the semiconductor substrate, and protrudes from the top of the semiconductor substrate while extending in a first direction, and forming a second protrusion that protrudes from the top of the semiconductor substrate while extending in the first direction;

(c) forming an element isolation film filling a trench between the first protrusion and the second protrusion;

(d) after the step (c), forming a first gate electrode just over the first protrusion with a first insulating film in between, forming a second gate electrode just over the first protrusion with a second insulating film being a charge accumulating part in between, the first protrusion being in a region adjacent to one sidewall of the first gate electrode with the second insulating film in between, and forming a third gate electrode just over the second protrusion with a third insulating film in between;

(e) forming an epitaxial layer covering a top and a sidewall of the second protrusion beside the third gate electrode;

(f) forming a second source/drain region over the top of the second protrusion beside the third gate electrode;

(g) forming a first source/drain region over a top of the first protrusion beside a pattern including the first gate electrode and the second gate electrode; and (h) after the step (g), forming a first silicide layer covering a top and a sidewall of the first source/drain region beside the pattern while the second protrusion is covered with a protective film, wherein the first gate electrode, the second gate electrode, and the first source/drain region configure a nonvolatile memory element, and wherein the third gate electrode and the second source/drain region configure a transistor.

12. The method according to claim 11, wherein a position of a top of the semiconductor layer is higher than a position of a top of the first silicide layer.

13. The method according to claim 11, wherein the step (h) includes the steps of:

(h1) covering the second protrusion with a protective film;

(h2) after the step (h1), a metal film covering the first protrusion is formed while the first protrusion is heated by performing first heat treatment to react the metal film with a surface of the first protrusion, thereby forming a third silicide layer between the metal film and the surface of the first protrusion; and (h3) after the step (h2), performing second heat treatment to react the metal film with the surface of the first protrusion, thereby forming the first silicide layer.

14. The method according to claim 13, wherein in the step (h2), the metal film covering a sidewall of the first protrusion includes a plurality of films spaced apart from one another in a direction along the sidewall.

15. The method according to claim 13, wherein the step (h2) includes the steps of:

(h4) performing the first heat treatment in a heat treatment chamber;

(h5) after the step (h4), transferring the semiconductor substrate from within the heat treatment chamber to within a film formation chamber through a path maintained in a vacuum; and (h6) after the step (h5), forming the metal film by a sputtering process in the film formation chamber.

* * * * *